(12) United States Patent
Shimizu et al.

(10) Patent No.: US 11,892,775 B2
(45) Date of Patent: Feb. 6, 2024

(54) STORAGE CONTAINER STORING TREATMENT LIQUID FOR MANUFACTURING SEMICONDUCTOR

(71) Applicant: FUJIFILM Corporation, Tokyo (JP)

(72) Inventors: Tetsuya Shimizu, Shizuoka (JP); Tetsuya Kamimura, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 17/676,235

(22) Filed: Feb. 21, 2022

(65) Prior Publication Data

US 2022/0179320 A1    Jun. 9, 2022

Related U.S. Application Data

(63) Continuation of application No. 16/143,497, filed on Sep. 27, 2018, now Pat. No. 11,693,321, which is a
(Continued)

(30) Foreign Application Priority Data

Mar. 31, 2016    (JP) ................................. 2016-073257
Mar. 10, 2017    (JP) ................................. 2017-045864

(51) Int. Cl.
    *G03F 7/32*        (2006.01)
    *G03F 7/30*        (2006.01)
    (Continued)

(52) U.S. Cl.
    CPC ............... *G03F 7/32* (2013.01); *B65D 25/14* (2013.01); *B65D 85/00* (2013.01); *B65D 85/70* (2013.01);
(Continued)

(58) Field of Classification Search
None
See application file for complete search history.

(56) References Cited

U.S. PATENT DOCUMENTS 4,634,509 A    1/1987   Shimizu et al.
5,804,744 A    9/1998   Tan et al.
(Continued)

FOREIGN PATENT DOCUMENTS

JP       S61170588      8/1986
JP       H05243144      9/1993
(Continued)

OTHER PUBLICATIONS

Sukidi, "Electro Polishing", https://m.blog.naver.com/PostView.nhn?blogId=dohyuni1018&logNo=80085683276&proxyRefer (Year: 2009).*

(Continued)

*Primary Examiner* — Jiong-Ping Lu
(74) *Attorney, Agent, or Firm* — JCIPRNET

(57) ABSTRACT

A storage container storing a treatment liquid for manufacturing a semiconductor is provided, wherein the occurrence of defects on the semiconductor, such as particles, is suppressed and a fine resist pattern or a fine semiconductor element is manufactured. The storage container includes a storage portion that stores the treatment liquid, wherein the treatment liquid includes one kind or two or more kinds of metal atoms selected from Cu, Fe, and Zn, and a total content of particulate metal that is a metal component derived from the metal atoms and that is a nonionic metal component present in the treatment liquid as a solid without being dissolved is 0.01 to 100 mass ppt with respect to a total mass of the treatment liquid.

19 Claims, 2 Drawing Sheets

Related U.S. Application Data continuation of application No. PCT/JP2017/010618, filed on Mar. 16, 2017.

(51) Int. Cl.
| | |
|---|---|
| *G03F 7/16* | (2006.01) |
| *G03F 7/40* | (2006.01) |
| *H01L 21/027* | (2006.01) |
| *B65D 25/14* | (2006.01) |
| *B65D 85/00* | (2006.01) |
| *H01L 21/308* | (2006.01) |

(52) U.S. Cl.
CPC ............... *G03F 7/16* (2013.01); *G03F 7/30* (2013.01); *G03F 7/322* (2013.01); *G03F 7/325* (2013.01); *G03F 7/40* (2013.01); *H01L 21/0271* (2013.01); *H01L 21/0274* (2013.01); *H01L 21/308* (2013.01)

(56) References Cited

U.S. PATENT DOCUMENTS

| | | | |
|---|---|---|---|
| 5,996,424 A | 12/1999 | Tan et al. | |
| 6,200,692 B1* | 3/2001 | Tamura | B01J 19/02 205/171 |
| 6,225,424 B1 | 5/2001 | Nishikawa et al. | |
| 2015/0227049 A1* | 8/2015 | Yamanaka | G03F 7/32 206/524.2 |
| 2016/0026083 A1 | 1/2016 | Tango et al. | |
| 2017/0059995 A1 | 3/2017 | Furutani et al. | |

FOREIGN PATENT DOCUMENTS

| | | | | |
|---|---|---|---|---|
| JP | H10436 | | 1/1998 | |
| JP | H10273193 | | 10/1998 | |
| JP | H1180257 | | 3/1999 | |
| JP | H1180449 | | 3/1999 | |
| JP | 2001507294 | | 6/2001 | |
| JP | 2002005799 | | 1/2002 | |
| JP | 2005260213 | | 9/2005 | |
| JP | 2015064496 | | 4/2015 | |
| JP | 2016014116 | * | 1/2016 | ............... C08F 2/01 |
| KR | 1020150046097 | | 4/2015 | |
| KR | 20150126899 | | 11/2015 | |
| WO | WO2014069245 | * | 5/2014 | ........... H01L 21/027 |
| WO | 2015190174 | | 12/2015 | |

OTHER PUBLICATIONS

Lowery et al. "Comparing the characteristics of surface-passivated and electropolished 316L stainless steel." Micro-Santa Monica—16, 43-50. (Year: 1998).*
Laborada et al., "Single Particle Inductively Coupled Plasma Mass Spectrometry: A Powerful Tool for Nanoanalysis", Analytical Chemistry, vol. 86, pp. 2270-2278. (Year: 2014).*
Park Hyun-Yul, "Contamination Analysis Technology and Applications in Semiconductor Manufacturing Processes", Air Cleaning Technology, Dec. 2006, with partial English translation thereof, pp. 1-36.
"Statement of Opposition of Japanese Counterpart Application," issued on Dec. 1, 2021, with English translation thereof, p. 1-p. 154.
"Statement of Opposition of Japanese Counterpart Application," issued on Dec. 1, 2021, with English translation thereof, p. 1-p. 198.
Office Action of Japan Counterpart Application, with English translation thereof, dated Jan. 25, 2022, pp. 1-8.
Office Action of Japan Counterpart Application, with English translation thereof, dated Aug. 23, 2022, pp. 1-6.
"Notification of Reasons for Revocation of Japan Counterpart Application," with English translation, dated Feb. 24, 2022, p. 1-p. 20.
"Office Action of Taiwan Counterpart Application", dated Dec. 1, 2022, with English translation thereof, p. 1-p. 13.
Kenneth Ong, "Determination of Impurities in Organic Solvents used in the Semiconductor Industry with the NexION 300S/ 350S ICP-MS", PerkinElmer, Inc., Copyright 2012-2014, pp. 1-6.
"The Notice of Information Statement" of corresponding Japanese Application No. 2021-28855, submitted on Jul. 15, 2022, with English translation thereof, pp. 1-101.
"Notice of Reasons for Cancellation of Japan Counterpart Application", dated Nov. 15, 2022, with English translation thereof, p. 1-p. 252.
"Notice of Written Opinion of Japan Counterpart Application", dated Nov. 15, 2022, with English translation thereof, p. 1-p. 129.
"Office Action of Korea Counterpart Application", dated Mar. 24, 2022, with English translation thereof, p. 1-p. 18.
"Office Action of U.S. Appl. No. 16/143,497", dated May 24, 2022, pp. 1-14.
Sukidi, "Electro Polishing," retrieved from https://m.blog.naver.com/PostView.nhn?blogId=dohyuni1018&logNo=80085683276&proxyRefer, Aug. 2009, pp. 1-4.
Patrick Lowery et al., "Comparing the characteristics of surface-passivated and electropolished 316L stainless steel," retrieved from https://astropak.com/wp-content/uploads/2014/07/Comparing-The-Characteristics-Of-Surface-Passivated-And-Electropolished-316L-Stainless-Steel.pdf, 1998, pp. 1-11.
"Notice of Final Rejection of Korea Counterpart Application", dated Jun. 29, 2023, with English translation thereof, p. 1-p. 11.
"Third Party Observation of Korea Counterpart Application", dated Jan. 30, 2023, pp. 1-32.
"Notice of Final Rejection of Korea Counterpart Application", dated Jan. 30, 2023, with English translation thereof, p. 1-p. 8.
"Written Opinion of Japan Counterpart Application", dated Jul. 26, 2023, with English translation thereof, p. 1-p. 185.
"Decision of Opposition of Japan Counterpart Application", dated Jul. 26, 2023, with English translation thereof, p. 1-p. 498.
Thermo Fisher Scientific, "Impurities Analysis in Isopropyl Alcohol of Semiconductor grade using High- sensitivity ICP-MS", available at: http:/tools.thermofisher.com/content/sfs/brochures/EL 13007-JA.pdf, with concise explanation of relevance from English translation of Written Opinion, pp. 1-5.
Hitoshi Morinaga, "Cleaning and Contamination Reduction", Globalnet Co., Ltd, available at: https://www.rcms.jp/irexport/fujimiinc/file/a58565726016665.pdf, with concise explanation of relevance from English translation of Written Opinion, pp. 1-10.
Tsugito Yamashita, "Corrosion and Corrosion Protection Handbook", Japan Society of Corrosion Engineering, Sep. 2001, pp. 1-7, with concise explanation of relevance from English translation of Written Opinion.

* cited by examiner

STORAGE CONTAINER STORING TREATMENT LIQUID FOR MANUFACTURING SEMICONDUCTOR

CROSS-REFERENCE TO RELATED APPLICATIONS

This application is a Continuation application of U.S. application Ser. No. 16/143,497, filed on Sep. 27, 2018. The U.S. application Ser. No. 16/143,497 is a Continuation application of PCT Application No. PCT/JP2017/010618, filed Mar. 16, 2017, and based upon and claiming the benefit of priority from Japanese Patent Applications No. 2016-073257, filed Mar. 31, 2016; and No. 2017-045864, filed Mar. 10, 2017, the entire contents of all of which are incorporated herein by reference.

BACKGROUND OF THE INVENTION

1. Field of the Invention

The present invention relates to a treatment liquid for manufacturing a semiconductor, such as a developer, a rinsing liquid, a pre-wet liquid, an etchant, a cleaning liquid, or a peeling liquid, that is used in manufacturing steps of a semiconductor device, a storage container storing the treatment liquid for manufacturing a semiconductor, a pattern forming method, and a method of manufacturing an electronic device.

2. Description of the Related Art

The manufacturing steps of a semiconductor device include various steps such as a lithography step, an etching step, an ion implantation step, or a peeling step. In general, a step of treating unnecessary organic matters and inorganic matters using a treatment liquid is provided after the end of each step or before the start of the next step. For example, a development step of treating an exposed resist film using a developer, a peeling step of treating a resist remaining on a surface of a treated substrate using a peeling liquid, or a rinsing step of further purifying the surface using a rinsing liquid after the development step or the peeling step may be provided.

A small amount of impurities included in various treatment liquids, such as a developer, a rinsing liquid, a pre-wet liquid, an etchant, a cleaning liquid, or a peeling liquid used in the manufacturing steps of a semiconductor device (hereinafter, referred to as "treatment liquids for manufacturing a semiconductor") cause various defects, and thus the yield of products or the reliability deteriorates. Therefore, the treatment liquid for manufacturing a semiconductor is required to have high purity.

In particular, products have required higher accuracy along with significant recent development of the electronic material industry, and a small amount of impurities included in the treatment liquid for manufacturing a semiconductor, in particular, in a developer, a rinsing liquid, or the like used in a photolithography step and contamination from a container storing the treatment liquid for manufacturing a semiconductor have become problematic. Therefore, requirements for high purity have become more strict.

Therefore, an organic treatment liquid for patterning a resist film with which the formation of particles can be reduced or a storage container in which the incorporation or elution of fine particles of components of the container into a stored solution is suppressed has been developed. For example, JP2014-112176A, JP2008-179774A, and JP2015-123351A can be referred to.

SUMMARY OF THE INVENTION

Metal impurities included in the treatment liquid for manufacturing a semiconductor cause defects such as particles. Therefore, it is considered that, the less the amount of metal impurities, the better. The present inventors clarified that the amount of metal impurities and the occurrence of defects do not necessarily relate to each other and the occurrence of defects cannot be necessarily suppressed simply by reducing the amount of metal impurities in the treatment liquid.

The present invention has been developed under the above-described circumstances, and an object thereof is to provide a treatment liquid for manufacturing a semiconductor with which the occurrence of defects such as particles is suppressed such that a fine resist pattern or a fine semiconductor element can be manufactured, and a storage container storing the treatment liquid for manufacturing a semiconductor. Another object of the present invention is to provide a pattern forming method using the treatment liquid for manufacturing a semiconductor and a method of manufacturing an electronic device.

The present invention is as follows.

[1] A storage container comprising:
   a storage portion that stores a treatment liquid for manufacturing a semiconductor,
   in which the treatment liquid for manufacturing a semiconductor includes one kind or two or more kinds of metal atoms selected from Cu, Fe, and Zn, and
   a total content of particulate metal including at least one kind of the metal atoms is 0.01 to 100 mass ppt with respect to a total mass of the treatment liquid for manufacturing a semiconductor.

[2] The storage container according to [1],
   in which a mass of the particulate metal is measured by a SP-ICP-MS method.

[3] The storage container according to [1] or [2],
   in which an inner wall of the storage portion that comes into contact with the treatment liquid for manufacturing a semiconductor is cleaned using a cleaning liquid having a contact angle of 10 degrees to 120 degrees on the inner wall before being filled with the treatment liquid for manufacturing a semiconductor.

[4] The storage container according to [3],
   in which the cleaning liquid is ultrapure water or a liquid including at least one of components included in the treatment liquid for manufacturing a semiconductor.

[5] The storage container according to any one of [1] to [4],
   in which at least a portion of an inner wall of the storage portion that comes into contact with the treatment liquid for manufacturing a semiconductor is formed of a material including at least one selected from the group consisting of polyethylene, polypropylene, polytetrafluoroethylene, and perfluoroalkoxy alkane.

[6] The storage container according to any one of [1] to [5],
   in which at least a portion of an inner wall of the storage portion that comes into contact with the treatment liquid for manufacturing a semiconductor is formed of a material including at least one selected from the group consisting of stainless steel, HASTELLOY (registered trade name), INCONEL (registered trade name), and MONEL.

[7] The storage container according to any one of [1] to [5],
in which at least a portion of an inner wall of the storage portion that comes into contact with the treatment liquid for manufacturing a semiconductor is formed of a material including at least one selected from the group consisting of stainless steel, HASTELLOY, INCONEL, and MONEL, and
a mass ratio represented by Cr/Fe in a portion having a depth of 1 nm from an outermost surface of the inner wall is 1 to 3.

[8] The storage container according to any one of [1] to [7],
in which an occupancy ratio of a void portion in the storage portion storing the treatment liquid for manufacturing a semiconductor is 50 to 0.01 vol %.

[9] The storage container according to any one of [1] to [8],
in which a void portion of the storage portion storing the treatment liquid for manufacturing a semiconductor is filled with gas in which the number of particles having a diameter of 0.5 μm or more is 10 particles/L or less.

[10] The storage container according to any one of [1] to [9],
in which a void portion of the storage portion storing the treatment liquid for manufacturing a semiconductor is filled with inert gas.

[11] The storage container according to any one of [1] to [10],
in which the treatment liquid for manufacturing a semiconductor is a developer or a rinsing liquid.

[12] The storage container according to any one of [1] to [11],
in which the treatment liquid for manufacturing a semiconductor includes a quaternary ammonium salt.

[13] The storage container according to any one of [1] to [11],
in which the treatment liquid for manufacturing a semiconductor includes at least one selected from the group consisting of butyl acetate, N-methyl-2-pyrrolidone, isopropanol, ethanol, and methyl isobutyl carbinol.

[14] A treatment liquid for manufacturing a semiconductor comprising:
one kind or two or more kinds of metal atoms selected from Cu, Fe, and Zn,
in which a total content of particulate metal including at least one kind of the metal atoms is 0.01 to 100 mass ppt with respect to a total mass of the treatment liquid for manufacturing a semiconductor.

[15] The treatment liquid for manufacturing a semiconductor according to [14],
in which a mass of the particulate metal is measured by a SP-ICP-MS method.

[16] The treatment liquid for manufacturing a semiconductor according to [14] or [15], which is a developer or a rinsing liquid.

[17] The treatment liquid for manufacturing a semiconductor according to any one of [14] to [16], further comprising:
a quaternary ammonium salt.

[18] The treatment liquid for manufacturing a semiconductor according to any one of [14] to [17], further comprising:
at least one selected from the group consisting of butyl acetate, N-methyl-2-pyrrolidone, isopropanol, ethanol, and methyl isobutyl carbinol.

[19] A pattern forming method comprising:
a step of applying an actinic ray-sensitive or radiation-sensitive resin composition to a substrate to form an actinic ray-sensitive or radiation-sensitive film;
a step of exposing the actinic ray-sensitive or radiation-sensitive film; and
a step of treating the substrate or the actinic ray-sensitive or radiation-sensitive film using the treatment liquid for manufacturing a semiconductor according to any one of [14] to [18].

[20] The pattern forming method according to [19],
in which the pattern forming method comprises at least a step of developing the actinic ray-sensitive or radiation-sensitive film by using the treatment liquid for manufacturing a semiconductor as a developer as the step of treating the substrate or the actinic ray-sensitive or radiation-sensitive film using the treatment liquid for manufacturing a semiconductor.

[21] The pattern forming method according to [19],
in which the pattern forming method comprises at least a step of cleaning the actinic ray-sensitive or radiation-sensitive film by using the treatment liquid for manufacturing a semiconductor as a rinsing liquid as the step of treating the substrate or the actinic ray-sensitive or radiation-sensitive film using the treatment liquid for manufacturing a semiconductor.

[22] A method of manufacturing an electronic device comprising:
the pattern forming method according to any one of [19] to [21].

According to the present invention, it is possible to provide a treatment liquid for manufacturing a semiconductor with which the occurrence of defects such as particles is suppressed such that a fine resist pattern or a fine semiconductor element can be manufactured, and a storage container storing the treatment liquid for manufacturing a semiconductor. In addition, according to the present invention, it is possible to provide a pattern forming method using the treatment liquid for manufacturing a semiconductor and a method of manufacturing a semiconductor device including the pattern forming method.

DESCRIPTION OF THE PREFERRED EMBODIMENTS

Figure 1:
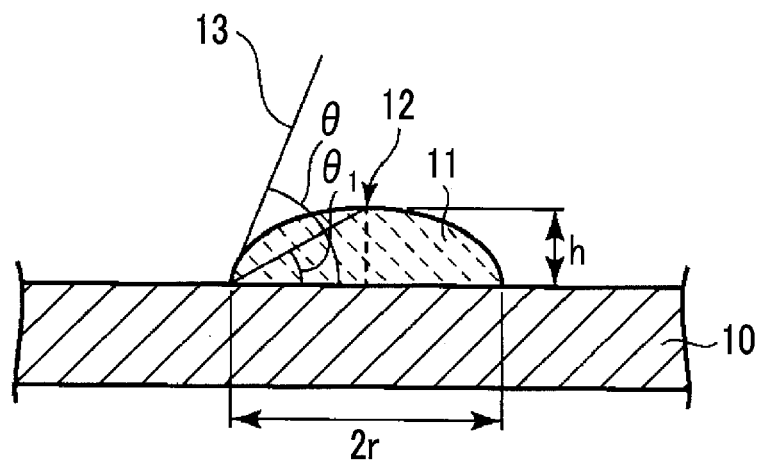
FIG. 1 is a schematic diagram showing a contact angle.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "actinic ray" or "radiation" denotes, for example, a bright light spectrum of a mercury lamp, a far ultraviolet ray represented by excimer laser, an extreme ultraviolet lithography ray (EUV ray), an X-ray, or an electron beam (EB). In addition, in the present invention, "light" denotes an actinic ray or radiation.

In addition, in this specification, unless specified otherwise, "exposure" denotes not only exposure using a mercury lamp, a far ultraviolet ray represented by excimer laser, an X-ray, an EUV ray, or the like but also drawing using a corpuscular beam such as an electron beam or an ion beam.

In addition, in this specification, "(meth)acrylate" represents "at least one of acrylate or methacrylate". In addition, "(meth)acrylic acid" represents "at least one of acrylic acid or methacrylic acid".

In addition, in this specification, numerical ranges represented by "to" include numerical values before and after "to" as lower limit values and upper limit values.

Hereinafter, embodiments of the present invention will be described in detail.

<Treatment Liquid for Manufacturing Semiconductor>

As described above, in manufacturing steps of a semiconductor device including a lithography step, an etching step, and an ion implantation step, "treatment liquid for manufacturing a semiconductor" according to the present invention is a treatment liquid used for treating an organic matter before the end of each step or after the start of the next step, and is, for example, a treatment liquid used as a developer, a rinsing liquid, a pre-wet liquid, an etchant, a cleaning liquid, or a peeling liquid.

The treatment liquid for manufacturing a semiconductor according to the present invention (hereinafter, also referred to as "the treatment liquid according to the present invention) includes one kind or two or more kinds of metal atoms selected from Cu, Fe, and Zn, and a total content of particulate metal including at least one kind of the metal atoms is 0.01 to 100 mass ppt (parts per trillion) with respect to the total mass of the treatment liquid.

The metal elements selected from metal species (hereinafter, also referred to as "target metals" or the like") including Cu, Fe, and Zn are included in the treatment liquid for manufacturing a semiconductor as impurities. Particles including these metal elements form defects and have a large effect on the formation of a fine resist pattern or a fine semiconductor element. Therefore, it has been considered that, as the amount of metal atoms included in the treatment liquid for manufacturing a semiconductor decreases, the occurrence of defects during the manufacturing of a semiconductor is reduced, which is preferable. However, the present inventors found that the amount of metal atoms in the treatment liquid and the rate of occurrence of defects do not necessarily relate to each other and there is a variation in the rate of occurrence of defects.

However, according to the recently developed Single-Particle ICP-MS (SP-ICP-MS) measurement, as the amount of metal atoms present in a solution, the amount of ionic metal and the amount of particulate metal (nonionic metal) can be dividedly measured. Here, the particulate metal (nonionic metal) refers to a metal component present in a solution as a solid without being dissolved.

In the related art, the amount of metal atoms included in a treatment liquid for manufacturing a semiconductor is typically analyzed using the ICP-MS method. Depending on ICP-MS, the ionic metal and the particulate metal (nonionic metal) including at least one kind of the metal atoms cannot be distinguished from each other, and thus the quantity thereof is determined as the total mass of the metal atoms, that is, the total mass (hereinafter, also referred to as "total metal amount") of the ionic metal and the particulate metal (nonionic metal).

Now that the ionic metal and the particulate metal can be distinguished from each other and the quantities thereof can be determined using the single-particle ICP-MS (SP-ICP-MS) measurement, the present inventors conducted a thorough research on the effect of each of the ionic metal and the particulate metal (nonionic metal) derived from the metal atoms in the treatment liquid on defects.

As a result, it was found that the amount of the particulate metal (nonionic metal) has an extremely large effect on the occurrence of defects and there is a correlation between the amount of the particulate metal (nonionic metal) and the occurrence of defects.

The present invention has been completed based on the above findings, and has one characteristic that the content of the total mass of particulate metal including at least one kind of the metal atoms selected from the Cu, Fe, and Zn as the target metals is 0.01 to 100 mass ppt with respect to the total mass of the treatment liquid. Hereinafter, for example, this content will also be referred to as "the content of the particulate metal".

The content of the particulate metal in the treatment liquid according to the present invention is preferably 0.01 to 50 mass ppt and more preferably 0.01 to 10 mass ppt with respect to the total mass of the treatment liquid according to the present invention.

Examples of a device that can be used for the measurement using the SP-ICP-MS method include a device (NexION350S, manufactured by PerkinElmer Co., Ltd.) used in Examples described below, Agilent 8800 triple quadrupole ICP-MS (inductively coupled plasma mass spectrometry; manufactured by Agilent Technologies Inc.; for analyzing a semiconductor, option #200), and Agilent 8900 (manufactured by Agilent Technologies Inc.).

As described above, in a case where the treatment liquid according to the present invention may be used as any one of a developer, a rinsing liquid, a pre-wet liquid, an etchant, a cleaning liquid, a peeling liquid, and the like used in the manufacturing steps of a semiconductor device. In one aspect of the present invention, it is preferable that the treatment liquid is used as a developer or a rinsing liquid.

In a case where the treatment liquid according to the present invention is used as a developer, the developer may be an alkali developer or a developer including an organic solvent.

In a case where the treatment liquid according to the present invention is used as an alkali developer, it is preferable that the treatment liquid according to the present invention is an aqueous solution including a quaternary ammonium salt represented by tetramethylammonium hydroxide (TMAH). In addition, the treatment liquid according to the present invention may be an alkali aqueous solution including an inorganic alkali, primary to tertiary amines, an alcohol amine, or a cyclic amine.

Specific examples of the alkali developer include an alkaline aqueous solution including: an inorganic alkali such as sodium hydroxide, potassium hydroxide, sodium carbonate, sodium silicate, sodium metasilicate, or ammonia water; a primary amine such as ethylamine or n-propyl amine; a secondary amine such as diethylamine or di-n-butylamine; a tertiary amine such as triethylamine or methyldiethylamine; an alcohol amine such as dimethylethanolamine or triethanolamine; a quaternary ammonium salt such as tetramethylammonium hydroxide or tetraethylammonium hydroxide; or a cyclic amine such as pyrrole or piperidine. Among these, an aqueous solution including tetramethylammonium hydroxide or tetraethylammonium hydroxide is preferable.

Further, an appropriate amount of an alcohol or a surfactant may be added to the alkali developer. The alkali concentration in the alkali developer is typically 0.1 to 20 mass %. The pH of the alkali developer is typically 10.0 to 15.0.

A period of time during which development is performed using the alkali developer is typically 10 to 300 seconds.

The alkali concentration (and pH) and development time of the alkali developer can be appropriately adjusted according to a pattern to be formed.

In a case where the treatment liquid according to the present invention is used as a developer including an organic solvent (hereinafter, also referred to as "organic developer"), as the organic solvent, a polar solvent such as a ketone solvent, an ester solvent, an alcohol solvent, an amide solvent, or an ether solvent or a hydrocarbon solvent can be used. As the solvent used in the present invention, a solvent in which the concentration of an inorganic ion such as a sulfate ion, a chloride ion, or a nitrate ion and the concentration of Fe, Cu, and Zn as the target metals are reduced can be used, and it is more preferable that the solvent is further reduced for use.

Examples of the ketone solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxy butyl acetate, 3-methyl-3-methoxy butyl acetate, methyl formate, ethyl formate, butyl formate, propyl formate, ethyl lactate, butyl lactate, and propyl lactate.

Examples of the alcohol solvent include: an alcohol such as methyl alcohol, ethyl alcohol, n-propyl alcohol, isopropyl alcohol (IPA), n-butyl alcohol, sec-butyl alcohol, tert-butyl alcohol, isobutyl alcohol, 4-methyl-2-pentanol (methyl isobutyl carbinol; MIBC), n-hexyl alcohol, n-heptyl alcohol, n-octyl alcohol, or n-decanol; a glycol solvent such as ethylene glycol, diethylene glycol, or triethylene glycol; and a glycol ether solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, or methoxy methyl butanol.

Examples of the ether solvent include the above-described glycol ether solvents, dioxane, and tetrahydrofuran.

Examples of the amide solvent include N-methyl-2-pyrrolidone (NMP), N,N-dimethylacetamide, N,N-dimethylformamide, hexamethylphosphoric amide, and 1,3-dimethyl-2-imidazolidinone.

Examples of the hydrocarbon solvent include: an aromatic hydrocarbon solvent such as toluene or xylene; and an aliphatic hydrocarbon solvent such as pentane, hexane, octane, decane, or undecane.

A mixture of a plurality of kinds among the organic solvents may be used, or a mixture of one of the organic solvents and a solvent other than the organic solvents or water may be used. However, in order to sufficiently exhibit the effects of the present invention, it is preferable that the moisture content is lower than 10 mass % with respect to the total mass of the developer, and it is more preferable that the developer does not substantially include water.

In particular, it is preferable that the organic developer is a developer including at least one organic solvent selected from the group consisting of a ketone solvent, an ester solvent, an alcohol solvent, an amide solvent, and an ether solvent.

A vapor pressure of the organic developer at 20° C. is preferably 5 kPa or lower, more preferably 3 kPa or lower, and still more preferably 2 kPa or lower. By adjusting the vapor pressure of the organic developer to be 5 kPa or lower, evaporation of developer on a substrate or in a developing cup suppressed, and uniformity in the temperature in a wafer surface is improved. As a result, uniformity in the dimension in a wafer surface is improved.

Optionally, an appropriate amount of a surfactant can be added to the organic developer.

The surfactant is not particularly limited. For example, an ionic or nonionic fluorine surfactant and/or an ionic or nonionic silicon surfactant can be used. Examples of the fluorine and/or silicon surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), U.S. Pat. Nos. 5,405,720A, 5,360,692A, 5,529,881A, 5,296,330A, 5,436,098A, 5,576,143A, 5,294,511A, and 5,824,451A. Among these, a nonionic surfactant is preferable. The nonionic surfactant is not particularly limited, and a fluorine surfactant or a silicon surfactant is more preferable.

The amount of the surfactant used is typically 0.001 to 5 mass %, preferably 0.005 to 2 mass %, and more preferably 0.01 to 0.5 mass % with respect to the total mass of the developer.

It is preferable that the organic developer is butyl acetate.

In addition, the organic developer may include a nitrogen-containing compound described in paragraphs "0041" to "0063" of JP5056974B. From the viewpoint of storage stability of the developer or the like, it is preferable that the addition of the nitrogen-containing compound to the organic developer is performed immediately before the formation of a pattern.

In a case where the treatment liquid according to the present invention is a rinsing liquid, it is preferable that the treatment liquid according to the present invention includes an organic solvent. As the solvent used in the present invention, a solvent in which the concentration of an inorganic ion such as a sulfate ion, a chloride ion, or a nitrate ion and the concentration of Fe, Cu, and Zn as the target metals are reduced can be used, and it is more preferable that the solvent is further reduced for use.

The amount of the organic solvent used in the rinsing liquid including an organic solvent (hereinafter, referred to as "organic rinsing liquid") is preferably 90 mass % to 100 mass %, and more preferably 95 mass % to 100 mass % with respect to the total amount of the rinsing liquid.

The organic rinsing liquid is not particularly limited as long as it does not dissolve a resist pattern, and a solution including a general organic solvent can be used. In a case where the treatment liquid according to the present invention is used as the organic rinsing liquid, it is preferable that the treatment liquid according to the present invention includes at least one organic solvent selected from the group consisting of a hydrocarbon solvent, a ketone solvent, an ester solvent, an alcohol solvent, an amide solvent, and an ether solvent.

Specific examples of the hydrocarbon solvent, the ketone solvent, the ester solvent, the alcohol solvent, the amide solvent, and the ether solvent include the examples described above regarding the organic developer.

Among these, it is preferable that the treatment liquid according to the present invention as the organic rinsing liquid includes at least one selected from the group consisting of N-methyl-2-pyrrolidone (NMP), isopropanol (IPA), ethanol, and 4-methyl-2-pentanol (MIBC).

The moisture content in the organic rinsing liquid is preferably 10 mass % or lower, more preferably 5 mass % or lower, and still more preferably 3 mass % or lower. By adjusting the moisture content to be 10 mass % or lower, excellent developing characteristics can be obtained.

A vapor pressure of the organic rinsing liquid at 20° C. is preferably 0.05 kPa or higher and 5 kPa or lower, more preferably 0.1 kPa or higher and 5 kPa or lower, and most preferably 0.12 kPa or higher and 3 kPa or lower. By adjusting the vapor pressure of the rinsing liquid to be 0.05 kPa or higher and 5 kPa or lower, uniformity in the temperature in a wafer surface is improved. Further, swelling of the resist film caused by permeation of the rinsing liquid is suppressed, and uniformity in the dimension in a wafer surface is improved.

An appropriate amount of the surfactant can also be added to the organic rinsing liquid.

[Method of Adjusting Metal Content]

In the treatment liquid according to the present invention, the ion concentration of each of Na, Ca, Al, Cr, Co, Pb, Li, Mg, Mn, Ni, K, Ag, and the like is preferably 1 ppm (parts per million) or lower and more preferably 1 ppb or lower. In particular, it is more preferable that the ion concentration is in the order of ppt (all the concentrations are based on mass), and it is still more preferable that the treatment liquid does not substantially include Na, Ca, Al, Cr, Co, Pb, Li, Mg, Mn, Ni, K, Ag, and the like.

The metal content of the treatment liquid according to the present invention may be adjusted by repeating distillation, filter filtration, filtration using an ion exchange resin, adsorption purification, or the like to sufficiently purify the treatment liquid, for example, at least one of a step of preparing the respective raw materials used for manufacturing the treatment liquid or a step after the preparation of the treatment liquid.

Here, the method of adjusting the metal content (hereinafter, also referred to as "method of reducing the metal concentration") is not particularly limited, and examples thereof include adsorption purification using silicon carbide described in WO2012/043496A. Further, an example of using the adsorption purification in combination with distillation, filter filtration, or filtration using an ion exchange resin to sufficiently purify the treatment liquid is also preferable.

From the viewpoint of obtaining the effects of the present invention, it is more preferable that the method of adjusting the metal content is performed in the step of preparing the respective raw materials used for manufacturing the treatment liquid. In addition, in the raw materials, it is preferable that the content of the specific metal atoms or the content of an inorganic ion such as a sulfate ion, a chloride ion, or a nitrate ion and a specific metal ion are reduced.

In another method relating to the method of reducing the metal concentration, for example, as "container" that stores the raw materials used for manufacturing the treatment liquid, a container in which the elution of impurities is reduced as described below regarding a storage container that stores the treatment liquid according to the present invention. In addition, for example, a method of lining an inner wall of the pipe with a fluororesin to prevent the specific metal atoms from being eluted from "the pipe" or the like used for the preparation of the treatment liquid can also be used.

[Impurities and Coarse Particles]

In addition, it is preferable that the treatment liquid according to the present invention does not substantially include coarse particles.

Here, the coarse particles included in the treatment liquid refer to particles of dirt, dust, an organic solid matter, an inorganic solid matter, or the like included in raw materials as impurities or particles of dirt, dust, an organic solid matter, an inorganic solid matter, or the like introduced as a contaminant during the preparation of the treatment liquid. The coarse particles correspond to particles that finally remain in the treatment liquid without being dissolved. The amount of the coarse particles present in the treatment liquid can be measured in a liquid phase using a commercially available measuring device according to a light scattering particle measurement method in liquid in which a laser is used as a light source.

It is preferable that the treatment liquid according to the present invention is stored in a storage container described below.

<Storage Container Storing Treatment Liquid for Manufacturing Semiconductor>

The present invention relates to a storage container (hereinafter, also referred to as "storage container according to the present invention") including a storage portion that stores the treatment liquid according to the present invention.

It is preferable that the storage container according to the present invention is a container with which an increase in the content of the particulate metal in the treatment liquid according to the present invention stored in the storage container can be suppressed and the content of the particulate metal in the treatment liquid even after a long-term storage can be maintained in a range of 0.01 to 100 mass %.

In one aspect, the storage container according to the present invention includes: a storage portion that stores the treatment liquid according to the present invention; and a seal portion that seals the storage portion.

In one aspect of the present invention, it is preferable that at least a portion of an inner wall of the storage portion that comes into contact with the treatment liquid according to the present invention is formed of a material including at least one selected from the group consisting of polyethylene, polypropylene, polytetrafluoroethylene, and perfluoroalkoxy alkane. Here, "at least a portion" represents that, for example, a lining, a lining layer, a laminate layer, a seal material used for a junction portion, a lid, or an observation window in the inner wall of the storage portion may be formed another material.

In another aspect of the present invention, it is preferable that at least a portion of the inner wall of the storage portion that comes into contact with the treatment liquid is formed of a material including at least one selected from the group consisting of stainless steel, HASTELLOY, INCONEL, and MONEL.

In a case where at least a portion of the inner wall of the storage portion that comes into contact with the treatment liquid for manufacturing a semiconductor according to the present invention is formed of a material including at least one selected from the group consisting of stainless steel, HASTELLOY, INCONEL, and MONEL, it is preferable that the inner wall satisfies the following conditions.

That is, it is preferable that a mass ratio represented by Cr/Fe in a portion having a depth of 1 nm from an outermost surface of the inner wall is preferably in a range of 1 to 3 and more preferably in a range of 1 to 2.5.

The reason for this is that, in a case where the ratio Cr/Fe is in the above-described range, an effect of suppressing the elution of components such as Fe, Ni, or Cr is high. That is, in a case where the mass ratio represented by Cr/Fe is 1 or higher, the elution of Fe and the elution of the Ni and Cr components, which occurs along with the elution of Fe, can be significantly suppressed. In addition, in a case where the mass ratio represented by Cr/Fe is 3 or higher, the smoothness of the inner wall surface is maintained. Therefore, the contact area of a chemical liquid is small, and the elution of the Fe, Ni, and Cr components can be more significantly suppressed. By adjusting the mass ratio to be 2.5 or lower, the above-described effect is more significant.

In the storage container according to the present invention, it is preferable that at least the inner wall of the storage portion that comes into contact with the treatment liquid according to the present invention is cleaned using a cleaning liquid before being filled with the treatment liquid according to the present invention.

As the cleaning liquid that can be used in a cleaning step before the filling of the treatment liquid according to the present invention, for example, a cleaning liquid having a contact angle of 10 degrees to 120 degrees on the inner wall is preferably used.

Here, the contact angle refers to an index relating to wettability of a surface of a material with respect to a liquid and, as shown in FIG. 1, is expressed by an angle θ that is formed by a tangent line 13 in a peripheral portion of a liquid (cleaning liquid) 11 attached to a material (the inner wall of the storage portion) 10 with respect to a surface of the material 10. Accordingly, as the contact angle θ increases, the material 10 is likely to repel the liquid 11, and the wettability with respect to the liquid 11 is low. Conversely, as the contact angle θ decreases, the material 10 is less likely to repel the liquid 11, and the wettability with respect to the liquid 11 is high. The magnitude of the contact angle θ depends on the magnitude of surface energy, and as the surface energy, the contact angle θ increases.

In the present invention, the contact angle is a value measured using a θ/2 method described below in Examples.

The storage container according to the present invention is cleaned before being filled with the treatment liquid according to the present invention.

In the cleaning step before filling the storage portion with the treatment liquid according to the present invention, by cleaning the inner wall using a cleaning liquid having a contact angle of 10 degrees or higher on the inner wall and having appropriate wettability. The cleaning liquid does not remain in the container, and infiltration of the cleaning liquid filled after cleaning or contaminants included in the cleaning liquid into the treatment liquid according to the present invention can be suppressed. In addition, by cleaning the inner wall using a cleaning liquid having a contact angle of 120 degrees or lower on the inner wall and having appropriate wettability, the removal rate of contaminants remaining in fine gaps of the storage portion can be improved.

In addition, it is preferable that the cleaning liquid includes at least one of components included in the treatment liquid according to the present invention. It is preferable that the at least one component is one component or two or more components included in the treatment liquid according to the present invention as a major component. Requirements for high purity of the treatment liquid have become more strict, and the cleaning liquid itself may be an impurity in a liquid product to be filled. However, by using a cleaning liquid including the same component as that included in the treatment liquid to be filled, the occurrence of the impurity can be suppressed. In one aspect of the present invention, the treatment liquid according to the present invention itself may be cleaned using the cleaning liquid.

Specific examples of the cleaning liquid include ultrapure water and isopropyl alcohol. As the ultrapure water and isopropyl alcohol used as the cleaning liquid according to the present invention, ultrapure water or isopropyl alcohol in which the concentration of an inorganic ion such as a sulfate ion, a chloride ion, or a nitrate ion and the concentration of Fe, Cu, and Zn as the target metals are reduced can be used, and it is more preferable that the ultrapure water or the isopropyl alcohol is further reduced for use. A purification method is not particularly limited, and purification using a filtration film or an ion-exchange membrane or purification using distillation is preferable.

Examples of a cleaning method include a well-known method. For example, the following Example 1 and Example 2 can be used as the cleaning method.

Example 1

A container having an inner volume of 20 L is filled with 5 L of a cleaning liquid and then is sealed. Next, by shaking the container for 1 minute, the cleaning liquid is spread all over the surface of a liquid contact portion in the container, and a lid is opened to discharge the cleaning liquid. Next, the container is rinsed with ultrapure water three times while replacing ultrapure water, and then is dried. The number of times of cleaning using the cleaning liquid and the cleaning time are determined according to a necessary cleanliness, and then the number of times of rinsing using ultrapure water and the rinsing time are optionally determined.

Example 2

An opening of a container faces downward, and the cleaning liquid is jetted from the opening to an inner surface of the container using a jetting nozzle or the like to clean the container. In order to clean the entire inner surface of the container, for example, a method of using a diffusion nozzle, a method of disposing a plurality of nozzles, and a method of cleaning the container while moving the container and/or a cleaning nozzle are appropriately performed. The cleaning time is determined according to a necessary cleanliness.

In one aspect of the storage container according to the present invention, it is preferable that an occupancy ratio (hereinafter, also referred to as "void volume") of a void portion in the storage portion storing the treatment liquid according to the present invention is 50 to 0.01 vol %. By adjusting the upper limit value of the void volume in the storage portion to be 50 vol % or lower, the possibility of infiltration of impurities in gas occupying the void portion into the treatment liquid according to the present invention can be reduced. In one aspect, the void volume in the storage portion is more preferably 20 to 0.01 vol % and still more preferably 10 to 1 vol %.

In one aspect, in the storage container according to the present invention, it is preferable that the void portion of the storage portion storing the treatment liquid according to the present invention is filled with high-purity gas having a small amount of particles. As the gas, for example, gas in which the number of particles having a diameter of 0.5 μm or more is 10 particles/L or less is preferable, and gas in which the number of particles having a diameter of 0.5 μm or more is 1 particles/L or less is more preferable.

It is preferable that all the handling operations including the preparing of the treatment liquid according to the present invention, the cleaning of the storage container, and the filling of the treatment liquid, the treatment analysis, and the measurement are performed in a clean room. It is preferable that the clean room satisfies the clean room standards 14644-1. It is preferable that the clean room satisfies any one of ISO Class 1, ISO Class 2, ISO Class 3, and ISO Class 4, it is more preferable that the clean room satisfies ISO Class 1 or ISO Class 2, and it is still more preferable that the clean room satisfies ISO Class 1.

In a pattern forming method or a method of manufacturing a semiconductor device described below, the treatment liquid according to the present invention is used as a developer, a rinsing liquid, a pre-wet liquid, an etchant, a cleaning liquid, a peeling liquid, or the like.

That is, in the pattern forming method or the method of manufacturing a semiconductor device, the treatment liquid according to the present invention can be used as one treatment liquid or as two or more treatment liquids among a developer, a rinsing liquid, a pre-wet liquid, an etchant, a cleaning liquid, and a peeling liquid.

Next, a manufacturing device that can be suitably used for manufacturing the treatment liquid according to the present invention will be described.

[Manufacturing Device]

Figure 2:
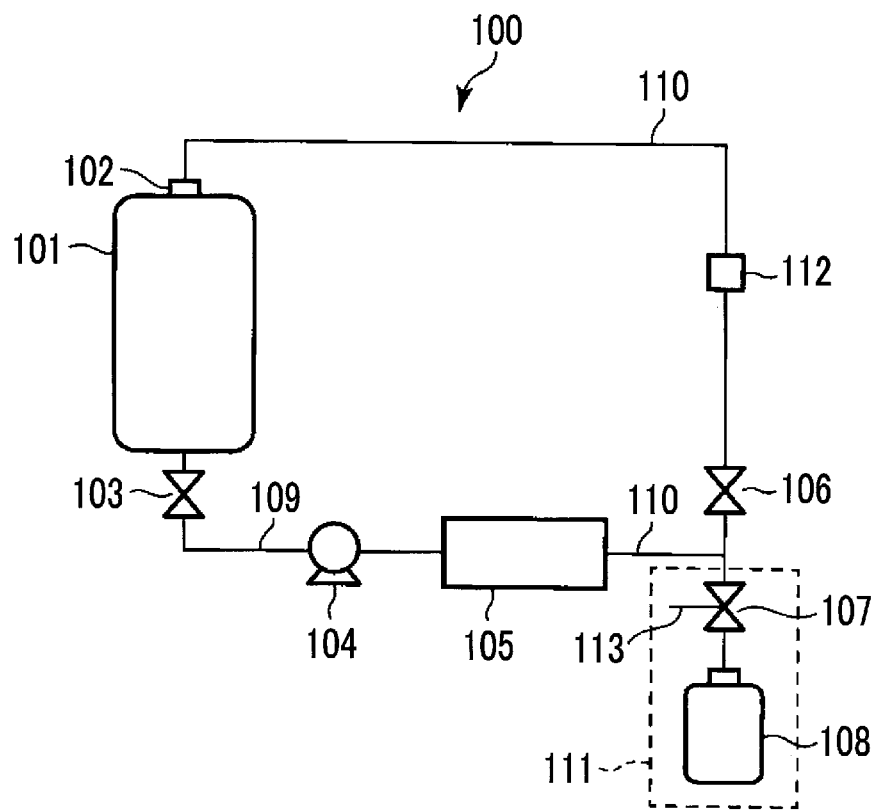
FIG. 2 is a schematic diagram showing an aspect of a manufacturing device that can be used in a method of manufacturing a treatment liquid according to an embodiment of the present invention.

FIG. 2 is a schematic diagram showing an aspect of a manufacturing device that can be used in the method of manufacturing the treatment liquid according to the embodiment of the present invention. The manufacturing device 100 includes a tank 101, and the tank 101 includes a supply port 102 for supplying a cleaning liquid and/or an organic solvent (crude liquid including the treatment liquid according to the present invention). The manufacturing device 100 includes a filtration device 105, and the tank 101 and the filtration device 105 are connected to each other through a supply pipe 109 such that the fluid (for example, the cleaning liquid, the organic solvent, and the treatment liquid) can be transferred between the tank 101 and the filtration device 105. In the supply pipe 109, a valve 103 and a pump 104 are disposed. In FIG. 2, the manufacturing device 100 includes the tank 101 and the filtration device 105. However, the manufacturing device that can be used in the method of manufacturing the treatment liquid according to the embodiment of the present invention is not limited to this configuration.

In the manufacturing device 100, the fluid supplied from the supply port 102 flows to the filtration device 105 through the valve 103 and the pump 104. The fluid discharged from the filtration device 105 is stored in the tank 101 through a circulation pipe 110.

The manufacturing device 100 includes a discharge unit 111 that discharges the treatment liquid to the circulation pipe 110. The discharge unit 111 includes a valve 107 and a container 108. By switching between the valve 106 provided in the circulation pipe and the valve 107, the manufactured treatment liquid can be stored in the container 108. In addition, a switchable pipe 113 is connected to the valve 107 such that the cleaning liquid can be discharged to the outside of the manufacturing device 100 through the pipe 113 after circulation cleaning. After the circulation cleaning, the cleaning liquid may include particles and metal impurities and the like. According to the manufacturing device 100 including the pipe 113 from which the cleaning liquid is discharged to the outside of the manufacturing device 100, the treatment liquid having higher defect suppressing performance can be obtained without contamination in a filling portion and the like of the container 108.

Further, the manufacturing device 100 further includes a cleaning liquid monitoring unit 112 in the circulation pipe 110. FIG. 2 shows the manufacturing device 100 that includes the cleaning liquid monitoring unit 112 in the circulation pipe 110. However, the manufacturing device that can be used in the method of manufacturing the treatment liquid according to the embodiment of the present invention is not limited to this configuration. The cleaning liquid monitoring unit 112 may be provided in the supply pipe 109 or may be provided in the supply pipe 109 and the circulation pipe 110. In the manufacturing device 100, the cleaning liquid monitoring unit 112 may be directly provided in the circulation pipe 110. However, the manufacturing device that can be used in the method of manufacturing the treatment liquid according to the embodiment of the present invention is not limited to this configuration. The cleaning liquid monitoring unit may be provided in a fluid temporary storage tank (not shown; different from the tank 101) provided in the pipe.

Figure 3:
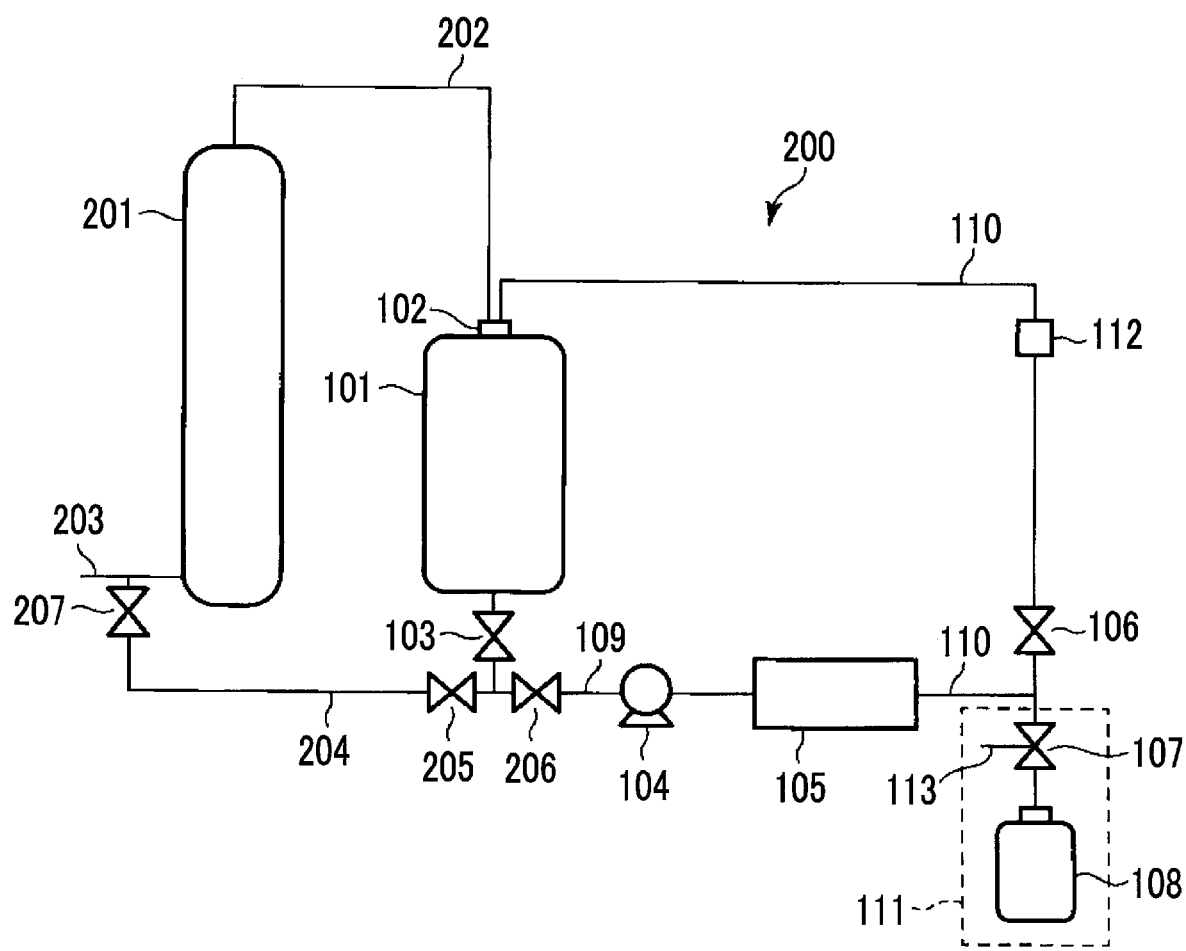
FIG. 3 is a schematic diagram showing another aspect of the manufacturing device that can be used in the method of manufacturing the treatment liquid according to the embodiment of the present invention.

FIG. 3 is a schematic diagram showing another aspect of the manufacturing device that can be used in the method of manufacturing the treatment liquid according to the embodiment of the present invention. A manufacturing device 200 includes the tank 101 and the filtration device 105 and further includes a distillation column 201 that is connected to the tank 101 through a pipe 202, a pipe 204, and a pipe 203 and is disposed such that fluid can be transferred between the tank 101 and the distillation column 201 through the pipes. In addition, the manufacturing device that can be used in the method of manufacturing the treatment liquid according to the embodiment of the present invention does not necessarily include the filtration device 105 and/or the distillation column 201, and may further include a reaction vessel connected to the distillation column 201 through the pipe 203.

In the manufacturing device 200, the fluid supplied to the distillation column 201 through the pipe 203 is distilled in the distillation column 201. The distilled fluid is stored in the tank 101 through the pipe 202. The supply pipe 109 includes the valve 103 and a valve 206. By switching between the valve 103, the valve 206, and a valve 205 provided in the pipe 204, the fluid discharged from the tank 101 can be caused to flow to the filtration device 105.

In addition, in the manufacturing device 200, the fluid discharged from the tank 101 can be caused to flow to the distillation column 201 again. In this case, by switching between the valve 103, the valve 206, and the valve 205, the fluid flows from the pipe 204 to the distillation column 201 through the valve 207 and the pipe 203.

A material of a liquid contact portion (the definition of the liquid contact portion will be described below) of the manufacturing device is not particularly limited. From the viewpoint of obtaining the treatment liquid having higher defect suppressing performance, it is preferable that the liquid contact portion is formed of at least one selected from the group consisting of a nonmetallic material and an electropolished metallic material. In this specification, "liquid contact portion" refers to a region (for example, a tank inner surface, a liquid feed pump, a damper, a packing, an O-ring, or a pipe inner surface) that is likely to come into contact with fluid and has a thickness of 100 nm from the surface.

The nonmetallic material is not particularly limited and is preferably a polyethylene resin, a polypropylene resin, a polyethylene-polypropylene resin, or a fluorine-containing resin material. From the viewpoint of reducing the elution of metal atoms, the nonmetallic material is preferably a fluorine-containing resin material.

As the fluorine-containing resin material, for example, a perfluororesin is used, and examples thereof include a polytetrafluoroethylene resin (PTFE), a polytetrafluoroethylene-perfluoroalkyl vinyl ether copolymer (PFA), a polytetrafluoroethylene-hexafluoropropylene copolymer resin (FEP), a polytetrafluoroethylene-ethylene copolymer resin (ETFE), a polychlorotrifluoroethylene-ethylene copolymer resin (ECTFE), a vinylidene fluoride resin (PVDF), a polychlorotrifluoroethylene copolymer resin (PCTFE), and a vinyl fluoride resin (PVF).

Preferable examples of the fluorine-containing resin material include a polytetrafluoroethylene resin, a polytetrafluoroethylene-perfluoroalkyl vinyl ether copolymer, and a polytetrafluoroethylene-hexafluoropropylene copolymer resin.

The metallic material is not particularly limited, and a well-known material can be used.

Examples of the metallic material include a metallic material in which the total content of chromium and nickel is higher than 25 mass % with respect to the total mass of the metallic material. In particular, a metallic material in which the total content of chromium and nickel is 30 mass % or higher with respect to the total mass of the metallic material is more preferable. The upper limit value of the total content of chromium and nickel in the metallic material is not particularly limited and, in general, is preferably 90 mass % or lower.

Examples of the metallic material include stainless steel, carbon steel, alloy steel, nickel-chromium-molybdenum steel, chromium steel, chromium-molybdenum steel, manganese steel, and a nickel-chromium alloy.

The stainless steel is not particularly limited, and a stainless steel can be used. An alloy including 8 mass % or higher of nickel is preferable, and an austenite stainless steel including 8 mass % or higher of nickel is more preferable. Examples of the austenite stainless steel include SUS (Steel use Stainless) 304 (Ni content: 8 mass %, Cr content: 18 mass %), SUS304L (Ni content: 9 mass %, Cr content: 18 mass %), SUS316 (Ni content: 10 mass %, Cr content: 16 mass %), and SUS316L (Ni content: 12 mass %, Cr content: 16 mass %).

The nickel-chromium alloy is not particularly limited, and a well-known nickel-chromium alloy can be used. In particular, a nickel-chromium alloy in which the nickel content is 40 to 75 mass % and the chromium content is 1 to 30 mass % is preferable.

Examples of the nickel-chromium alloy include HASTELLOY (trade name; hereinafter the same shall be applied), MONEL (trade name; hereinafter the same shall be applied), and INCONEL (trade name; hereinafter the same shall be applied). Specific examples include HASTELLOY C-276 (Ni content: 63 mass %, Cr content: 16 mass %), HASTELLOY-C(Ni content: 60 mass %, Cr content: 17 mass %), and HASTELLOY C-22 (Ni content: 61 mass %, Cr content: 22 mass %).

In addition, optionally, the nickel-chromium alloy may further include boron, silicon, tungsten, molybdenum, copper, and cobalt in addition to the above-described alloy.

A method of electropolishing the metallic material is not particularly limited, and a well-known method can be used. For example, methods described in paragraphs "0011" to "0014" of JP2015-227501A and paragraphs "0036" to "0042" of JP2008-264929A can be used.

It is presumed that, by electropolishing the metallic material, the chromium content in a passive layer of the surface is higher than that in the parent phase. Therefore, it is presumed that since metal impurities including metal atoms in the organic solvent are not likely to flow out from the distillation column in which the liquid contact portion is formed of the electropolished metallic material, the distilled organic solvent in which the impurity content is reduced can be obtained.

The metallic material may be buffed. A buffing method is not particularly limited, and a well-known method can be used. The size of abrasive grains used for buffing is not particularly limited and is preferably #400 or less from the viewpoint of further reducing the roughness of the surface of the metallic material. It is preferable that buffing is performed before electropolishing.

From the viewpoint of obtaining the treatment liquid having higher defect suppressing performance, it is preferable that the liquid contact portion is formed of electropolished stainless steel. In particular, in a case where the manufacturing device includes a tank, it is more preferable that the liquid contact portion of the tank is formed of electropolished stainless steel. A content mass ratio (hereinafter, also referred to as "Cr/Fe") of the Cr content to the Fe content in the liquid contact portion is not particularly limited and, in general, is preferably 0.5 to 4. In particular, from the viewpoint of further suppressing the elution of metal impurities and/or organic impurities in the treatment liquid, the content mass ratio is more preferably higher than 0.5 and lower than 3.5 and more preferably 0.7 to 3.0. In a case where Cr/Fe is higher than 0.5, the metal elution from the tank can be suppressed. In a case where Cr/Fe is lower than 3.5, the peeling of the liquid contact portion or the like which causes the formation of particles is not likely to occur.

A method of adjusting Cr/Fe in the metallic material is not particularly limited, and examples thereof include a method of adjusting the content of Cr atoms in the metallic material and a method of electropolishing the metallic material such that the chromium content in a passive layer of the surface is higher than that in the parent phase.

The metallic material may be a metallic material applied to the coating techniques.

The coating techniques are roughly classified into three kinds:metal coating (various kinds of plating); inorganic coating (for example, various kinds of chemical conversion coating, glass coating, concrete coating, or ceramic coating); and organic coating (rust-preventing oil coating, paint coating, rubber coating, or plastic coating), and any one of the coating techniques may be adopted.

Preferable examples of the coating technique include a surface treatment using rust-preventing oil, a rust-preventing agent, a corrosion inhibitor, a chelate compound, a strippable plastic, or a lining agent.

In particular, as the coating technique, a surface treatment using a corrosion inhibitor, a chelate compound, or a lining agent is preferable. Here, examples of the corrosion inhibitor include various chromates, a nitrite, a silicate, a phosphate, a carboxylic acid (for example, oleic acid, dimer acid, or naphthenic acid), a metal soap of a carboxylic acid, a sulfonate, an amine salt, and an ester (a glycerin ester or a phosphoric acid ester of higher fatty acid). Examples of the chelate compound include ethylenediaminetetraacetic acid, gluconic acid, nitrilotriacetic acid, hydroxyethyl ethylenediaminetriacetic acid, and diethylenediaminepentaacetic acid. Examples of the lining agent include a fluororesin lining agent. A treatment using a phosphate or fluororesin lining agent is more preferable.

By the manufacturing device including the filtration device 105, the treatment liquid having higher defect suppressing performance can be easily obtained. A filtration member included in the filtration device 105 is not particularly limited and is preferably at least one selected from the group consisting of a filter having a critical particle diameter of 20 nm or less and a metal ion adsorption filter and more preferably a metal ion adsorption filter having a critical particle diameter of 20 nm or less.

Filter Having Critical Particle Diameter of 20 nm or Less

The filter having a critical particle diameter of 20 nm or less has a function of efficiently removing particles having a particle size of 20 nm or more from the organic solvent and the like which are the raw materials of the treatment liquid.

The critical particle diameter of the filter is preferably 1 to 15 nm and more preferably 1 to 12 nm. In a case where the critical particle diameter is 15 nm or less, finer particles can be removed. In a case where the critical particle diameter is 1 nm or more, the filtration efficiency is improved.

Here, the critical particle diameter refers to the minimum size of particles that can be removed by a filter. For example, in a case where the critical particle diameter of the filter is 20 nm, particles having a diameter of 20 nm or more can be removed.

Examples of a material of the filter include a nylon such as 6-nylon or 6,6-nylon, polyethylene, polypropylene, polystyrene, polyimide, polyamide imide, and a fluororesin. Polyimide and/or polyamide imide may have at least one selected from the group consisting of a carboxy group, a salt type carboxy group, and an —NH— bond. From the viewpoint of solvent resistance, a fluororesin or polyimide and/or polyamide imide is preferable. In addition, from the viewpoint of adsorbing metal ions, a nylon such as 6-nylon or 6,6-nylon is more preferable.

The filtration device 105 may include a plurality of filters. In a case where the filtration device 105 includes a plurality of filters, another filter is not particularly limited and is preferably a filter having a critical particle diameter of 50 nm or more (for example, a microfilter membrane for removing fine particles having a pore size of 50 nm or more). In a case where fine particles are present in a material to be purified in addition to the colloidal impurities, in particular, including metal atoms such as iron or aluminum, the material to be purified is filtered using a filter having a critical particle diameter of 50 nm or more (for example, a microfilter membrane for removing fine particles having a pore size of 50 nm or more) before being filtered using a filter having a critical particle diameter of 20 nm or less (for example, a microfilter membrane for removing fine particles having a pore size of 20 nm or less). As a result, the filtration efficiency of the filter having a critical particle diameter of 20 nm or less (for example, a microfilter membrane for removing fine particles having a pore size of 20 nm or less) is improved, and the performance of removing particles is further improved.

Metal Ion Adsorption Filter

It is preferable that the filtration device 105 includes the metal ion adsorption filter. The metal ion adsorption filter is not particularly limited and, for example, a well-known metal ion adsorption filter can be used.

In particular, an ion exchangeable filter is preferable as the metal ion adsorption filter. Here, metal ions as an adsorption target are not particularly limited. From the viewpoint of causing defects of a semiconductor device to occur, metal ions including one selected from Fe, Cr, Ni, and Pb are preferable, and ions of metals including each of Fe, Cr, Ni, and Pb are more preferable.

From the viewpoint of improving the adsorption performance of the metal ions, it is preferable that the metal ion adsorption filter has an acid group on the surface. Examples of the acid group include a sulfo group and a carboxy group.

Examples of a substrate (material) forming the metal ion adsorption filter include cellulose, diatom earth, nylon, polyethylene, polypropylene, polystyrene, and a fluororesin. From the viewpoint of improving the adsorption efficiency of the metal ions, nylon is more preferable.

In addition, the metal ion adsorption filter may be formed of a material including polyimide and/or polyamide imide. Examples of the metal ion adsorption filter include polyimide and/or polyamide imide porous membrane described in JP2016-155121A.

The Polyimide and/or polyamide imide porous membrane may have at least one selected from the group consisting of a carboxy group, a salt type carboxy group, and an —NH— bond. In a case where the metal ion adsorption filter is formed of a fluororesin, polyimide, and/or polyamide imide, higher solvent resistance can be obtained.

Organic Impurity Adsorption Filter

The filtration device 105 may further include an organic impurity adsorption filter. The organic impurity adsorption filter is not particularly limited and, for example, a well-known organic impurity adsorption filter can be used.

In particular, from the viewpoint of improving the adsorption performance organic impurities, it is preferable that the organic impurity adsorption filter has an organic skeleton that is interactive with organic impurities on the surface (in other words, the surface is modified with an organic skeleton that is interactive with organic impurities). Examples of the organic skeleton that is interactive with organic impurities include a chemical structure that reacts with organic impurities such that the organic impurities can be trapped in the organic impurity adsorption filter. More specifically, in a case where an n-long chain alkyl alcohol (for example, a structural isomer in a case where 1-long chain alkyl alcohol is used as the organic solvent) is included as an organic impurity, examples of the organic skeleton include an alkyl group. In addition, in a case where a dibutyl hydroxy toluene (BHT) is included as an organic impurity, examples of the organic skeleton include a phenyl group.

Examples of a substrate (material) forming the organic impurity adsorption filter include cellulose on which activated carbon is supported, diatom earth, nylon, polyethylene, polypropylene, polystyrene, and a fluororesin.

In addition, as the organic impurity adsorption filter, a filter in which activated carbon adheres to non-woven fabric described in JP2002-273123A and JP2013-150979A can also be used.

The organic impurity adsorption filter is also applicable to a physical adsorption method as well as the above-described chemical adsorption (adsorption using the organic impurity adsorption filter having an organic skeleton that is interactive with organic impurities on the surface).

For example, in a case where BHT is included in as an organic impurity, the structure of BHT is larger than 10 ongstrom (=1 nm). Therefore, by using an organic impurity adsorption filter having a pore size of 1 nm, BHT cannot pass through the pore of the filter. That is, BHT is physically trapped in the filter, and thus is removed from the material to be purified. This way, the organic impurities can also be removed by using the physical removal method as well as the chemical interaction. However, in this case, a filter having a pore size of 3 nm or more is used as the "particle removal filter", and a filter having a pore size of less than 3 nm is used as the organic impurity adsorption filter.

As described above, a combination of different filters may be used. At this time, the filtering using a first filter may be performed once, or twice or more. In a case where filtering is performed two or more times using different filters in combination, the filters may be the same as or different from each other but are preferably different from each other. Typically, it is preferable that a first filter and a second filter are different from each other in at least one of a pore size or a forming material.

It is preferable that the pore size of the filter used for the second or subsequent filtering is equal to or less than that of the filter used for the first filtering. In addition, a combination of first filters having different pore sizes in the above-described range may be used. Here, the pore size of the filter can refer to a nominal value of a manufacturer of the filter. A commercially available filter can be selected from various filters manufactured by Pall Corporation, Toyo Roshi Kaisha, Ltd., Entegris Japan Co., Ltd. (former Mykrolis Corporation), or Kits Microfilter Corporation. In addition, "P-Nylon Filter (formed of polyamide, pore size: 0.02 µm, critical surface tension: 77 mN/m)" (manufactured by Pall Corporation), "PE Clean Filter (formed of high-density polyethylene, pore size: 0.02 µm)" (manufactured by Pall Corporation), or "PE Clean Filter (formed of high-density polyethylene, pore size: 0.01 µm)" (manufactured by Pall Corporation) can also be used.

The method of manufacturing the treatment liquid according to the embodiment of the present invention may include a step of cleaning the manufacturing device using the cleaning liquid. In this method, the cleaning liquid is supplied from the supply port 102 of the tank 101. The supply amount of the cleaning liquid is not particularly limited and is preferably adjusted such that the liquid contact portion of the tank 101 can be sufficiently cleaned. The volume of the cleaning liquid supplied is preferably 30 vol % or higher with respect to the volume of the tank 101. In a case where the cleaning liquid is supplied from the supply port 102, the valve 103 may be closed or opened. However, from the viewpoint of more easily cleaning the tank 101, in a case where the cleaning liquid is supplied from the supply port 102, it is preferable that the valve 103 is closed.

The cleaning liquid supplied to the tank 101 may be transferred immediately into the manufacturing device, or may be transferred into the manufacturing device (for example, through the supply pipe 109) after cleaning the inside of the tank 101. A method of cleaning the inside of the tank 101 using the cleaning liquid is not particularly limited, and examples thereof include a method of cleaning the inside of the tank 101 by rotating stirring blades (not shown) included in the tank 101. The time during which the tank is cleaned using the cleaning liquid is not particularly limited and may be appropriately selected according to the material of the liquid contact portion of the tank 101, the kind of the treatment liquid to be manufactured, the possibility of contamination, and the like. In general, the time is preferably about 0.1 seconds to 48 hours. In a case where only the tank 101 is cleaned, the cleaning liquid after cleaning may be discharged from, for example, a discharge port (not shown) provided in the tank bottom portion.

A method of cleaning the supply pipe 109 and the like of the manufacturing device 100 using the cleaning liquid is not particularly limited, and a method (hereinafter, also referred to as "circulation cleaning") of circulating the cleaning liquid in the manufacturing device through the supply pipe 109 and the circulation pipe 110 by operating the pump 104 in a state where the valve 103 and the valve 106 are opened and the valve 107 is closed is preferable. With the above-described method, while transferring the cleaning liquid, foreign matters and the like attached to the liquid contact portions of the tank 101, the filtration device 105, the supply pipe 109, and the like can be efficiently dispersed and/or can be efficiently dissolved using the cleaning liquid.

In particular, in a case where the manufacturing device includes the filtration device, the circulation cleaning is more preferable as the cleaning method. An example of the circulation cleaning will be described using FIG. 2. First, the cleaning liquid supplied from the tank 101 into the manufacturing device through the valve 103 returns (circulates) to the tank 101 again through the supply pipe 109 (through the filtration device 105, the circulation pipe 110, and the valve 106). At this time, the cleaning liquid is filtered through the filtration device 105 such that particles and the like dissolved and dispersed in the cleaning liquid are removed and the cleaning effect can be further improved.

In another aspect of the cleaning method, for example, another method may be used, the method including: causing the cleaning liquid supplied from the supply port 102 of the tank 101 into the manufacturing device to flow into the filtration device 105 through the valve 103 and the pump 104 by operating the pump 104 in a state where the valve 103 and the valve 107 are opened and the valve 106 is closed; and discharging the cleaning liquid to the outside of the manufacturing device through the valve 107 without being circulated (in this specification, hereinafter, this method will also be referred to as "batch cleaning"). In this case, as described above, the cleaning liquid may be supplied intermittently into the manufacturing device in a predetermined amount, or may be supplied continuously into the manufacturing device.

(Cleaning Liquid)

The cleaning liquid used for performing cleaning in advance as described above is not particularly limited, and a well-known cleaning liquid can be used.

Examples of the cleaning liquid include water, alkylene glycol monoalkyl ether carboxylate, alkylene glycol monoalkyl ether, alkyl lactate, alkyl alkoxy propionate, a cyclic lactone (preferably having 4 to 10 carbon atoms), a monoketone compound (preferably having 4 to 10 carbon atoms) which may include a ring, alkylene carbonate, alkyl alkoxy acetate, and alkyl pyruvate.

In addition, as the cleaning liquid, for example, cleaning liquids described in JP2016-57614A, JP2014-219664A, JP2016-138219A, and JP2015-135379A may be used.

It is preferable that the cleaning liquid includes at least one selected from the group consisting of propylene glycol monomethyl ether (PGME), cyclopentanone (CyPe), butyl acetate (nBA), propylene glycol monomethyl ether acetate (PGMEA), cyclohexanone (CyHx), ethyl lactate (EL), methyl 2-hydroxyisobutyrate (HBM), cyclopentanone dimethylacetal (DBCPN), γ-butyrolactone (GBL), dimethyl sulfoxide (DMSO), ethylene carbonate (EC), propylene carbonate (PC), 1-methyl-2-pyrrolidone (NMP), isoamyl acetate (iAA), isopropanol (IPA), methyl ethyl ketone (MEK), and 4-methyl-2-pentanol (MIBC) is preferable, it is more preferable the cleaning liquid includes at least one selected from the group consisting of PGMEA, NMP, PGME, nBA, PC, CyHx, GBL, MIBC, EL, DMSO, iAA, MEK, PC, and CyPe, and it is still more preferable the cleaning liquid is formed of at least one selected from the group consisting of PGMEA, NMP, PGME, nBA, PC, CyHx, GBL, MIBC, EL, DMSO, iAA, MEK, PC, and CyPe.

As the cleaning liquid, one kind may be used alone, or two or more kinds may be used in combination.

Examples of the cleaning liquid other than the above-described examples include an alcohol such as methanol, ethanol, propanol, butanol, methoxyethanol, butoxyethanol, methoxypropanol, or ethoxypropanol; a ketone such as acetone or methyl ethyl ketone, an ether such as tetrahydrofuran, dioxane, ethylene glycol dimethyl ether, or diethylene glycol dimethyl ether; an ester such as ethyl acetate or ethyl cellosolve acetate; an aromatic compound such as benzene, toluene, or xylene; and a chlorinated hydrocarbon such as dichloromethane, dichloroethane, dichloroethylene, or trichloroethylene.

[Use of Treatment Liquid]

The treatment liquid according to the present invention is preferably used for manufacturing a semiconductor. Specifically, in manufacturing steps of a semiconductor device including a lithography step, an etching step, an ion implantation step, and a peeling step, the treatment liquid is used for treating an organic matter after the end of each step or before the start of the next step, and specifically is suitably used as a pre-wet liquid, a developer, a rinsing liquid, a peeling liquid, or the like. For example, the treatment liquid can also be used for rinsing an edge line of a semiconductor substrate before and after resist application.

In addition, the treatment liquid can also be used as a dilute solution of a resin included in a resist solution (described below). That is, the treatment liquid can also be used as the solvent included in the actinic ray-sensitive or radiation-sensitive composition.

In addition, the treatment liquid can also be suitably used for other applications other than the manufacturing of a semiconductor, and can be used, for example, as a developer such as polyimide, a resist for a sensor, or a resist for a lens, or a rinsing liquid.

In addition, the treatment liquid can also be used for medical applications or as a solvent for cleaning. In particular, the treatment liquid can be suitably used for cleaning a container, a pipe, a substrate (for example, a wafer or glass), or the like.

<Pattern Forming Method>

The pattern forming method according to the present invention includes: a resist film forming step of applying an actinic ray-sensitive or radiation-sensitive composition (hereinafter, also referred to as "resist composition") to a substrate to form an actinic ray-sensitive or radiation-sensitive film (hereinafter, also referred to as "resist film"); an exposure step of exposing the resist film; and a treatment step of treating the substrate to which the resist composition is applied or the exposed resist film using the above-described treatment liquid.

Hereinafter, each of the steps included in the pattern forming method according to the present invention will be described. In addition, as an example of the treatment step using the treatment liquid according to the present invention, each of a pre-wet step, a development step, and a rinsing step will be described.

<Pre-Wet Step>

In order to improve coating properties, the pattern forming method according to the present invention may include a pre-wet step of applying a pre-wet liquid to the substrate in advance before the step of forming the resist film using the actinic ray-sensitive or radiation-sensitive composition. The pre-wet step is described in JP2014-220301A, the content of which is incorporated herein by reference.

<Resist Film Forming Step>

The resist film forming step is a step of forming a resist film using an actinic ray-sensitive or radiation-sensitive composition and, for example, can be performed using the following method.

In order to form the resist film (actinic ray-sensitive or radiation-sensitive composition film) on the substrate using the actinic ray-sensitive or radiation-sensitive composition, respective components described below are dissolved in a solvent to prepare an actinic ray-sensitive or radiation-sensitive composition, the actinic ray-sensitive or radiation-sensitive composition is optionally filtered through a filter and applied to the substrate. As the filter, a filter formed of polytetrafluoroethylene, polyethylene, or nylon and having a pore size of preferably 0.1 µm or less, more preferably 0.05 µm or less, and still more preferably 0.03 µm or less is preferable.

The actinic ray-sensitive or radiation-sensitive composition is applied to the substrate (for example, silicon or a silicon dioxide coating), which is used for manufacturing an integrated circuit element, using an appropriate coating method such as a method using a spinner. Next, the actinic ray-sensitive or radiation-sensitive composition is dried to form a resist film. Optionally, various underlayer films (an inorganic film, an organic film, or an antireflection film) may be formed below the resist film.

As the drying method, a method of drying heating the composition is generally used. Heating may be performed using means provided in a typical exposure or developing device, and may be performed using a hot plate or the like.

The heating temperature is preferably 80° C. to 180° C., more preferably 80° C. to 150° C., still more preferably 80° C. to 140° C., and even still more preferably 80° C. to 130° C. The heating time is preferably 30 to 1000 seconds, more preferably 60 to 800 seconds, and still more preferably 60 to 600 seconds.

The thickness of the resist film is generally 200 nm or less and preferably 100 nm or less.

For example, in order to resolve a 1:1 line-and-space pattern having a size of 30 nm or less, the thickness of a resist film to be formed is preferably 50 nm or less. In a case where a resist film having a thickness of 50 nm or less is applied to a development step described below, pattern collapse is not likely to occur, and higher resolution performance can be obtained.

The thickness is more preferably in a range of 15 nm to 45 nm. In a case where the thickness is 15 nm or more, sufficient etching resistance can be obtained. The thickness is still more preferably is in a range of 15 nm to 40 nm. In a case where the thickness is in the above-described range, etching resistance and higher resolution performance can be simultaneously satisfied.

In the pattern forming method according to the present invention, an upper layer film (top coat film) may be formed over the resist film. The upper layer film can be formed using, for example, an upper layer film-forming composition including a hydrophobic resin, an acid generator, and a basic compound. The upper layer film and the upper layer film-forming composition will be described below.

<Exposure Step>

The exposure step is a step of exposing the resist film and, for example, can be performed using the following method.

The resist film formed as described above is irradiated with an actinic ray or radiation through a predetermined mask. For irradiation of an electron beam, drawing (direct drawing) not using a mask is generally used.

The actinic ray or radiation is not particularly limited, and examples thereof include KrF excimer laser light, ArF excimer laser light, extreme ultraviolet (EUV) light, and an electron beam (EB). The exposure may be immersion exposure.

<Baking>

In the pattern forming method according to the present invention, it is preferable that baking (heating) is performed before development after exposure. Due to the baking, a reaction of an exposed portion is promoted, and sensitivity and a pattern shape are further improved.

The heating temperature is preferably 80° C. to 150° C., more preferably 80° C. to 140° C., and still more preferably 80° C. to 130° C.

The heating time is preferably 30 to 1000 seconds, more preferably 60 to 800 seconds, and still more preferably 60 to 600 seconds.

Heating may be performed using means provided in a typical exposure or developing device, and may be performed using a hot plate or the like.

<Development Step>

The development step is a step of developing the exposed resist film with the developer. Examples of the developing method include: a method (dipping method) of dipping the substrate in a container filled with the developer for a given period of time; a method (puddle method) of causing the developer to accumulate on a surface of the substrate with a surface tension and maintaining this state for a given period of time for development; a method (spraying method) of spraying the developer to a surface of the substrate; and a method (dynamic dispense method) of continuously jetting the developer to the substrate, which is rotating at a given speed, while scanning a developer jetting nozzle on the substrate at a given speed.

In addition, a step of stopping development while replacing the solvent with another solvent may be performed after the development step.

The developing time is not particularly limited as long as it is a period of time where a non-exposed portion of a resin is sufficiently dissolved. The development time is typically 10 to 300 seconds and preferably 20 to 120 seconds.

The temperature of the developer is preferably 0° C. to 50° C. and more preferably 15° C. to 35° C.

As the developer used in the development step, the above-described treatment liquid is preferably used. The developer is as described above. In addition to the development using the treatment liquid, development using an alkali developer may be further performed (so-called double development).

<Rinsing Step>

The rinsing step is a step of performing rinsing with the rinsing liquid after the development step.

In the rinsing step, a developed wafer is rinsed with the above-described rinsing liquid.

A rinsing method is not particularly limited, and examples thereof include: a method (rotation jetting method) of continuously jetting the rinsing liquid to the substrate which is rotating at a given speed; a method (dipping method) of dipping the substrate in a container filled with the rinsing liquid for a given period of time; and a method (spraying method) of spraying the rinsing liquid to a surface of the substrate. In particular, it is preferable that the rinsing step is performed using the rotation jetting method such that the rinsed substrate is rotated at a rotation speed of 2000 rpm to 4000 rpm to remove the rinsing liquid from the substrate.

The rinsing time is not particularly limited and is typically 10 seconds to 300 seconds. The rising time is preferably 10 seconds to 180 seconds and most preferably 20 seconds to 120 seconds.

The temperature of the rinsing liquid is preferably 0° C. to 50° C. and more preferably 15° C. to 35° C.

In addition, after the development or the rising, a treatment of removing the developer or the rinsing liquid, which is attached to the pattern, with supercritical fluid may be performed.

Further, after the development, the rinsing, or the treatment using the supercritical fluid, heating may be performed to remove the solvent remaining in the pattern. The heating temperature is not particularly limited as long as an excellent resist pattern can be obtained, and is typically 40° C. to 160° C. The heating temperature is preferably 50° C. to 150° C. and most preferably 50° C. to 110° C. The heating time is not particularly limited as long as an excellent resist pattern can be obtained, and is typically 15 to 300 seconds and preferably 15 to 180 seconds.

As the rinsing liquid, the above-described treatment liquid is preferably used. The description of the rinsing liquid is as described above.

In the pattern forming method according to the present invention, it is preferable that at least one of a developer or a rinsing liquid is the above-described treatment liquid.

<Actinic Ray-Sensitive or Radiation-Sensitive Composition (Resist Composition)>

Next, the actinic ray-sensitive or radiation-sensitive composition which is preferably used in combination with the treatment liquid according to the present invention will be described in detail.

(A) Resin

It is preferable that a resin (A) is included as the actinic ray-sensitive or radiation-sensitive composition which is preferably used in combination with the treatment liquid according to the present invention. The resin (A) includes at least (i) a repeating unit having a group which is decomposed by the action of an acid to produce a carboxyl group (may further include a repeating unit having a phenolic hydroxyl group), or includes may at least (ii) a repeating unit having a phenolic hydroxyl group.

In a case where the resin (A) includes the repeating unit having a group which is decomposed by the action of an acid to produce a carboxyl group, the solubility in an alkali developer increases and the solubility in the organic solvent increases due to the action of an acid.

Examples of the repeating unit having a phenolic hydroxyl group included in the resin (A) include a repeating unit represented by the following Formula (I).

In the formula, $R_{41}$, $R_{42}$, and $R_{43}$ each independently represent a hydrogen atom, an alkyl group, a halogen atom, a cyano group, or an alkoxycarbonyl group. $R_{42}$ may be bonded to $Ar_4$ to form a ring. In this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents a (n+1)-valent aromatic ring group, and in a case where $Ar_4$ is bonded to $R_{42}$ to form a ring, $Ar_4$ represents a (n+2)-valent aromatic ring group.

n represents an integer of 1 to 5.

As the alkyl group represented by $R_{41}$, $R_{42}$, and $R_{43}$ in Formula (I), an alkyl group having 20 or less carbon atoms which may have a substituent such as a methyl group, an ethyl group, a propyl group, an isopropyl group, a n-butyl group, a sec-butyl group, a hexyl group, a 2-ethylhexyl group, an octyl group, or a dodecyl group is preferable, an alkyl group having 8 or less carbon atoms is more preferable, and an alkyl group having 3 or less carbon atoms is still more preferable.

In Formula (I), the cycloalkyl group represented by $R_{41}$, $R_{42}$, and $R_{43}$ may be monocyclic or polycyclic. In particular, a monocycloalkyl group having 3 to 8 carbon atoms which may have a substituent such as a cyclopropyl group, a cyclopentyl group, or a cyclohexyl group is preferable.

Examples of the halogen atom represented by $R_{41}$, $R_{42}$, and $R_{43}$ in Formula (I) include a fluorine atom, a chlorine atom, a bromine atom, and an iodine atom. In particular, a fluorine atom is preferable.

As the alkyl group included in the alkoxycarbonyl group represented by $R_{41}$, $R_{42}$, and $R_{43}$ in Formula (I), the same alkyl groups as described above regarding $R_{41}$, $R_{42}$, and $R_{43}$ are preferable.

Preferable examples of a substituent of each of the groups include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituent is preferably 8 or less.

$Ar_4$ represents an (n+1)-valent aromatic ring group. In a case where n represents 1, a divalent aromatic ring group may have a substituent, and preferable examples thereof include an arylene group having 6 to 18 carbon atoms such as a phenylene group, a tolylene group, a naphthylene group, or an anthracenylene group; and an aromatic ring group having a heterocycle such as thiophene, furan, pyrrole, benzothiophene, benzofuran, benzopyrrole, triazine, imidazole, benzoimidazole, triazole, thiadiazole, or thiazole.

In a case where n represents an integer of 2 or more, preferable specific examples of the (n+1)-valent aromatic ring group include groups obtained by removing arbitrary (n-1) hydrogen atoms from the specific examples of the above-described divalent aromatic ring groups.

The (n+1)-valent aromatic ring group may further have a substituent.

Examples of a substituent which may be included in the alkyl group, the cycloalkyl group, the alkoxycarbonyl group, the alkylene group, and the (n+1)-valent aromatic ring group include: the alkoxy groups represented by $R_{41}$, $R_{42}$, and $R_{43}$ in Formula (I), such as an alkyl group, a methoxy group, an ethoxy group, a hydroxyethoxy group, a propoxy group, a hydroxypropoxy group, or a butoxy group; and an aryl group such as a phenyl group.

As an alkyl group represented by $R_{64}$ in —CONR$_{64}$— ($R_{64}$ represents a hydrogen atom or an alkyl group) represented by $X_4$, an alkyl group having 20 or less carbon atoms which may have a substituent such as a methyl group, an ethyl group, a propyl group, an isopropyl group, a n-butyl group, a sec-butyl group, a hexyl group, a 2-ethylhexyl group, an octyl group, or a dodecyl group is preferable, and an alkyl group having 8 or less carbon atoms is more preferable.

As $X_4$, a single bond, —COO—, or —CONH— is preferable, and a single bond or —COO— is more preferable.

Preferable examples of the alkylene group represented by $L_4$ include an alkylene group having 1 to 8 carbon atoms which may have a substituent such as a methylene group, an ethylene group, a propylene group, a butylene group, a hexylene group, or an octylene group.

As $Ar_4$, an aromatic ring group having 6 to 18 carbon atoms which may have a substituent is more preferable, and a benzene ring group, a naphthalene ring group, or a biphenylene ring group is still more preferable.

It is preferable that the repeating unit represented by Formula (I) includes a hydroxystyrene structure. That is, it is preferable that $Ar_4$ represents a benzene ring group.

Preferable examples of the repeating unit having a phenolic hydroxyl group included in the resin (A) include a repeating unit represented by the following Formula (p1).

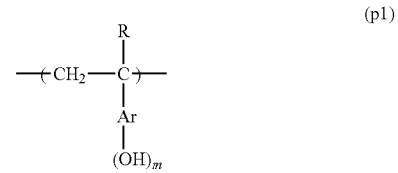

In Formula (p1), R represents a hydrogen atom or a linear or branched alkyl group having a halogen atom or 1 to 4 carbon atoms. A plurality of R's may be the same as or different from each other. As R in Formula (p1), a hydrogen atom is preferable.

Ar in Formula (p1) represents an aromatic ring, and examples thereof include: an aromatic hydrocarbon ring having 6 to 18 carbon atoms which may have a substituent such as a benzene ring, a naphthalene ring, an anthracene ring, a fluorene ring, or a phenanthrene ring; and an aromatic heterocycle having a heterocycle such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, or a thiazole ring. Among these, a benzene ring is most preferable.

In Formula (p1), m represents an integer of 1 to 5 and preferably 1.

Hereinafter, specific examples of the repeating unit having a phenolic hydroxyl group included in the resin (A) will be shown, but the present invention is not limited thereto. In the formulae, a represents 1 or 2.

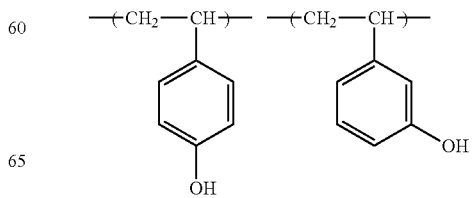

-continued
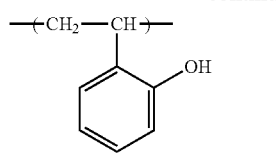
(B-1)
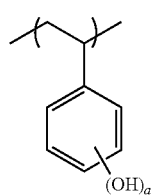
(B-2)
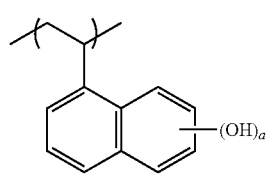
(B-3)
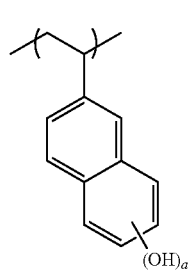
(B-4)
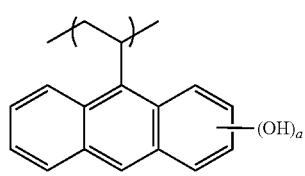
(B-5)
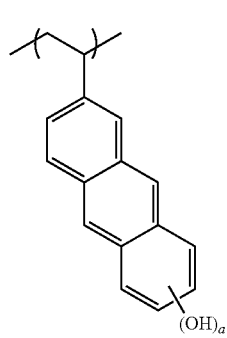
(B-6)
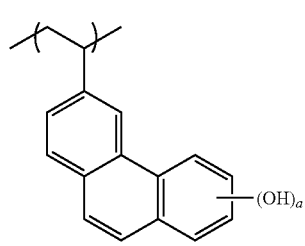
-continued
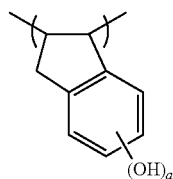
(B-7)
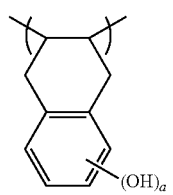
(B-8)
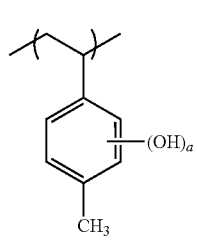
(B-9)
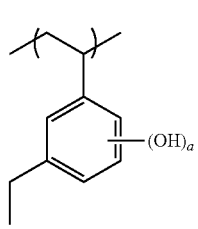
(B-10)
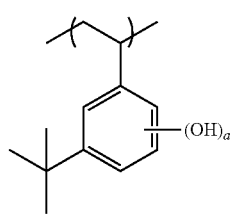
(B-11)
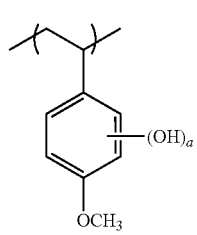
(B-12)
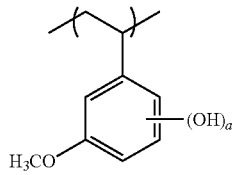
(B-13)

(B-14) 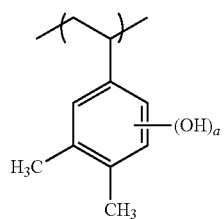
(B-15) 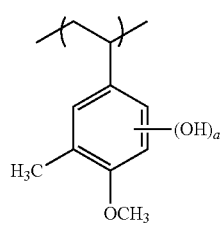
(B-16) 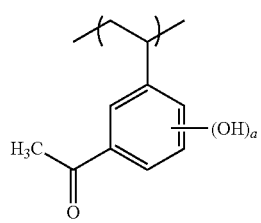
(B-17) 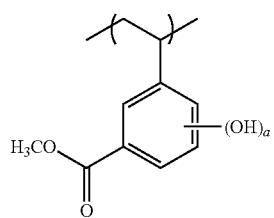
(B-18) 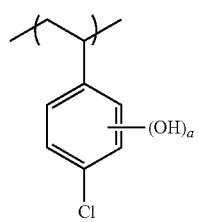
(B-19) 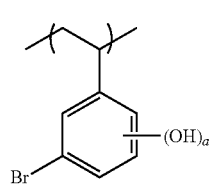
(B-20) 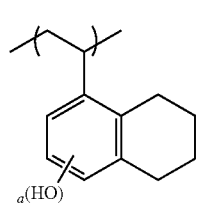
(B-21) 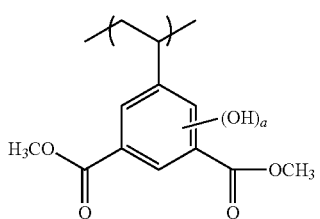
(B-22) 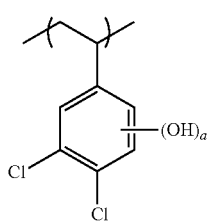
(B-23) 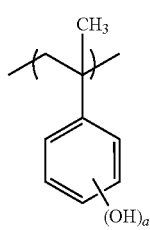
(B-24) 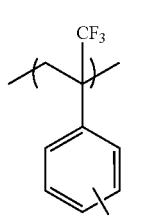
(B-25) 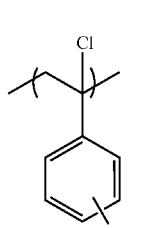
(B-26) 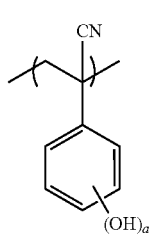
(B-27) 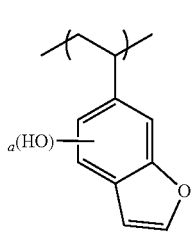

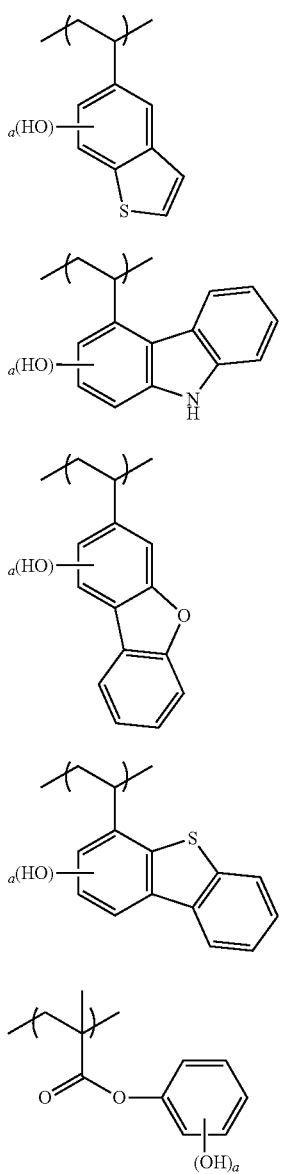
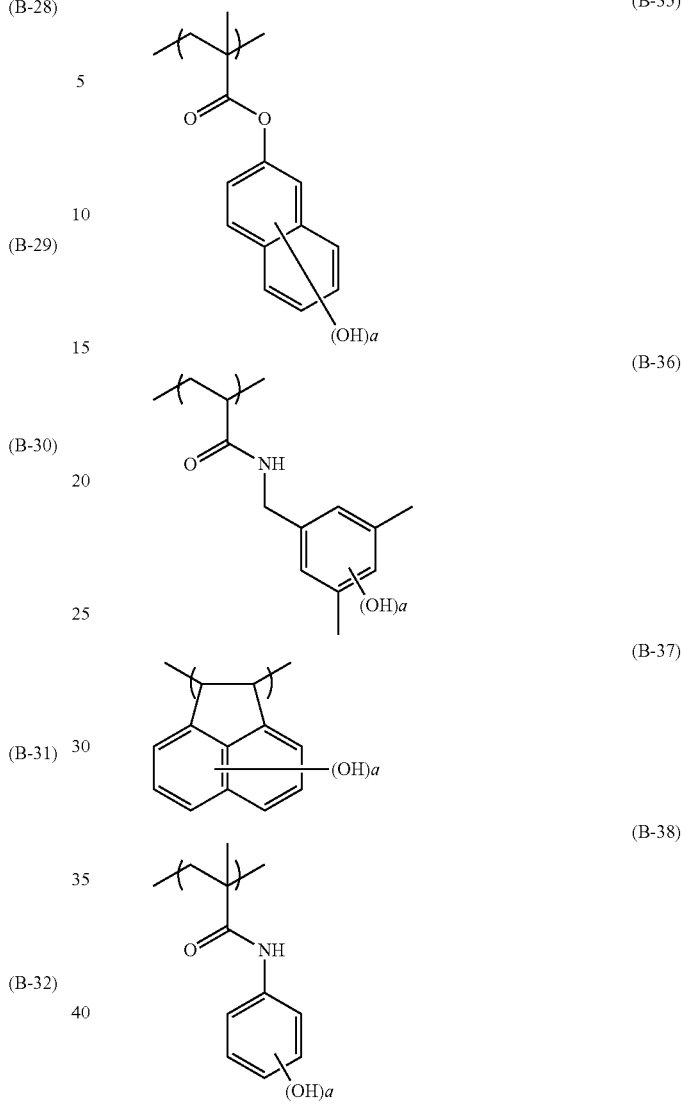

The content of the repeating unit having a phenolic hydroxyl group is preferably 0 to 50 mol %, more preferably 0 to 45 mol %, and still more preferably 0 to 40 mol % with respect to all the repeating units of the resin (A).

The repeating unit having a group which is decomposed by the action of an acid to produce a carboxyl group included in the resin (A) is a repeating unit having a group which is substituted with a group obtained by a hydrogen atom being removed from a carboxyl group due to decomposition caused by the action of an acid.

Examples of the group which is removed by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

As the repeating unit having a group which is decomposed by the action of an acid to produce a carboxyl group included in the resin (A), a repeating unit represented by the following Formula (AI) is preferable.

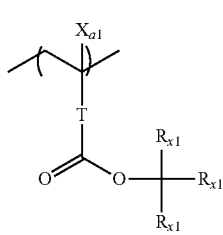

(AI)

In Formula (AI),

Xa$_1$ represents a hydrogen atom or an alkyl group which may have a substituent.

T represents a single bond or a divalent linking group.

Rx$_1$ to Rx$_3$ each independently represent an alkyl group (linear or branched) or a cycloalkyl group (monocyclic or polycyclic). In a case where all of Rx$_1$ to Rx$_3$ represent an alkyl group (linear or branched), it is preferable that at least two of Rx$_1$, R$_{x2}$, and R$_{x3}$ represent a methyl group.

Two of Rx$_1$ to Rx$_3$ may be bonded to each other to form a cycloalkyl group (monocyclic or polycyclic).

Examples of the alkyl group which may have a substituent represented by Xa$_1$ include a methyl group or a group represented by —CH$_2$—R$_{11}$. R$_{11}$ represents a halogen atom (for example, a fluorine atom), a hydroxyl group, or a monovalent organic group, and examples thereof include an alkyl group having 5 or less carbon atoms and an acyl group having 5 or less carbon atoms. In particular, an alkyl group having 3 or less carbon atoms is preferable, and a methyl group is more preferable. In one aspect, Xa$_1$ represents preferably a hydrogen atom, a methyl group, a trifluoromethyl group, or a hydroxymethyl group.

Examples of the divalent linking group represented by T include an alkylene group, a —COO-Rt- group, and a —O-Rt- group. In the formula, Rt represents an alkylene group or a cycloalkylene group.

T represents preferably a single bond or a —COO-Rt- group. Rt represents preferably an alkylene group having 1 to 5 carbon atoms and more preferably a —CH$_2$— group, a —(CH$_2$)$_2$— group, or a —(CH$_2$)$_3$— group.

As the alkyl group represented by Rx$_1$ to Rx$_3$, an alkyl group having 1 to 4 carbon atoms such as a methyl group, an ethyl group, a n-propyl group, an isopropyl group, a n-butyl group, an isobutyl group, or a t-butyl group is preferable.

As the cycloalkyl group represented by Rx$_1$ to Rx$_3$, a monocycloalkyl group such as a cyclopentyl group or a cyclohexyl group, or a polycycloalkyl group such as a norbornyl group, a tetracyclodecanyl group, a tetracyclododecanyl group, or an adamantyl group is preferable.

As the cycloalkyl group which is formed by two of Rx$_1$ to Rx$_3$ being bonded to each other, a monocycloalkyl group such as a cyclopentyl group or a cyclohexyl group, or a polycycloalkyl group such as a norbornyl group, a tetracyclodecanyl group, a tetracyclododecanyl group, or an adamantyl group is preferable. In particular, a monocycloalkyl group having 5 or 6 carbon atoms is preferable.

In the cycloalkyl group which is formed by two of Rx$_1$ to Rx$_3$ being bonded to each other, for example, one methylene group constituting the ring may be substituted with a heteroatom such as an oxygen atom or a group having a heteroatom such as a carbonyl group.

In the repeating unit represented by Formula (AI), for example, it is preferable that Rx$_1$ represents a methyl group or an ethyl group and that R$_{x2}$ and Rx$_3$ are bonded to each other to form the cycloalkyl group.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), in which the number of carbon atoms is preferably 8 or less.

As the repeating unit represented by Formula (AI), an acid-decomposable tertiary alkyl (meth)acrylate repeating unit (a repeating unit in which Xa$_1$ represents a hydrogen atom or a methyl group, and T represents a single bond) is preferable. A repeating unit in which Rx$_1$ to Rx$_3$ each independently represent a linear or branched alkyl group is more preferable, and a repeating unit in which Rx$_1$ to Rx$_3$ each independently represent a linear alkyl group is still more preferable.

Hereinafter, specific examples of the repeating unit having a group which is decomposed by the action of an acid to produce a carboxyl group included in the resin (A) will be shown, but the present invention is not limited thereto.

In the specific examples, Rx and Xa$_1$ represent a hydrogen atom, CH$_3$, CF$_3$, or CH$_2$OH. Rxa and Rxb each independently represent an alkyl group having 1 to 4 carbon atoms. Z represents a substituent having a polar group. In a case where a plurality of Z's are present, Z's each independently represent a substituent having a polar group. p represents 0 or a positive integer. Examples of the substituent having a polar group represented by Z include a linear or branched alkyl group having a hydroxyl group, a cyano group, an amino group, an alkylamido group, or a sulfonamide group, or a cycloalkyl group. In particular, an alkyl group having a hydroxyl group is preferable. As the branched alkyl group, an isopropyl group is preferable.

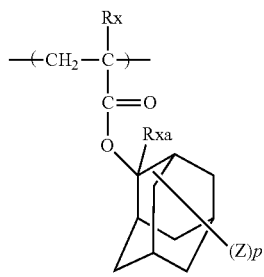

1

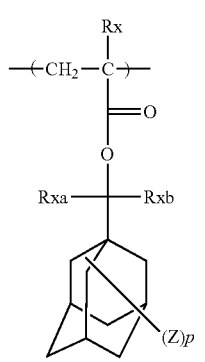

2

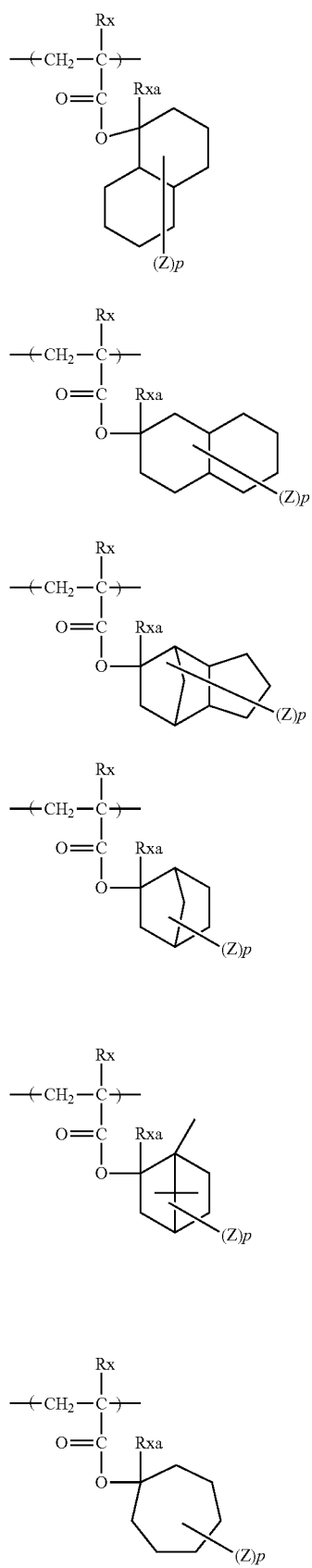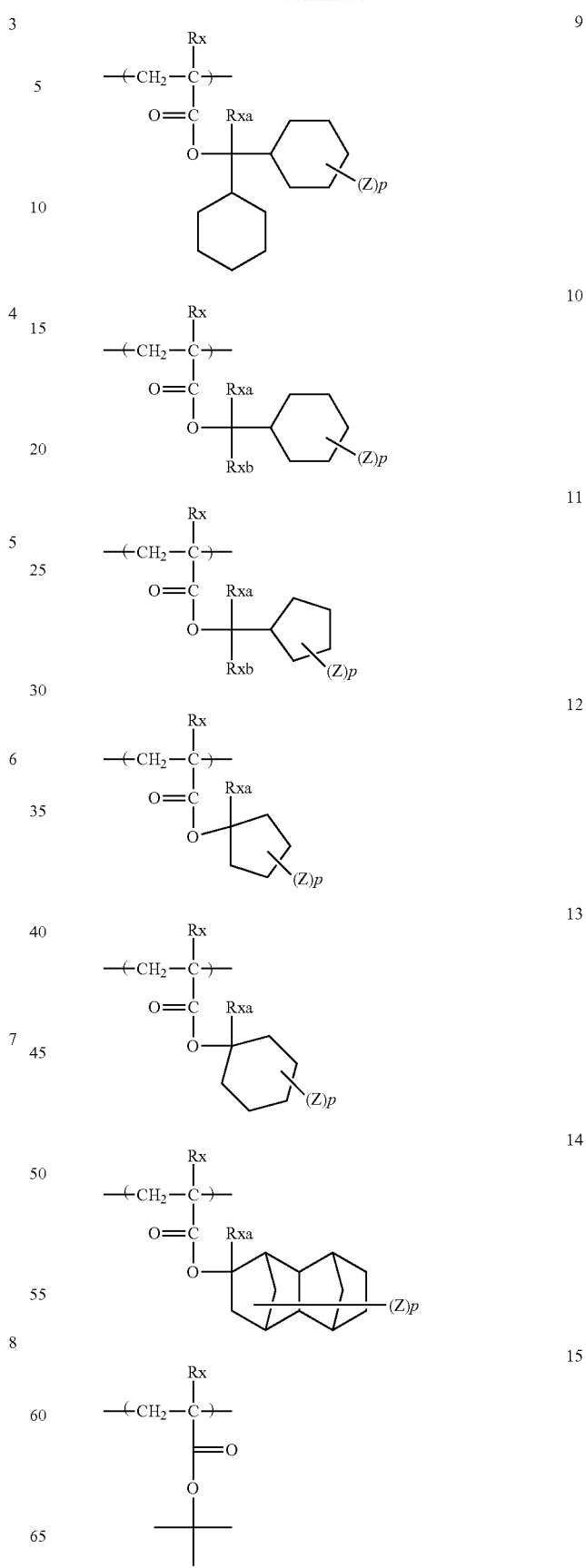

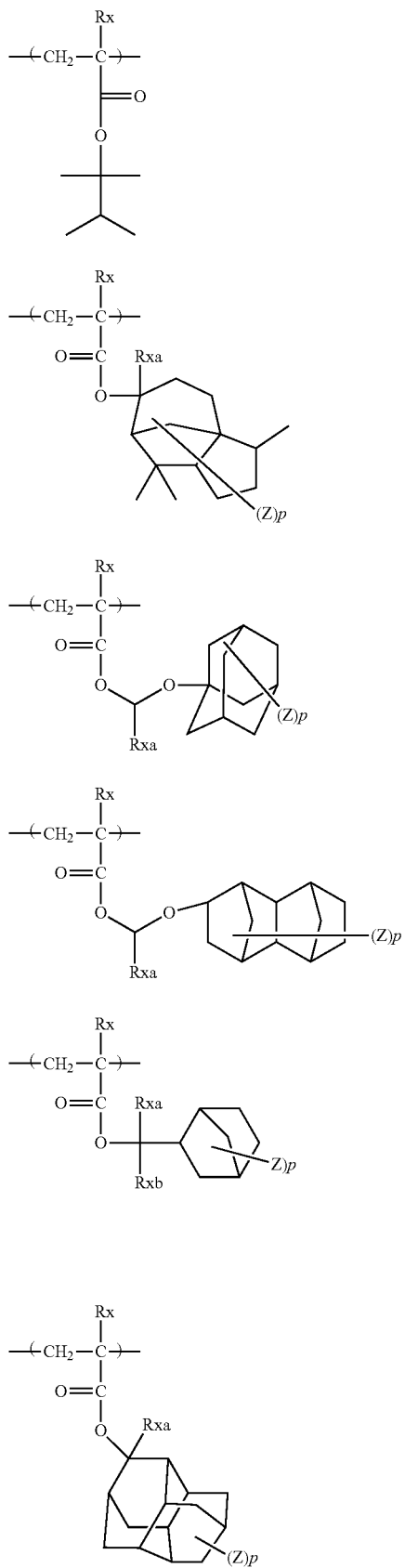

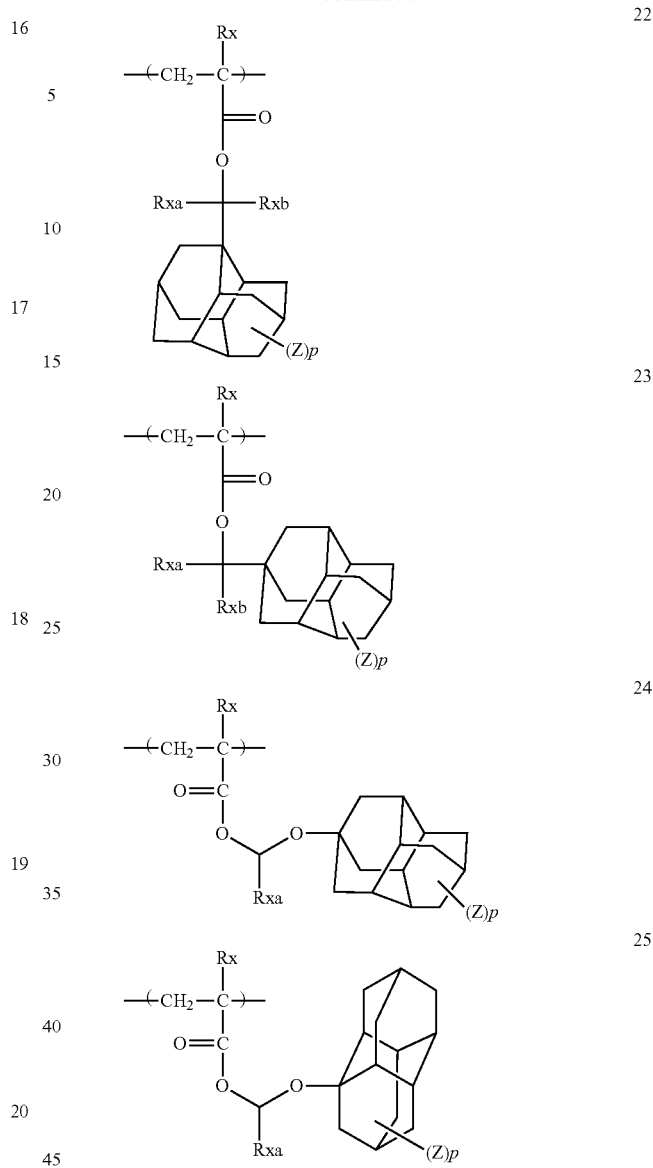

The content of the repeating unit having a group which is decomposed by the action of an acid to produce a carboxyl group is preferably 15 to 90 mol %, more preferably 20 to 90 mol %, still more preferably 25 to 80 mol %, and even still more preferably 30 to 70 mol % with respect to all the repeating units of the resin (A).

It is preferable that the resin (A) further includes a repeating unit having a lactone group.

As the lactone group, any group having a lactone structure can be used. In particular, a group having a 5- to 7-membered lactone structure is preferable. In this case, it is preferable that another ring structure may be fused to group having a 5- to 7-membered lactone structure to form a bicyclo structure or a spiro structure.

It is preferable that the resin (A) further includes a repeating unit which has a group having with a lactone structure represented by any one of the following Formulae (LC1-1) to (LC1-16). In addition, the group having a lactone structure may be directly bonded to a main chain. As the lactone structure, a group represented by Formula (LC1-1), (LC1-4), (LC1-5), (LC1-6), (LC1-13), or (LC1-14) is preferable.
LC1-1
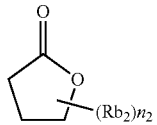
LC1-2
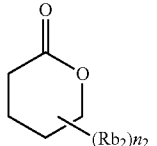
LC1-3
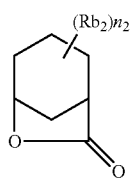
LC1-4
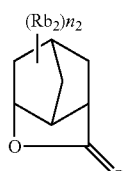
LC1-5
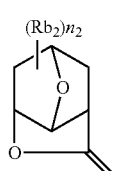
LC1-6
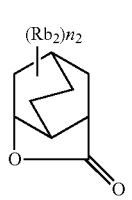
LC1-7
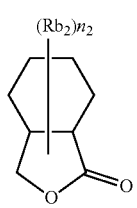
LC1-8
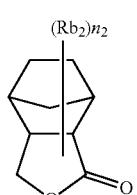
LC1-9
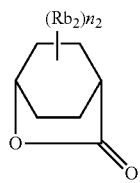
LC1-10
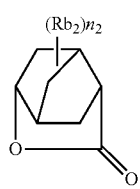
LC1-11
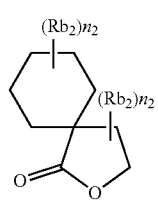
LC1-12
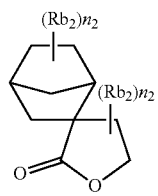
LC1-13
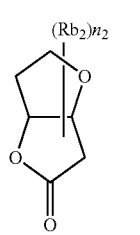
LC1-14
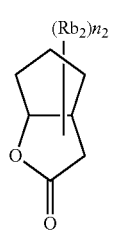
LC1-15
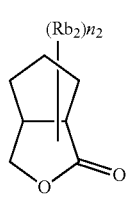
LC1-16
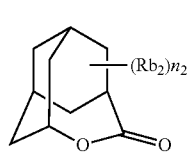
The lactone structure portion may or may not have a substituent ($Rb_2$). Preferable examples of the substituent (Rb$_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. n$_2$ represents an integer of 0 to 4. In a case where n$_2$ represents 2 or more, a plurality of Rb$_2$'s may be the same as or different from each other or may be bonded to each other to form a ring.

Examples of the repeating unit which has a group having a lactone structure represented by any one of Formulae (LC1-1) to (LC1-16) include a repeating unit represented by the following Formula (AII).

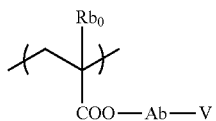
(AII)

In Formula (AII), Rb$_0$ represents a hydrogen atom, a halogen atom, or an alkyl group having 1 to 4 carbon atoms, and the alkyl group may have a substituent.

Preferable examples of a substituent which may be included in the alkyl group represented by Rb$_0$ include a hydroxyl group and a halogen atom.

Examples of the halogen atom represented by Rb$_0$ include a fluorine atom, a chlorine atom, a bromine atom, and an iodine atom. Rb$_0$ represents preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group including a combination thereof. In particular, a single bond or a linking group represented by -Ab$_1$-CO$_2$— is preferable. Ab$_1$ represents a linear or branched alkylene group or a monocyclic or polycyclic cycloalkylene group and preferably a methylene group, an ethylene group, a cyclohexylene group, an adamantylene group, or a norbornylene group.

V represents a group represented by any one of Formulae (LC1-1) to (LC1-16).

In the repeating unit which has a group having a lactone structure, an optical isomer is present, and any optical isomer may be used. In addition, one optical isomer may be used alone, or a mixture of a plurality of optical isomers may be used. In a case where one optical isomer is mainly used, the optical purity (ee) thereof is preferably 90 or higher and more preferably 95 or higher.

Hereinafter, specific examples of the repeating unit which has a group having a lactone structure will be shown, but the present invention is not limited thereto.
(In the formulae, Rx represents CH$_3$, CH$_2$OH, or CF$_3$)

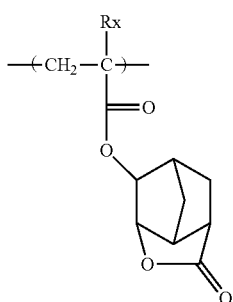
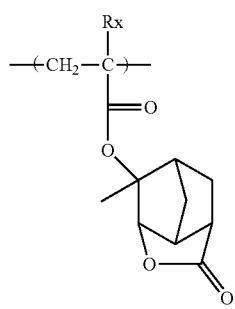

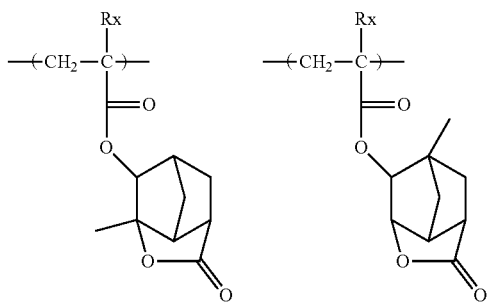
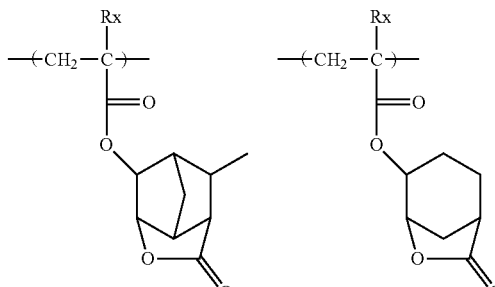
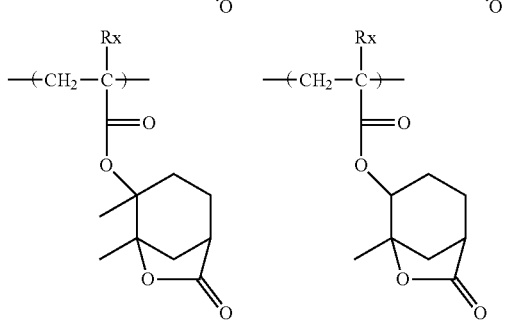
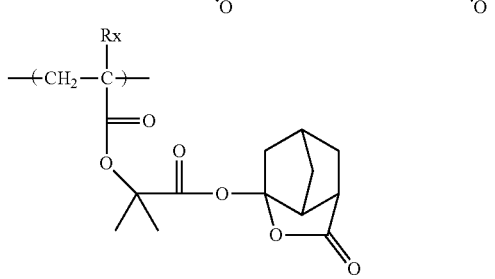
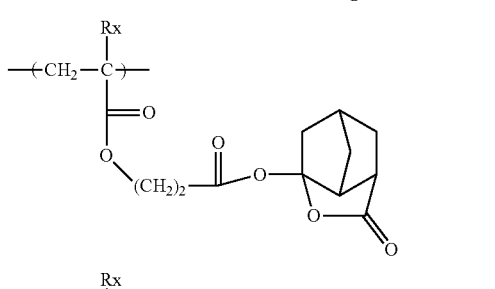
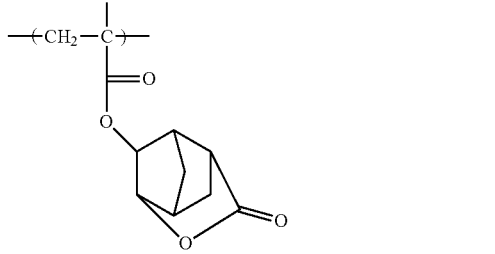

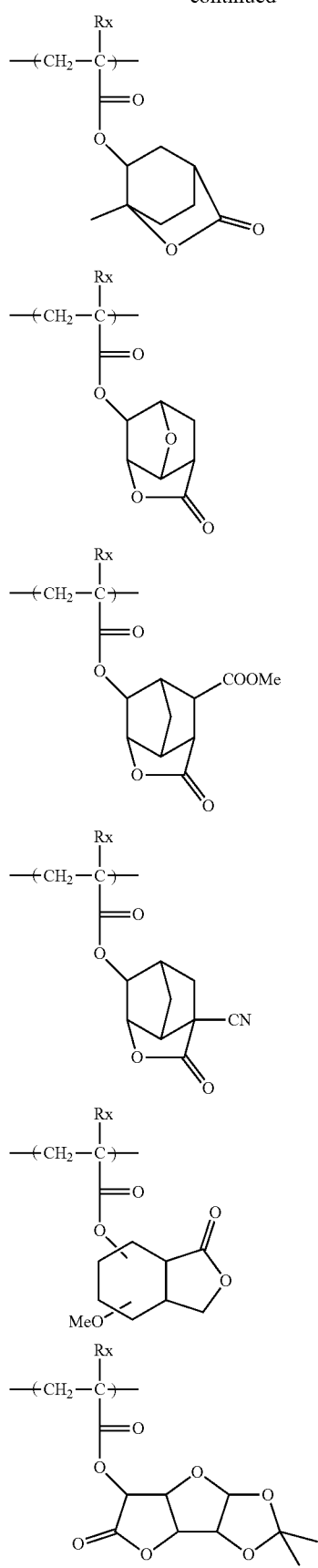
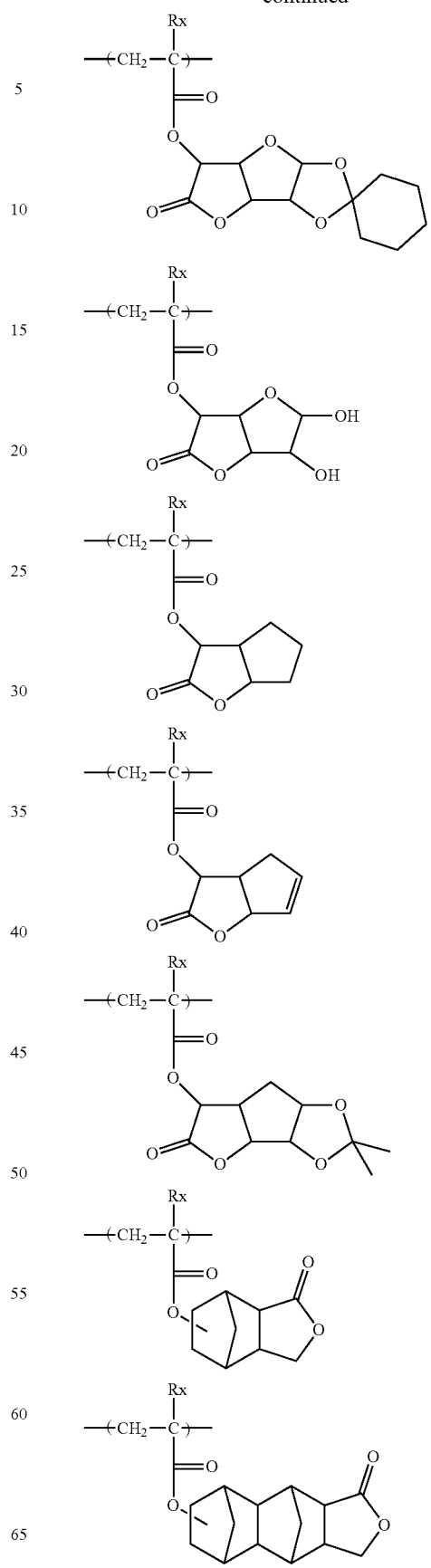

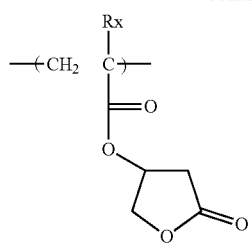

The content of the repeating unit having a lactone group is preferably 1 to 65 mol %, more preferably 1 to 30 mol %, more preferably 5 to 25 mol %, and still more preferably 5 to 20 mol %, with respect to all the repeating units of the resin (A).

The resin (A) may further include a repeating unit which has an organic group having a polar group, in particular, a repeating unit which has an alicyclic hydrocarbon structure substituted with a polar group.

As a result, substrate adhesiveness or developer affinity are improved. As the alicyclic hydrocarbon structure of the alicyclic hydrocarbon structure substituted with a polar group, an adamantyl group, a diamantyl group, or a norbornane group is preferable. As the polar group, a hydroxyl group or a cyano group is preferable.

Hereinafter, specific examples of the repeating unit having a polar group will be shown, but the present invention is not limited thereto.

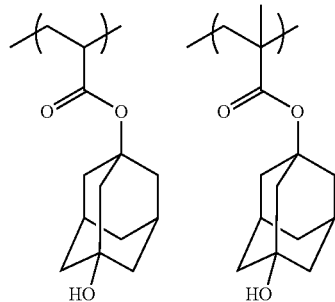

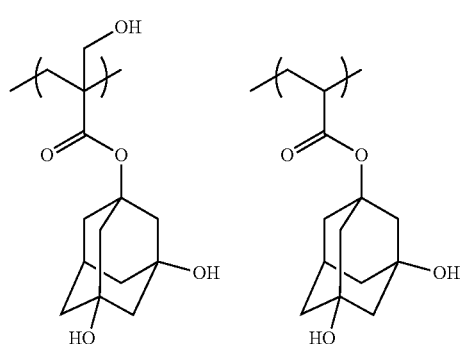

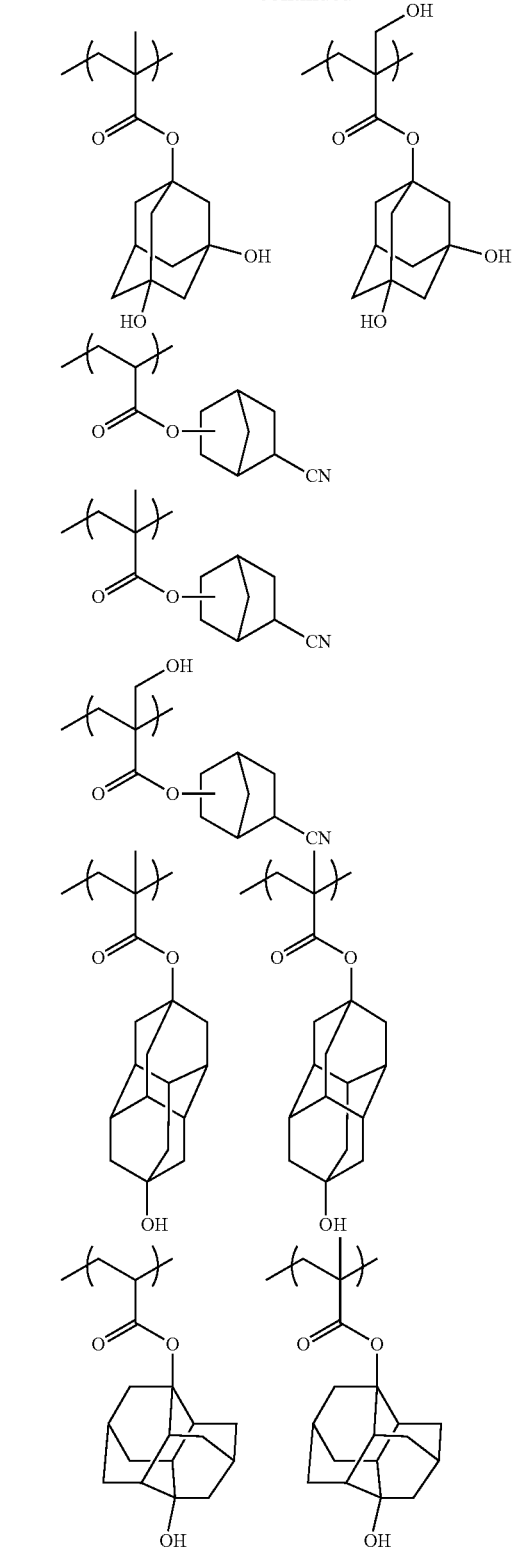

In a case where the resin (A) includes the repeating unit which has an organic group having a polar group, the content thereof is preferably 1 to 50 mol %, more preferably 1 to 30 mol %, still more preferably 5 to 25 mol %, and even still more preferably 5 to 20 mol % with respect to all the repeating units of the resin (A).

Further, as a repeating unit other than the above-described repeating units, the resin (A) may include a repeating unit having a group (photoacid generating group) which generates an acid when irradiated with an actinic ray or radiation. In this case, it can be considered that the repeating unit having a photoacid generating group corresponds to a compound (B) described below that generates an acid when irradiated with an actinic ray or radiation.

Examples of the repeating unit include a repeating unit represented by the following Formula (4).

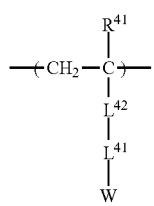

(4)

$R^{41}$ represents a hydrogen atom or a methyl group. $L^{41}$ represents a single bond or a divalent linking group. $L^{42}$ represents a divalent linking group. W represents a structural unit which is decomposed to generate an acid at a side chain when irradiated with an actinic ray or radiation.

Hereinafter, specific examples of the repeating unit represented by Formula (4) will be shown, but the present invention is not limited thereto.

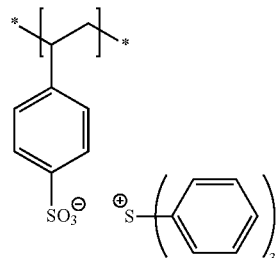

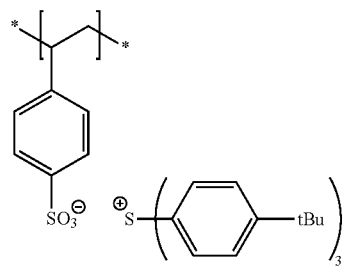

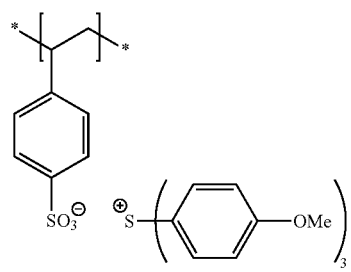

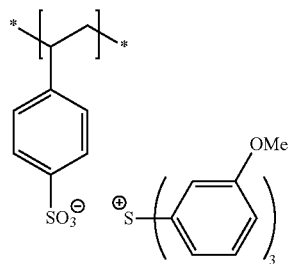

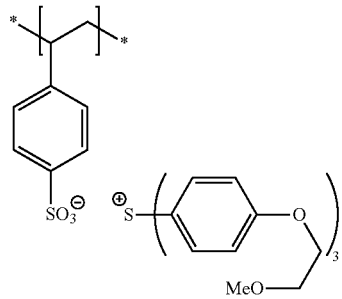

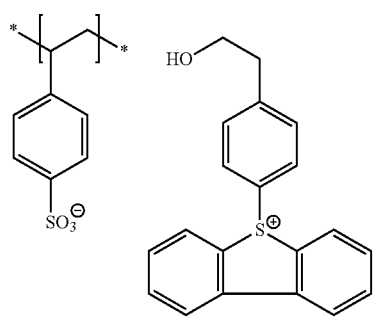

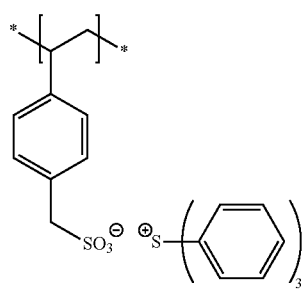

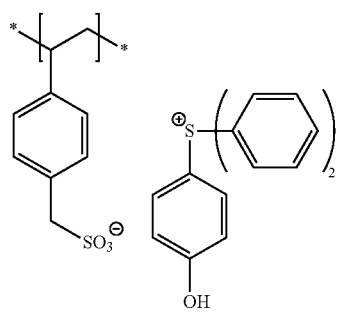

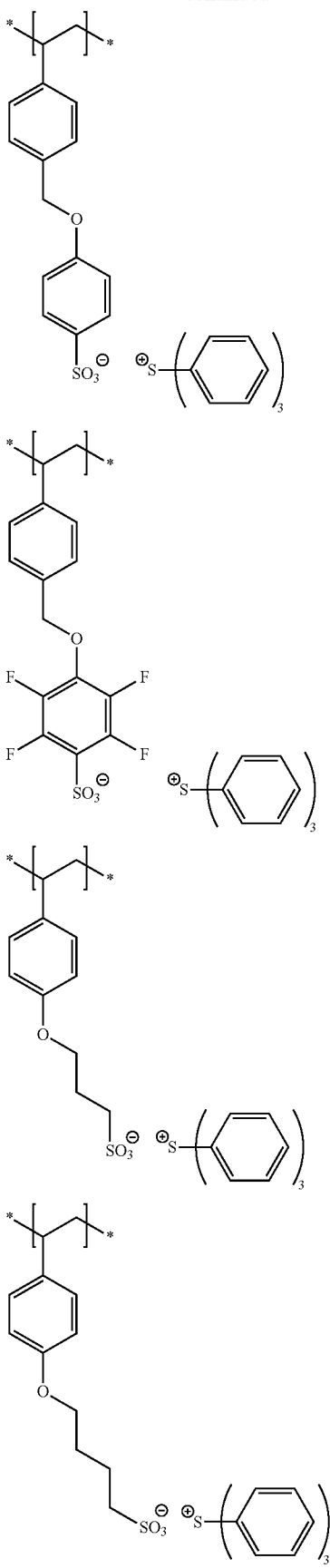
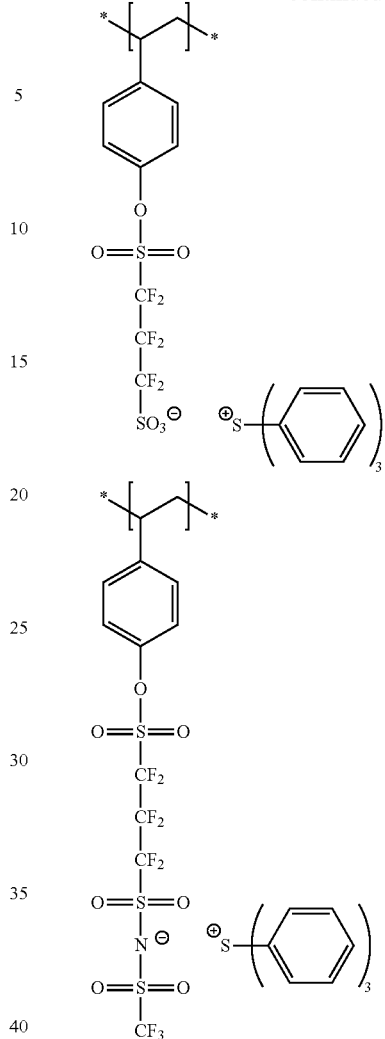

Other examples of the repeating unit represented by Formula (4) include repeating units described in paragraphs "0094" to "0105" of JP2014-041327A.

In a case where the resin (A) includes the repeating unit having a photoacid generating group, the content of the repeating unit having a photoacid generating group is preferably 1 to 40 mol %, more preferably 5 to 35 mol %, and still more preferably 5 to 30 mol % with respect to all the repeating units of the resin (A).

The resin (A) can be synthesized using an ordinary method (for example, radical polymerization). Examples of the general synthesis method include: a batch polymerization method of dissolving a monomer species and an initiator in a solvent and heating the solution for polymerization; and a dropping polymerization method of dropping a solution of a monomer species and an initiator dropwise to a heated solvent for 1 to 10 hours. Among these, a dropping polymerization method is preferable.

Examples of the reaction solvent include: an ether such as tetrahydrofuran, 1,4-dioxane, or diisopropyl ether; a ketone such as methyl ethyl ketone or methyl isobutyl ketone; an ester solvent such as ethyl acetate; an amide solvent such as dimethyl formamide or dimethylacetamide; and a solvent for dissolving an actinic ray-sensitive or radiation-sensitive composition described below such as propylene glycol monomethyl ether acetate, propylene glycol monomethyl ether, or cyclohexanone. It is preferable that the same solvent as that used in the actinic ray-sensitive or radiation-sensitive composition is used for polymerization. As a result, particle generation during storage can be suppressed.

It is preferable that the polymerization reaction is performed in an inert gas atmosphere such as nitrogen or argon. In order to initiate the polymerization, a commercially available radical initiator (for example, an azo initiator or peroxide) is used as the polymerization initiator. As the radical initiator, an azo initiator is preferable, and examples thereof include an azo initiator having an ester group, a cyano group, or a carboxyl group. Preferable examples of the initiator include azobisisobutyronitrile, azobisdimethylvaleronitrile, and dimethyl 2,2'-azobis(2-methylpropionate). If desired, the initiator is added additionally or dividedly. After completion of the reaction, the reaction product is put into a solvent, and a desired polymer is collected using a powder or solid collecting method or the like. The reaction concentration is 5 to 50 mass % and preferably 10 to 30 mass %.

The reaction temperature is typically 10° C. to 150° C., preferably 30° C. to 120° C., and still more preferably 60° C. to 100° C.

Examples of a method which can be used for purification include a typical method such as: a liquid-liquid extraction method in which a residual monomer or an oligomer component is removed using a combination of water cleaning and an appropriate solvent; a purification method in a solution state such as ultrafiltration in which substances having a specific molecular weight or lower are extracted and removed; a redispersion method in which a residual monomer is removed by dropping a resin solution over a poor solvent to solidify the resin in the poor solvent; and a purification method in a solid state in which a resin slurry separated by filtration is cleaned with a poor solvent.

The weight-average molecular weight of the resin (A) is preferably 1000 to 200000, more preferably 3000 to 20000, and most preferably 5000 to 15000 in terms of polystyrene by GPC. By adjusting the weight-average molecular weight to be 1000 to 200000, deterioration in heat resistance and dry etching resistance can be prevented. In addition, deterioration in developability and deterioration in film forming properties caused by an increase in viscosity can be prevented.

It is still more preferable that the weight-average molecular weight of the resin (A) is 3000 to 9500 in terms of polystyrene by GPC. By adjusting the weight-average molecular weight to be 3000 to 9500, in particular, a resist residue (hereinafter also referred to as "scum") is suppressed, and a more satisfactory pattern can be formed.

The dispersity (molecular weight distribution) is typically 1 to 5, preferably 1 to 3, more preferably 1.2 to 3.0, and still more preferably 1.2 to 2.0. As the dispersity decreases, the resolution and a resist shape are improved. In addition, a side wall of a resist pattern is smooth, and roughness properties are excellent.

In the actinic ray-sensitive or radiation-sensitive composition, the content of the resin (A) is preferably 50 to 99.9 mass % and more preferably 60 to 99.0 mass % with respect to the total solid content of the actinic ray-sensitive or radiation-sensitive composition.

In addition, in the actinic ray-sensitive or radiation-sensitive composition, one resin (A) may be used alone, or a plurality of resins (A) may be used in combination.

In addition, the resin (A) may include a repeating unit represented by the following Formula (VI).

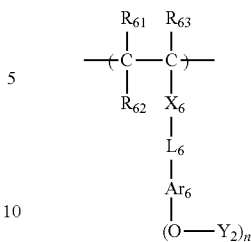

(VI)

In Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. $R_{62}$ may be bonded to $Ar_6$ to form a ring. In this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents a (n+1)-valent aromatic ring group, and in a case where $Ar_6$ is bonded to $R_{62}$ to form a ring, $Ar_6$ represents a (n+2)-valent aromatic ring group.

In a case where n represents 2 or more, $Y_2$'s each independently represent a hydrogen atom or a group which is removed by the action of an acid. At least one of $Y_2$'s represents a group which is removed by the action of an acid.

n represents an integer of 1 to 4.

As the group which is removed by the action of an acid represented by $Y_2$, a structure represented by Formula (VI-A) is more preferable.

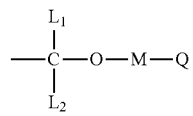

(VI-A)

Here, $L_1$ and $L_2$ each independently represent a hydrogen atom, an alkyl group, a cycloalkyl group, an aryl group, or a group including a combination of an alkylene group and an aryl group.

M represents a single bond or a divalent linking group.

Q represents an alkyl group, a cycloalkyl group which may have a heteroatom, an aryl group which may have a heteroatom, an amino group, an ammonium group, a mercapto group, a cyano group, or an aldehyde group.

At least two of Q, M, and $L_1$ may be bonded to each other to form a ring (preferably a 5- or 6-membered ring).

It is preferable that the repeating unit represented by the formula (VI) is a repeating unit represented by the following Formula (3).

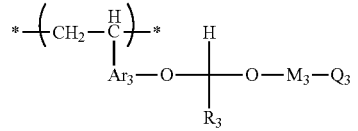

(3)

In Formula (3),

Ar₃ represents an aromatic ring group.

R₃ represents a hydrogen atom, an alkyl group, a cycloalkyl group, an aryl group, an aralkyl group, an alkoxy group, an acyl group, or a heterocyclic group.

M₃ represents a single bond or a divalent linking group.

Q₃ represents an alkyl group, a cycloalkyl group, an aryl group, or a heterocyclic group.

At least two of Q₃, M₃, and R₃ are bonded to each other to form a ring.

The aromatic ring group represented by Ara is the same as Ar₆ in Formula (VI) in a case where n in Formula (VI) represents 1. In this case, a phenylene group or a naphthylene group is more preferable, and a phenylene group is still more preferable.

Hereinafter, specific examples of the repeating unit represented by Formula (VI) will be shown, but the present invention is not limited thereto.

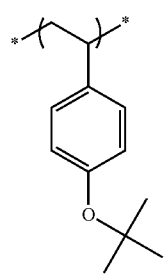

(VI-1)

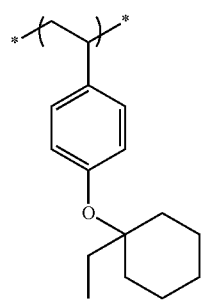

(VI-2)

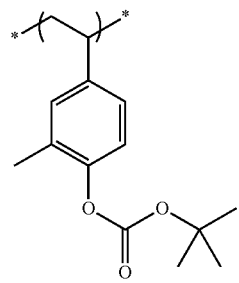

(VI-3)

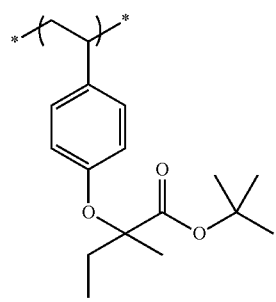

(VI-4)

-continued

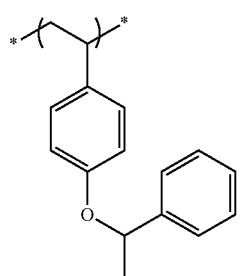

(VI-5)

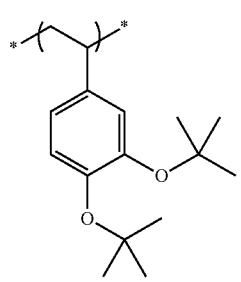

(VI-6)

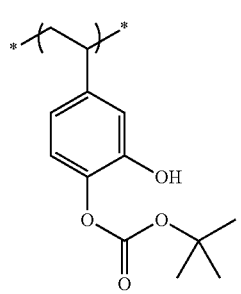

(VI-7)

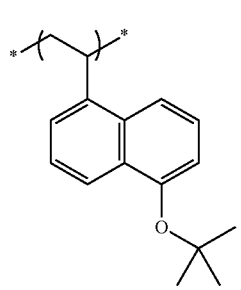

(VI-8)

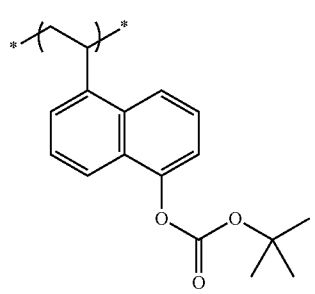

(VI-9)

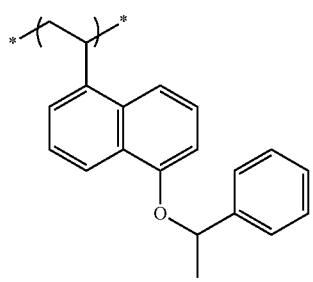 (VI-10)
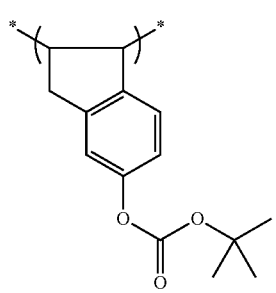 (VI-11)
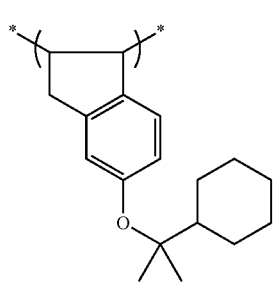 (VI-12)
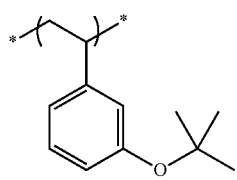 (VI-13)
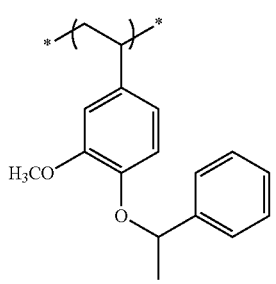 (VI-14)
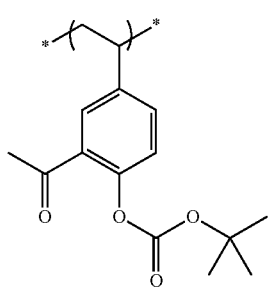 (VI-15)
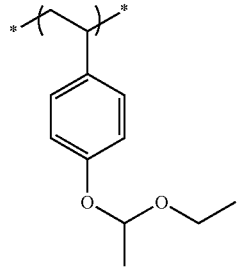 (VI-16)
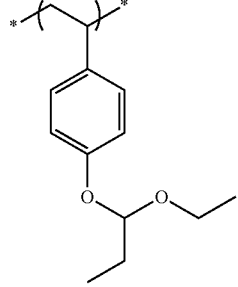 (VI-17)
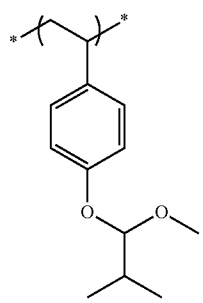 (VI-18)
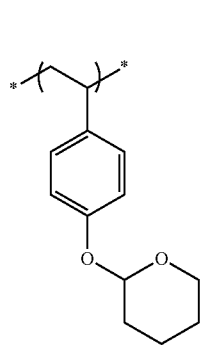 (VI-19)
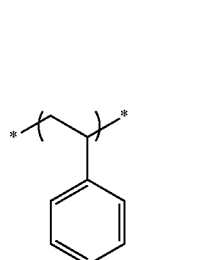 (VI-20)

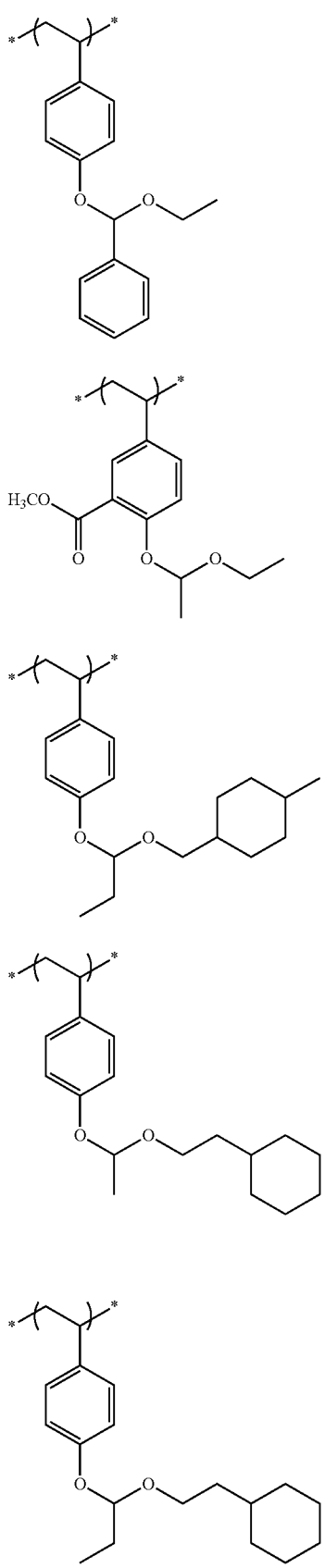
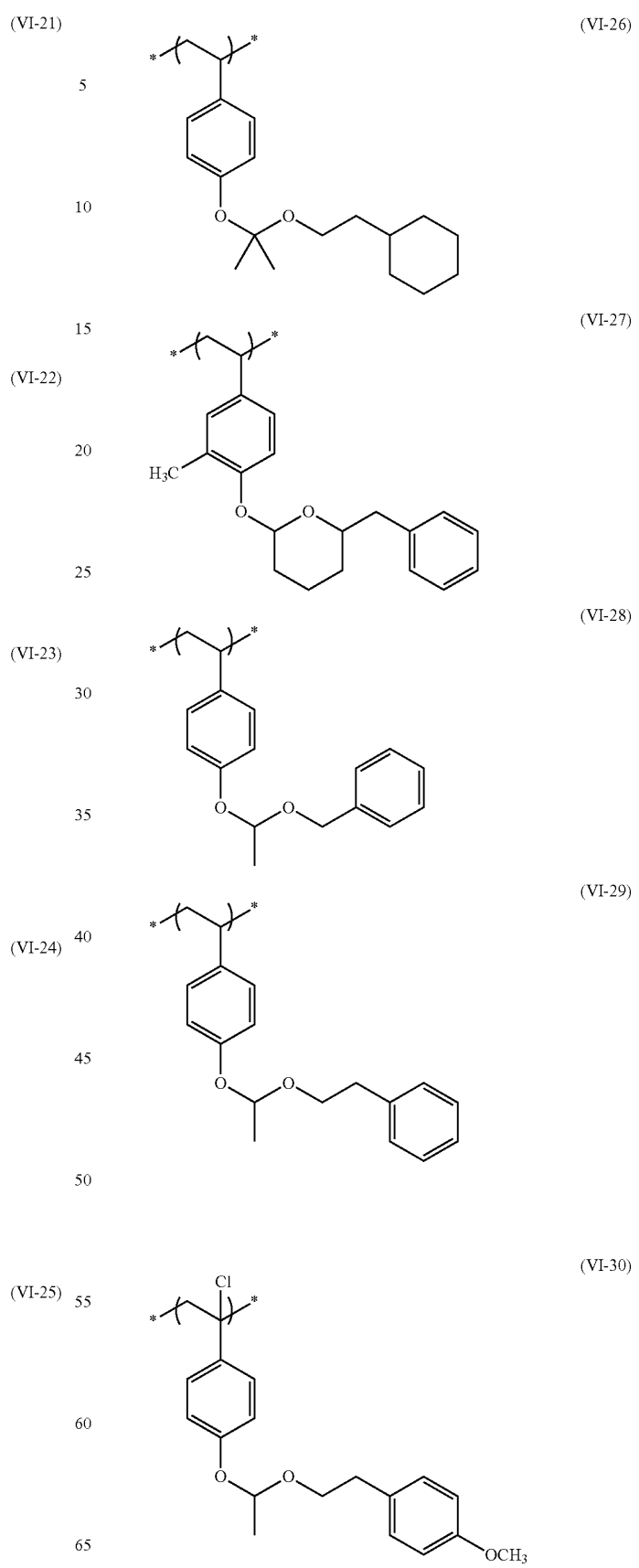

(VI-31) 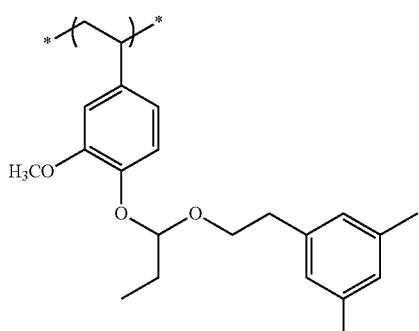

(VI-32) 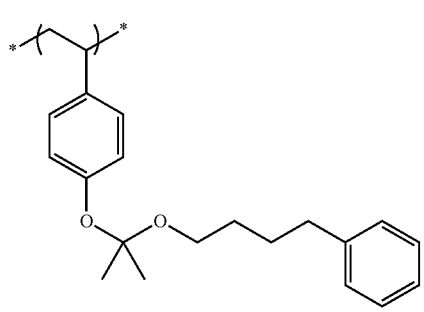

(VI-33) 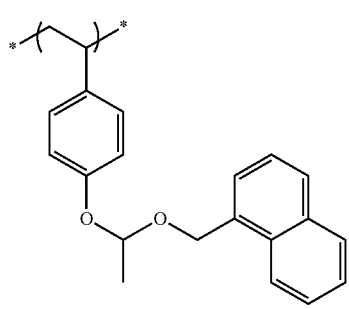

(VI-34) 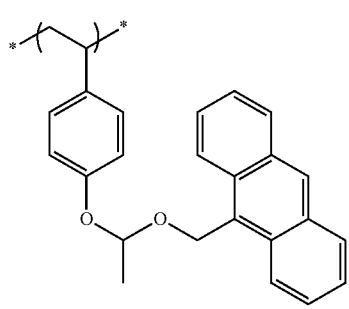

(VI-35) 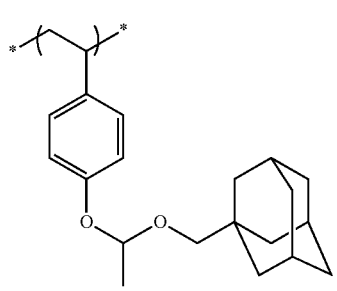

(VI-36) 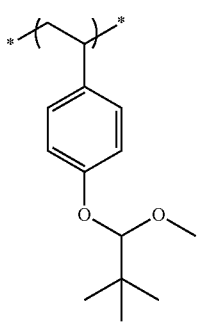

It is also preferable that the resin (A) includes a repeating unit represented by the following Formula (4).

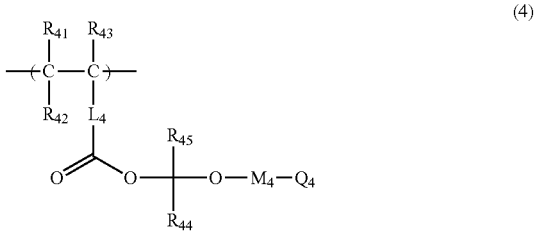

(4)

In Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring. In this case, $R_{42}$ represents an alkylene group.

$L_4$ represents a single bond or a divalent linking group. In a case where $L_4$ and $R_{42}$ form a ring, $L_4$ represents a trivalent linking group.

$R_{44}$ and $R_{45}$ represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, and $R_{44}$ are bonded to each other to form a ring.

$R_{44}$ and $R_{45}$ have the same definition and the same preferable range as $R_3$ in Formula (3).

$M_4$ has the same definition and the same preferable range as $M_3$ in Formula (3).

$Q_4$ has the same definition and the same preferable range as $Q_3$ in Formula (3).

Examples of a ring which is formed by at least two of $Q_4$, $M_4$, and $R_{44}$ being bonded to each other include the ring which is formed by at least two of $Q_3$, $M_3$, and $R_3$ being bonded to each other, and preferable ranges thereof are also the same.

Hereinafter, specific examples of the repeating unit represented by Formula (4) will be shown, but the present invention is not limited thereto.

61
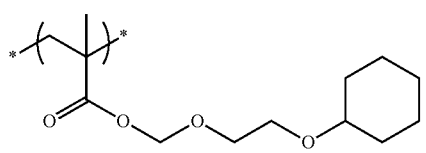
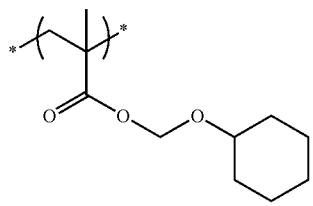
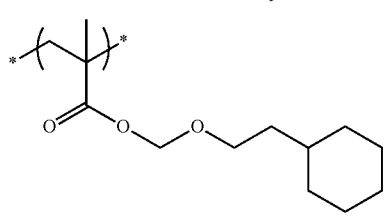
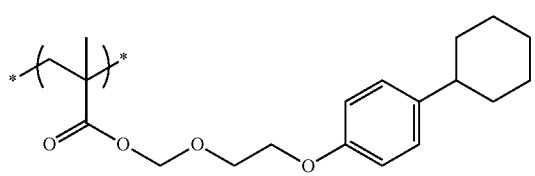
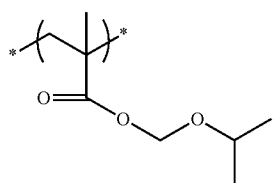
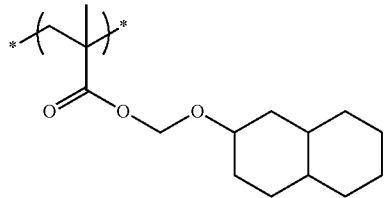
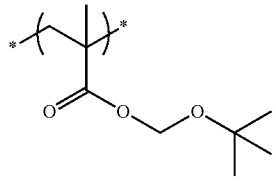
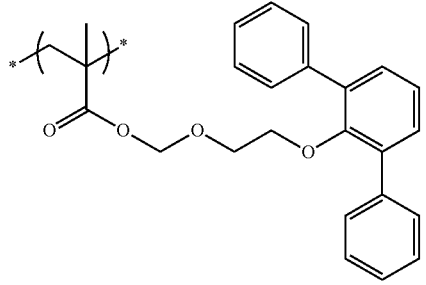
62
-continued
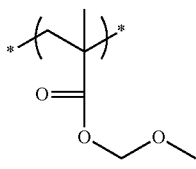
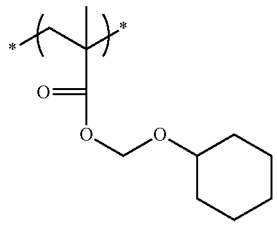
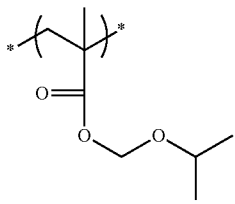
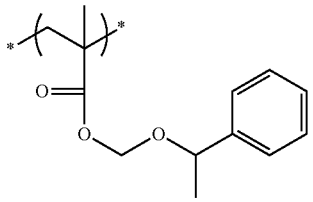
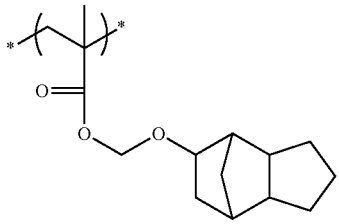
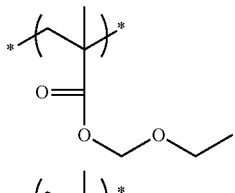
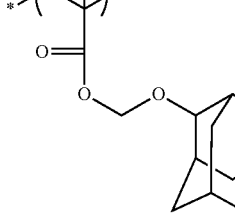
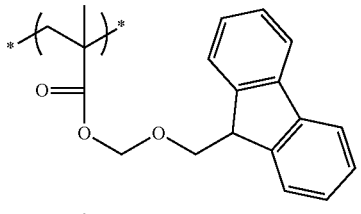
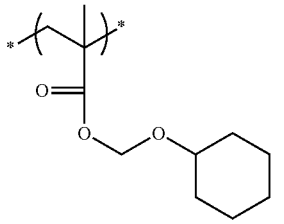
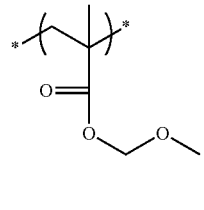

-continued

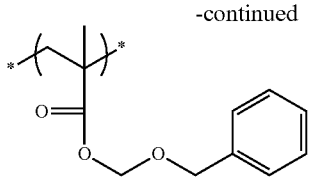

In addition, the resin (A) may include a repeating unit represented by the following Formula (BZ).

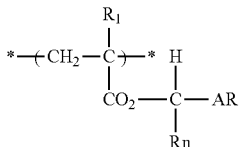

(BZ)

In Formula (BZ), AR represents an aryl group. Rn represents an alkyl group, a cycloalkyl group, or an aryl group. Rn and AR may be bonded to each other to form a nonaromatic ring.

$R_1$ represents a hydrogen atom, an alkyl group, a cycloalkyl group, a halogen atom, a cyano group, or an alkyloxycarbonyl group.

Hereinafter, specific examples of the repeating unit represented by the formula (BZ) will be shown, but the present invention is not limited thereto.

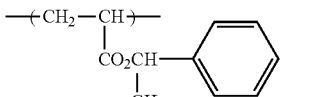
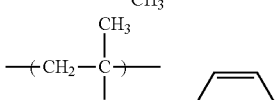
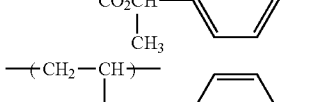
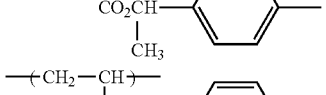
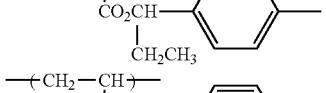
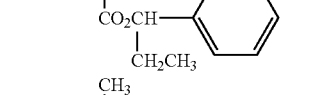
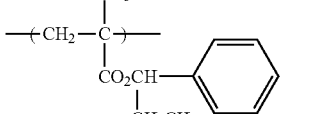

-continued

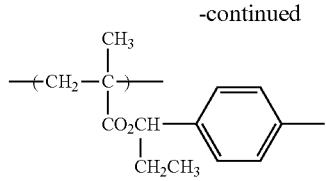
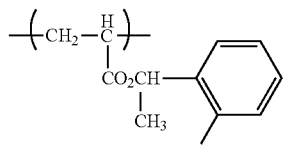
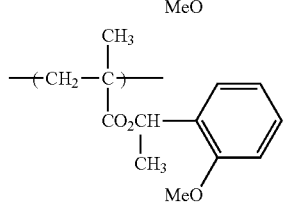
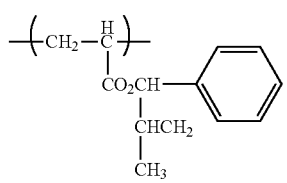
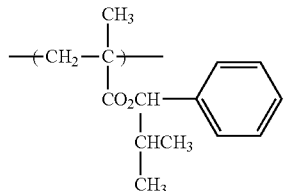
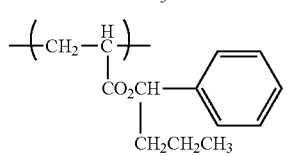
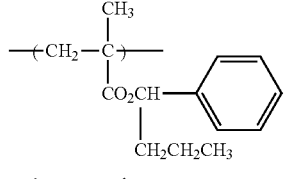
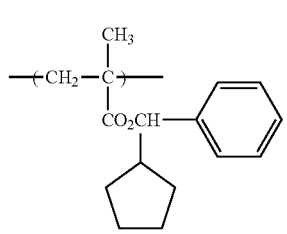

-continued

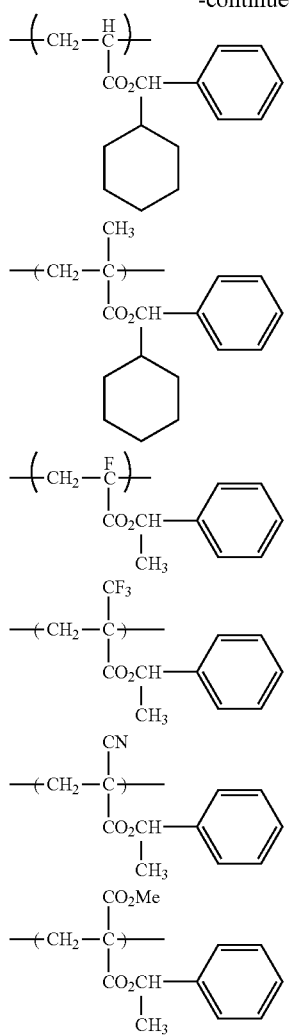

As the repeating unit having an acid-decomposable group, one kind may be used alone, or two or more kinds may be used in combination.

The content of the repeating unit having an acid-decomposable group in the resin (A) (in a case where the resin (A) includes a plurality of repeating units having an acid-decomposable group, the total content thereof) is preferably 5 mol % or higher and 80 mol % or lower, more preferably 5 mol % or higher and 75 mol % or lower, and still more preferably 10 mol % or higher and 65 mol % or lower with respect to all the repeating units of the resin (A).

The resin (A) may include a repeating unit represented by the following Formula (V) or the following Formula (VI).

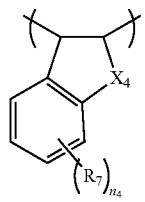

(V)

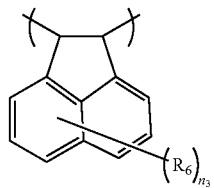

(VI)

In the formulae, $R_6$ and $R_7$ each independently represent a hydrogen atom, a hydroxy group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ represents a methylene group, an oxygen atom, or a sulfur atom.

Hereinafter, specific examples of the repeating unit represented by Formula (V) or Formula (VI) will be shown, but the present invention is not limited thereto.

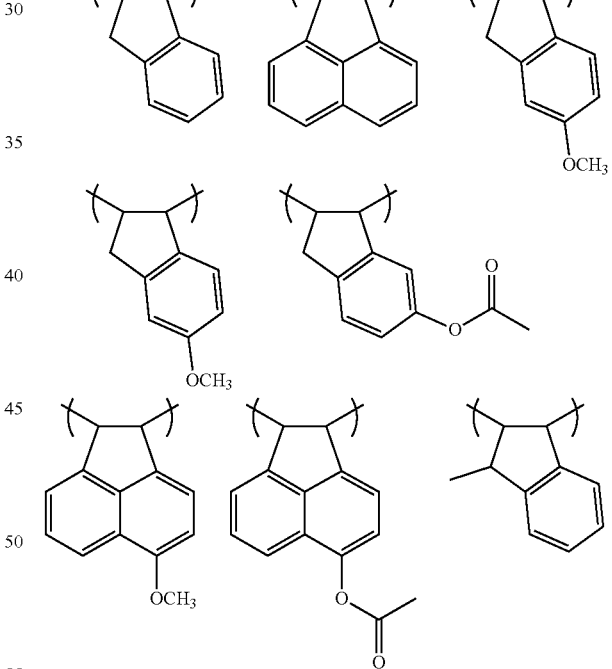

The resin (A) may further include a repeating unit having a silicon atom at a side chain. Examples of the repeating unit having a silicon atom at a side chain include a (meth)acrylate repeating unit having a silicon atom and a vinyl repeating unit having a silicon atom. The repeating unit having a silicon atom at a side chain is typically a repeating unit which has a group having a silicon atom at a side chain, and examples of the group having a silicon atom include a trimethylsilyl group, a triethylsilyl group, a triphenylsilyl group, a tricyclohexylsilyl group, a tristrimethylsilylsiloxysilyl group, a tristrimethylsilylsilyl group, a methylbistrimethylsilylsilyl group, a methylbistrimethylsilloxysilyl group, a dimethyltrimethylsilylsilyl group, a dimethyltrimethylsilloxysilyl group, a cyclic or linear polysiloxane described below, and a basket-type, ladder-type, or random-type silsesquioxane structure described below. In the formulae, R and R1 each independently represent a monovalent substituent. * represents a direct bond.

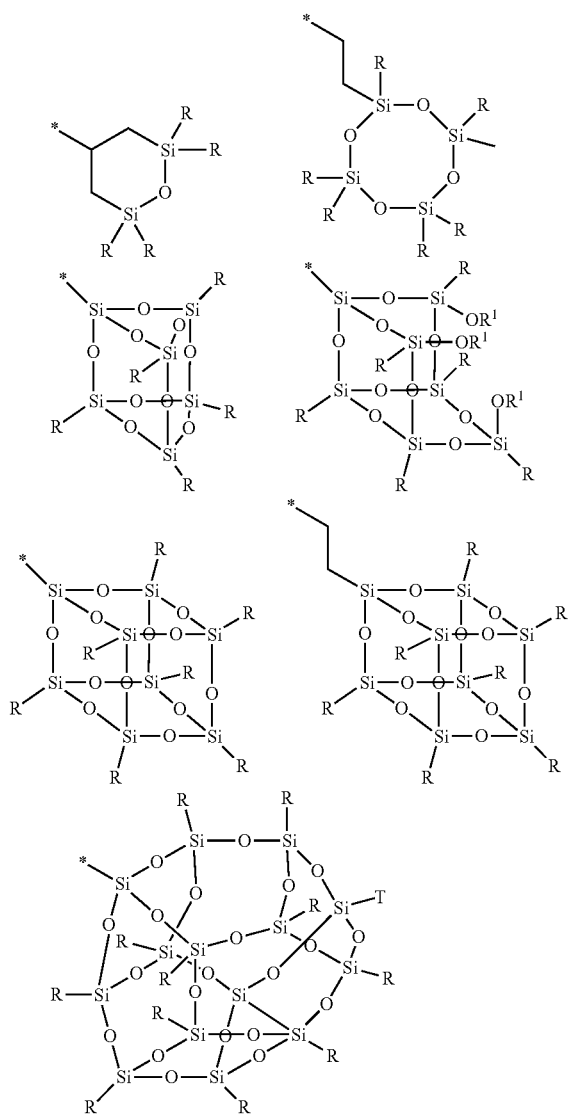

Preferable examples of the repeating unit having the above-described group include a repeating unit derived from an acrylate or methacrylate compound having the above-described group, and a repeating unit derived from a compound having the above-described group and a vinyl group.

It is preferable that the repeating unit having a silicon atom is a repeating unit having a silsesquioxane structure. As a result, excellent collapse performance can be exhibited during the formation of an ultrafine pattern (for example, line width: 50 nm or less) in which a cross-sectional shape has a high aspect ratio (for example, a thickness/line width is 3 or more).

Examples of the silsesquioxane structure include a basket-type silsesquioxane structure, a ladder-type silsesquioxane structure, and a random-type silsesquioxane structure. Among these, a basket-type silsesquioxane structure is preferable.

Here, the basket-type silsesquioxane structure refers to a silsesquioxane structure having a basket-shaped skeleton. The basket-type silsesquioxane structure may be a complete basket-type silsesquioxane structure or an incomplete basket-type silsesquioxane structure and is preferably a complete basket-type silsesquioxane structure.

In addition, the ladder-type silsesquioxane structure refers to a silsesquioxane structure having a ladder-shaped skeleton.

In addition, the random-type silsesquioxane structure refers to a silsesquioxane structure having a random skeleton.

It is preferable that the basket-type silsesquioxane structure is a siloxane structure represented by the following Formula (S).

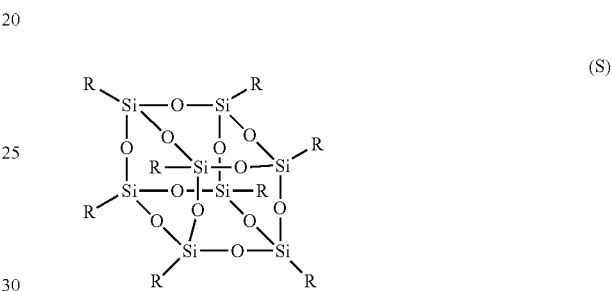

In Formula (S), R represents a monovalent organic group. A plurality of R's may be the same as or different from each other.

The organic group is not particularly limited, and specific examples thereof include a hydroxy group, a nitro group, a carboxy group, an alkoxy group, an amino group, a mercapto group, a blocked mercapto group (for example, a mercapto group blocked (protected) with an acyl group), an acyl group, an imido group, a phosphino group, a phosphinyl group, a silyl group, a vinyl group, a hydrocarbon group which may have a heteroatom, a (meth)acryl group-containing group, and an epoxy group-containing group.

Examples of the heteroatom of the hydrocarbon group which may have a heteroatom include an oxygen atom, a nitrogen atom, a sulfur atom, and a phosphorus atom.

Examples of the hydrocarbon group of the hydrocarbon group which may have a heteroatom include an aliphatic hydrocarbon group, an aromatic hydrocarbon group, and a group including a combination thereof.

The aliphatic hydrocarbon group may be linear, branched, or cyclic. Specific examples of the aliphatic hydrocarbon group include a linear or branched alkyl group (particularly having 1 to 30 carbon atoms), a linear or branched alkenyl group (particularly having 2 to 30 carbon atoms), and a linear or branched alkynyl group (particularly, having 2 to 30 carbon atoms).

Examples of the aromatic hydrocarbon group include an aromatic hydrocarbon group having 6 to 18 carbon atoms such as a phenyl group, a tolyl group, a xylyl group, or a naphthyl group.

In a case where the resin (A) includes the repeating unit which has silicon atom at a side chain, the content thereof is preferably 1 to 30 mol %, more preferably 5 to 25 mol %, and still more preferably 5 to 20 mol % with respect to all the repeating units of the resin (A).

(B) Compound (Photoacid Generator) which Generates Acid by Actinic Ray or Radiation It is preferable that the actinic ray-sensitive or radiation-sensitive resin composition includes a compound (hereinafter, also referred to as "photoacid generator (PAG)") which generates an acid by an actinic ray or radiation.

The photoacid generator may be a low molecular weight compound or may be incorporated into a part of a polymer. In addition, the photoacid generator may be a low molecular weight compound which is incorporated into a part of a polymer.

In a case where the photoacid generator is a low molecular weight compound, the molecular weight is preferably 3000 or lower, more preferably 2000 or lower, and still more preferably 1000 or lower.

In a case where the photoacid generator is incorporated into a part of a polymer, the photoacid generator may be incorporated into a part of the resin (A) or another resin different from the resin (A).

In the present invention, it is preferable that the photoacid generator is a low molecular weight compound.

The photoacid generator is not particularly limited as long as it is well-known. As the photoacid generator, a compound, which generates an organic acid, for example, at least one of sulfonic acid, bis(alkylsulfonyl)imide, or tris(alkylsulfonyl)methide when irradiated with an actinic ray or radiation and preferably an electron beam or an extreme ultraviolet ray, is preferable.

A compound represented by the following Formula (ZI), (ZII) or (ZIII) is more preferable.

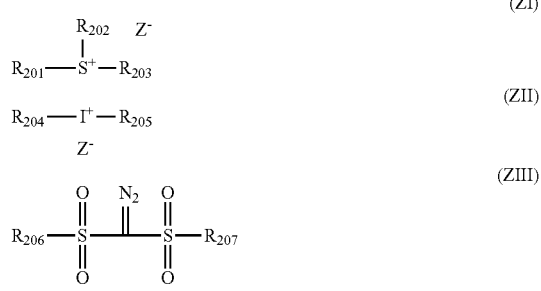

In Formula (ZI), $R_{201}$, $R_{202}$, and $R_{203}$ each independently represent an organic group.

The number of carbon atoms in the organic group represented by $R_{201}$, $R_{202}$, and $R_{203}$ is generally 1 to 30 and preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group which is formed by two of $R_{201}$ to $R_{203}$ being bonded to each other include an alkylene group (for example, a butylene group or a pentylene group).

$Z^-$ represents a non-nucleophilic anion (an anion having a significantly low ability to cause a nucleophilic reaction to occur).

Examples of the non-nucleophilic anion include a sulfonate anion (for example, an aliphatic sulfonate anion, an aromatic sulfonate anion, or a camphor sulfonate anion), a carboxylate anion (for example, an aliphatic carboxylate anion, an aromatic carboxylate anion, or an aralkyl carboxylate anion), a sulfonyl imide anion, a bis(alkylsulfonyl)imide anion, and a tris(alkylsulfonyl)methide anion.

An aliphatic site in the aliphatic sulfonate anion and the aliphatic carboxylate anion may be an alkyl group or a cycloalkyl group and is preferably a linear or branched alkyl group having 1 to 30 carbon atoms or a cycloalkyl group having 3 to 30 carbon atoms.

As the aromatic group in the aromatic sulfonate anion and the aromatic carboxylate anion, an aryl group having 6 to 14 carbon atoms is preferable, and examples thereof include a phenyl group, a tolyl group, and naphthyl group.

The alkyl group, the cycloalkyl group, and the aryl group described above may have a substituent. Specific examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

Examples of an aryl group and a ring structure included in each of the groups include an alkyl group (preferably having 1 to 15 carbon atoms) as a substituent.

As the aralkyl group in the aralkyl carboxylate anion, an aralkyl group having 7 to 12 carbon atoms is preferable, and examples thereof include a benzyl group, a phenethyl group, a naphthylmethyl group, a naphthylethyl group, and a naphthylbutyl group.

Examples of the sulfonyl imide anion include a saccharin anion.

As the alkyl group in the bis(alkylsulfonyl)imide anion and the tris(alkylsulfonyl)methide anion, an alkyl group having 1 to 5 carbon atoms is preferable. Examples of a substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group. Among these, a fluorine atom or an alkyl group substituted with a fluorine atom is preferable.

In addition, the alkyl groups in the bis(alkylsulfonyl)imide anions may be bonded to each other to form a ring structure. As a result, the acid strength increases.

Other examples of the non-nucleophilic anion include phosphorus fluoride (for example, $PF_6^-$), boron fluoride (for example, $BF_4^-$), and antimony fluoride (for example, $SbF_6^-$).

As the non-nucleophilic anion, an aliphatic sulfonate anion in which at least the α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom is preferable. As the non-nucleophilic anion, a perfluoroaliphatic sulfonate anion (still more preferably having 4 to 8 carbon atoms) or a benzenesulfonate anion having a fluorine atom is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

From the viewpoint of the acid strength, it is preferable that the pKa of the acid generated is −1 or lower to improve sensitivity.

In addition, as the non-nucleophilic anion, for example, an anion represented by the following Formula (AN1) is preferable.

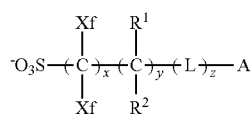
(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group. In a case where a plurality of $R^1$'s and a plurality of $R^2$'s are present, $R^1$'s and $R^2$'s may be the same as or different from each other.

L represents a divalent linking group. In a case where a plurality of L's are present, L's may be the same as or different from each other.

A represents a cyclic organic group.

x represents an integer of 1 to 20, y represent an integer of 0 to 10, and z represents an integer of 0 to 10.

Formula (AN1) will be described in more detail.

As the alkyl group in the alkyl group substituted with a fluorine atom represented by Xf, an alkyl group having 1 to 10 carbon atoms is preferable, and an alkyl group having 1 to 4 carbon atoms is more preferable. In addition, as the alkyl group in the alkyl group substituted with a fluorine atom represented by Xf, a perfluoroalkyl group is preferable.

Xf represents preferably a fluorine atom or a perfluoroalkyl group having or 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$.

Among these, a fluorine atom or $CF_3$ is preferable.

In particular, it is preferable that both Xf's represent a fluorine atom.

The alkyl group represented by $R^1$ and $R^2$ may have a substituent (preferably a fluorine atom), and an alkyl group having 1 to 4 carbon atoms is preferable. A perfluoroalkyl group having 1 to 4 carbon atoms is more preferable. Specific examples of the alkyl group having a substituent represented by $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

$R^1$ and $R^2$ represent preferably a fluorine atom or $CF_3$.

x represents preferably 1 to 10 and more preferably 1 to 5.

y represents preferably 0 to 4 and more preferably 0.

z represents preferably 0 to 5 and more preferably 0 to 3.

The divalent linking group represented by L is not particularly limited, and examples thereof include —COO—, —OCO—, —CO—, —O—, —S—, —SO—, —SO₂—, an alkylene group, a cycloalkylene group, an alkenylene group, a linking group obtained by linking two or more kinds among the above-described groups linking to each other. A linking group having 12 or less carbon atoms in total is preferable. Among these, —COO—, —OCO, —CO—, or —O— is preferable, and —COO— or —OCO— is more preferable.

In Formula (AN1), as a combination of partial structures other than A, for example, SO³⁻—CF₂—CH₂—OCO—, SO³⁻—CF₂—CH₂—CHF—OCO—, SO³⁻—CF₂—OCO, SO³⁻—CF₂—CF₂—CH₂—, or SO³⁻—CF₂—CH(CF₃)—OCO— is preferable.

The cyclic organic group represented by A is not particularly limited as long as it has a cyclic structure, and examples thereof include an alicyclic group, an aryl group, a heterocyclic group (including not only an aromatic heterocyclic group but also a nonaromatic heterocyclic group).

The alicyclic group may be monocyclic or polycyclic, and a monocycloalkyl group such as a cyclopentyl group, a cyclohexyl group, or a cyclooctyl group, or a polycycloalkyl group such as a norbornyl group, a tricyclodecanyl group, a tetracyclodecanyl group, a tetracyclododecanyl group, or an adamantyl group is preferable. Among these, an alicyclic group having a bulky structure which has 7 or more carbon atoms such as a norbornyl group, a tricyclodecanyl group, a tetracyclodecanyl group, a tetracyclododecanyl group, or an adamantyl group is preferable from the viewpoints of suppressing in-film diffusion in a heating step after exposure and improving a mask error enhancement factor (MEEF).

Examples of the aryl group include a benzene ring, a naphthalene ring, a phenanthrene ring, and an anthracene ring.

Examples of the heterocyclic group include a furan ring, a thiophene ring, a benzofuran ring, a benzothiophene ring, a dibenzofuran ring, a dibenzothiophene ring, and a group derived from a pyridine ring. Among these, a furan ring, a thiophene ring, or a group derived from a pyridine ring is preferable.

In addition, as the cyclic organic group, a lactone structure can be used, and specific examples thereof include lactone structures represented by the following Formulae (LC1-1) to (LC1-17).

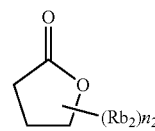
LC1-1

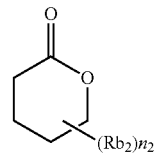
LC1-2

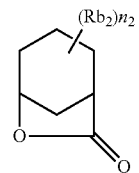
LC1-3

-continued

LC1-4 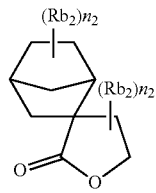

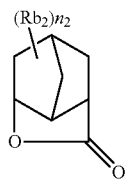 LC1-5

LC1-12

LC1-13 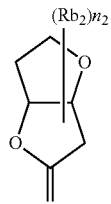

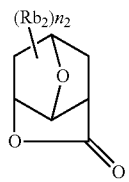 LC1-6

LC1-14 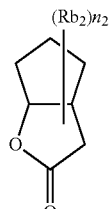

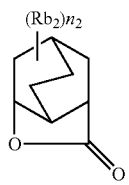 LC1-7

LC1-15 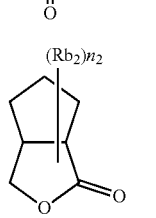

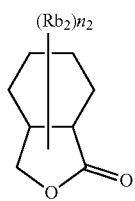 LC1-8

LC1-16 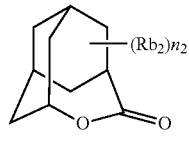

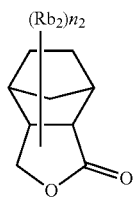 LC1-9

LC1-17 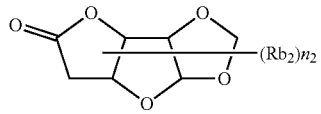

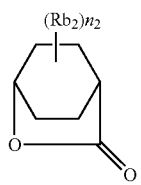 LC1-10

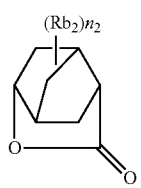 LC1-11

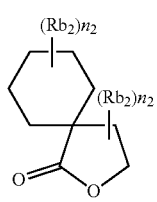

The cyclic organic group may have a substituent, and examples of the substituent include an alkyl group (a linear, branched, or cyclic alkyl group; preferably having 1 to 12 carbon atoms), a cycloalkyl group (a monocycle, a polycycle, or a spiro ring; preferably having 3 to 20 carbon atoms), an aryl group (preferably having 6 to 14 carbon atoms), a hydroxy group, an alkoxy group, an ester group, an amido group, a urethane group, an ureido group, a thioether group, a sulfonamide group, and a sulfonate group. Carbon (carbon contributing to ring formation) constituting the cyclic organic group may be carbonyl carbon.

The substituent corresponds to $Rb_2$ in (LC1-1) to (LC1-17). In addition, in (LC1-1) to (LC1-17), $n_2$ represents an integer of 0 to 4. In a case where $n_2$ represents 2 or more, a plurality of $Rb_2$'s may be the same as or different from each other or may be bonded to each other to form a ring.

Examples of the organic group represented by $R_{201}$, $R_{202}$, and $R_{203}$ in Formula (ZI) include an aryl group, an alkyl group, and a cycloalkyl group.

It is preferable that at least one of $R_{201}$, $R_{202}$, or $R_{203}$ represents an aryl group, and it is more preferable that all of $R_{201}$, $R_{202}$, or $R_{203}$ represent an aryl group. As the aryl group, not only a phenyl group or a naphthyl group but also a heteroaryl group such as an indole residue or a pyrrole residue may be used. As the alkyl group and the cycloalkyl group represented by $R_{201}$ to $R_{203}$, a linear or branched alkyl group having 1 to 10 carbon atoms or a cycloalkyl group having 3 to 10 carbon atoms is preferable. As the alkyl group, a methyl group, an ethyl group, a n-propyl group, an i-propyl group, or a n-butyl group is more preferable. As the cycloalkyl group, a cyclopropyl group, a cyclobutyl group, a cyclopentyl group, a cyclohexyl group, or a cycloheptyl group is more preferable. Each of the groups may further have a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), but the present invention is not limited thereto.

Next, Formulae (ZII) and (ZIII) will be described.

In Formulae (ZII) and (ZIII), 8204 to $R_{207}$ each independently represent an aryl group, an alkyl group, or a cycloalkyl group.

As the aryl group represented by $R_{204}$ to $R_{207}$, a phenyl group or a naphthyl group is preferable, and a phenyl group is more preferable. The aryl group represented by $R_{204}$ to $R_{207}$, may be an aryl group which has a heterocyclic structure having an oxygen atom, a nitrogen atom, or a sulfur atom. Examples of a skeleton of the aryl group having a heterocyclic structure include pyrrole, furan, thiophene, indole, benzofuran, and benzothiophene.

Preferable examples of the alkyl group and the cycloalkyl group represented by $R_{204}$ to $R_{207}$ include a linear or branched alkyl group having 1 to 10 carbon atoms (for example, a methyl group, an ethyl group, a propyl group, a butyl group or a pentyl group), and a cycloalkyl group having 3 to 10 carbon atoms (a cyclopentyl group, a cyclohexyl group, or a norbornyl group).

The aryl group, the alkyl group, and the cycloalkyl group represented by $R_{204}$ to $R_{207}$ may have a substituent. Examples of the substituent which may be included in the aryl group, the alkyl group, and the cycloalkyl group represented by $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

In addition, $Z^-$ in Formula (ZII) represents a non-nucleophilic anion. Specifically, $Z^-$ in Formula (ZII) has the same definition and the same preferable aspect as $Z^-$ in Formula (ZI).

Hereinafter, specific examples of Formulae (ZI) to (ZIII) will be shown below, but the present invention is not limited thereto.

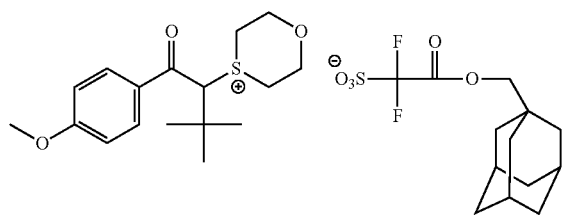

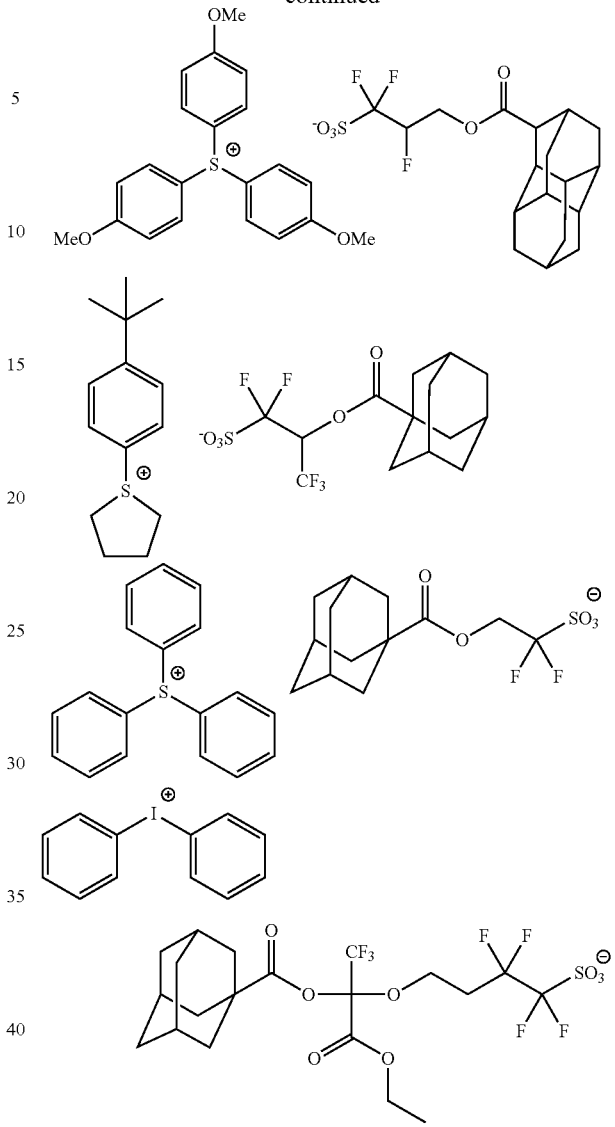

In the present invention, from the viewpoint of suppressing diffusion of an acid generated by exposure to a non-exposed portion and improving resolution, the photoacid generator is preferably a compound which generates an acid (more preferably sulfonic acid) having a volume of 130 Å$^3$ or higher when irradiated with an electron beam or an extreme ultraviolet ray, more preferably a compound which generates an acid (more preferably sulfonic acid) having a volume of 190 Å$^3$ or higher, still more preferably a compound which generates an acid (more preferably sulfonic acid) having a volume of 270 Å$^3$ or higher, and even still more preferably a compound which generates an acid (more preferably sulfonic acid) having a volume of 400 Å$^3$ or higher. From the viewpoints of sensitivity and coating solvent solubility, the volume is preferably 2000 Å$^3$ or lower and more preferably 1500 Å$^3$ or lower. A value of the volume is obtained using "WinMOPAC" (manufactured by FUJITSU). That is, a chemical structure of an acid according to each example is input. Next, the most stable conformation of each acid is determined through a molecular field calculation using a MM3 method with the input chemical structure as an initial structure. Next, a molecular orbital calculation is performed on the most stable conformation using a PM3 method. As a result, "accessible volume" of each acid can be calculated.

In the present invention, the following examples of the photoacid generators which generate an acid when irradiated with an actinic ray or radiation are preferable. In some of the examples, a calculated value of the volume is added (unit: $Å^3$). The calculated value herein denotes a value of an acid in which a proton is bonded to the anion portion.

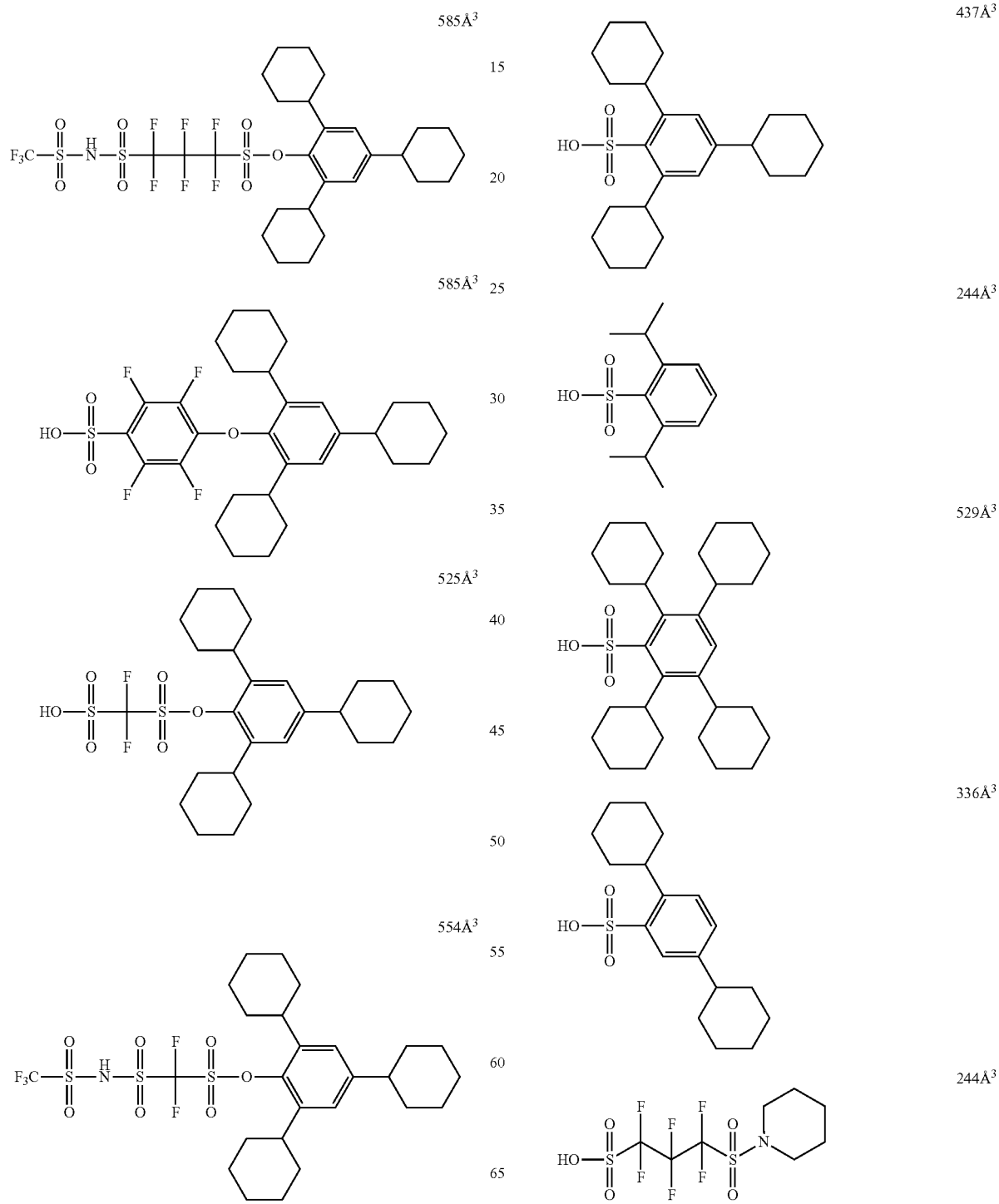

79
-continued
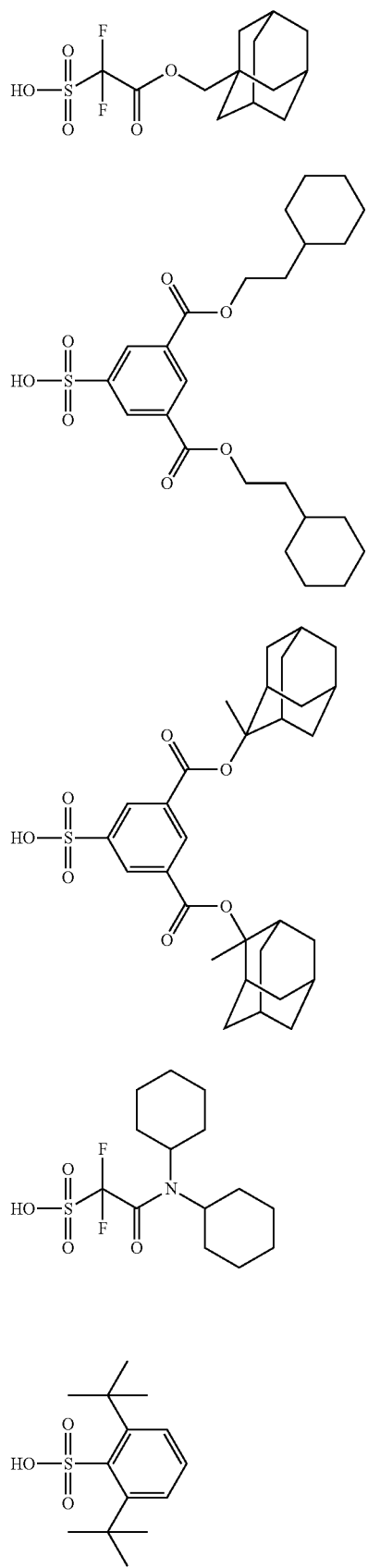
271Å³
457Å³
511Å³
311Å³
280Å³
80
-continued
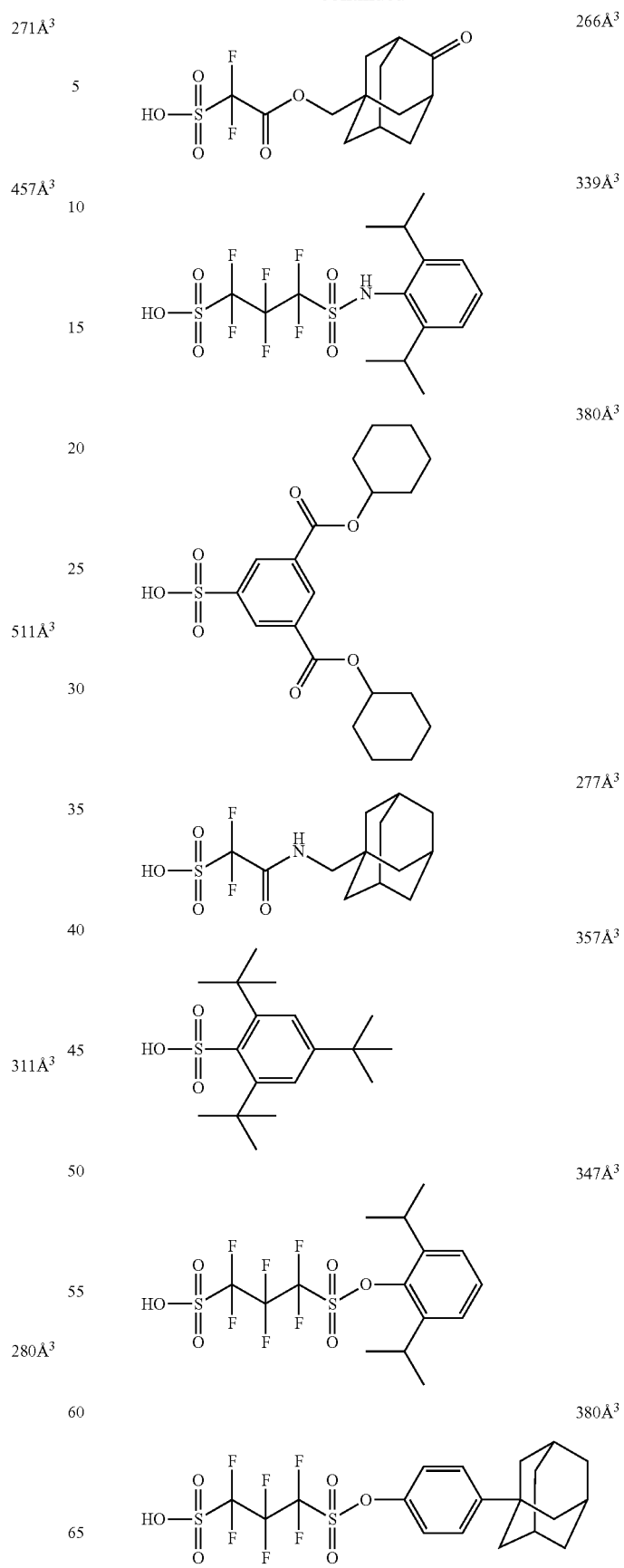
266Å³
339Å³
380Å³
277Å³
357Å³
347Å³
380Å³

519Å³
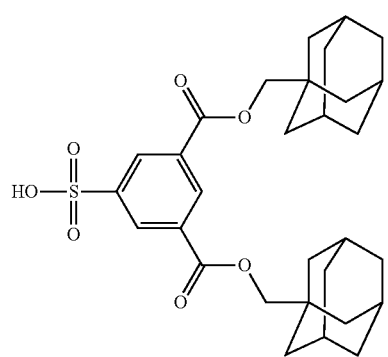
291Å³
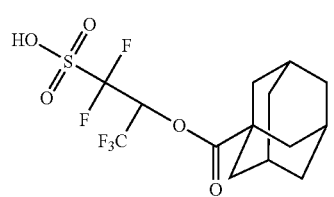
297Å³
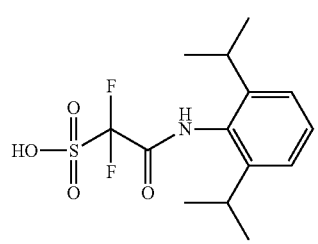
277Å³
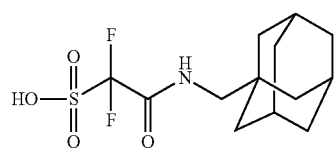
281Å³
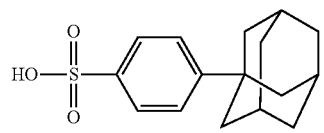
310Å³
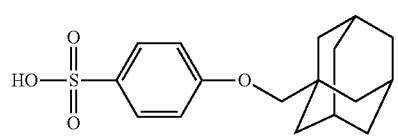
309Å³
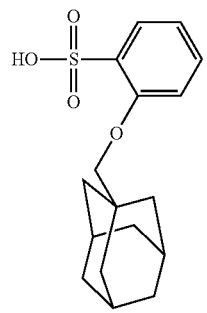
270Å³
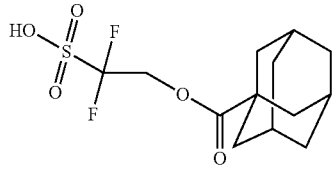
393Å³
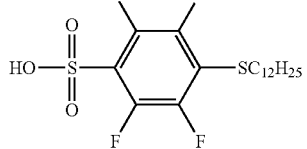
350Å³
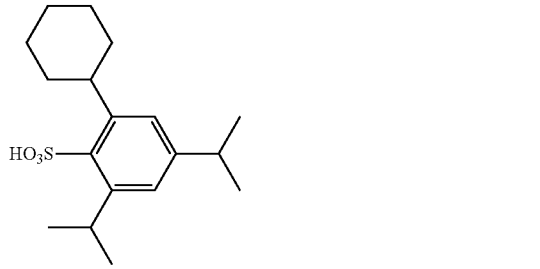
311Å³
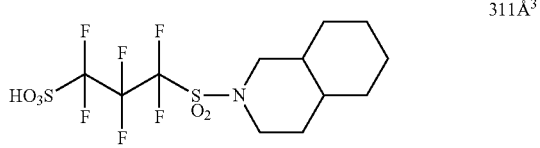
250Å³
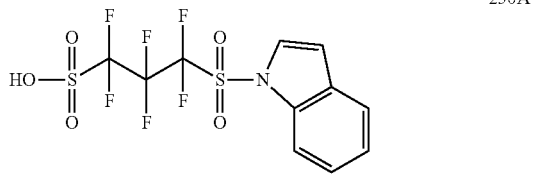
535Å³
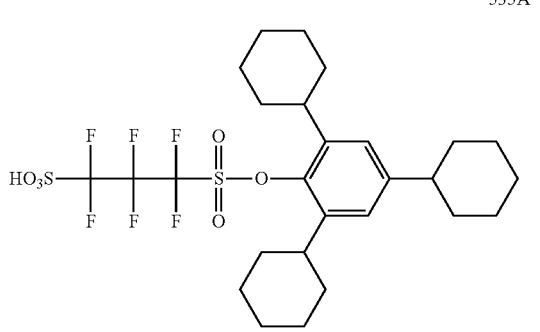
290Å³
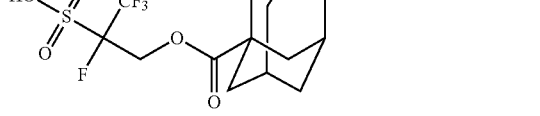

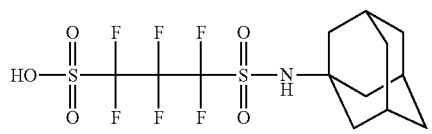
315A³
The details of the photoacid generator can be found in paragraphs "0368" to "0377" of JP2014-41328A and paragraphs "0240" to "0262" of JP2013-228681A (corresponding to paragraph "0339" of US2015/004533A), the content of which is incorporated herein by reference. In addition, specific preferable examples include the following compounds, but the present invention is not limited thereto.
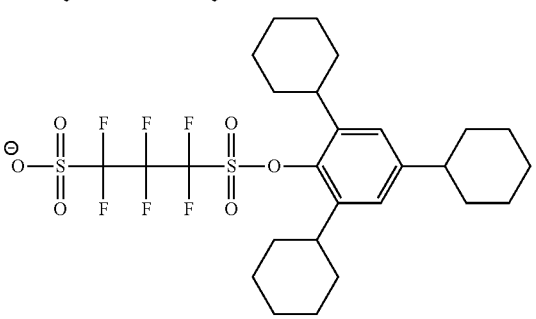
(z1)
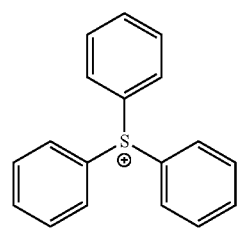
(z2)
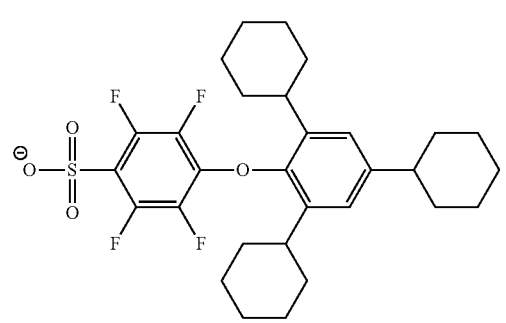
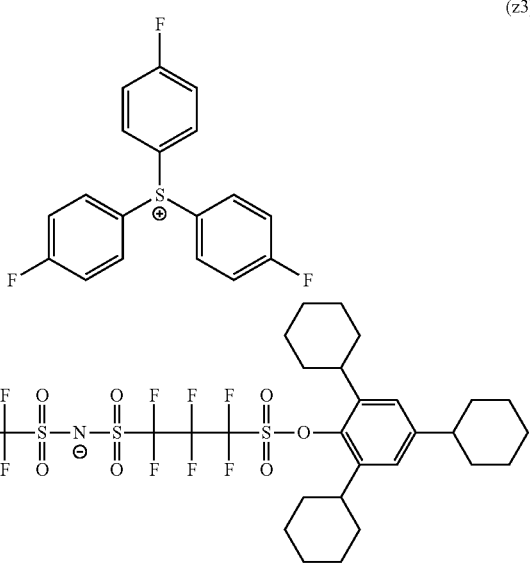
(z3)
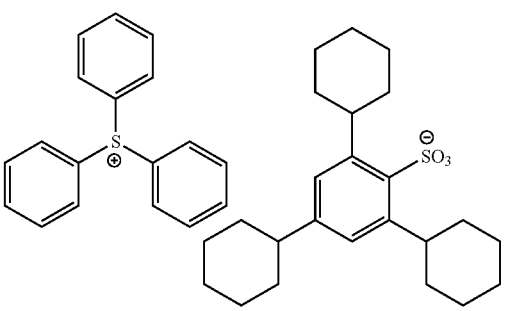
(z4)
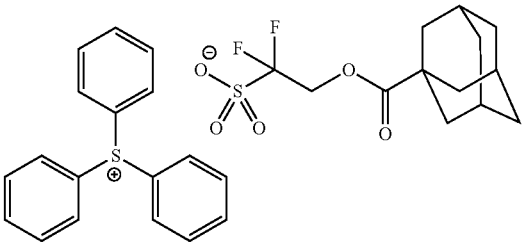
(z5)
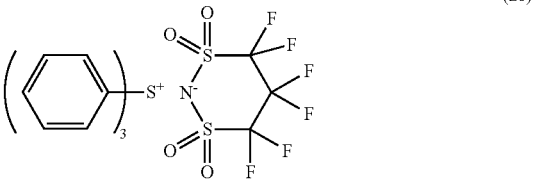
(z6)
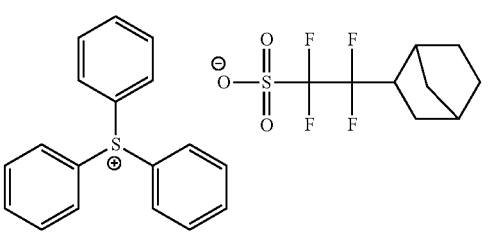
(z7)

(z8)
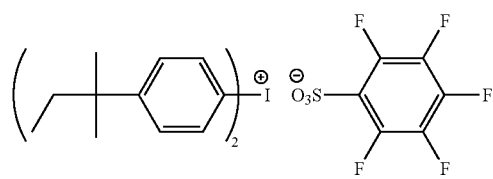
(z9)
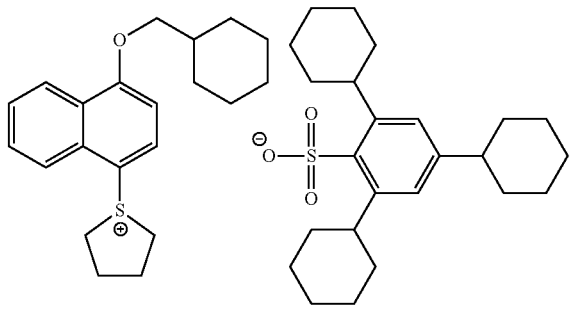
(z10)
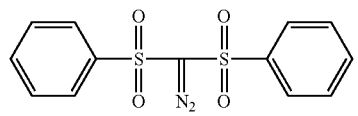
(z11)
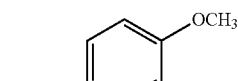
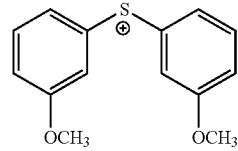
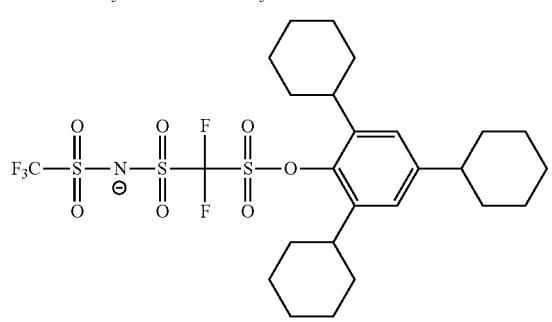
(z12)
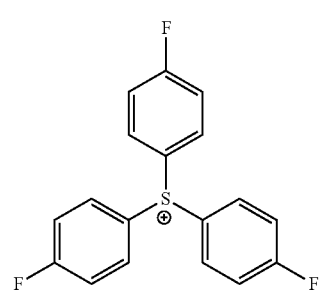
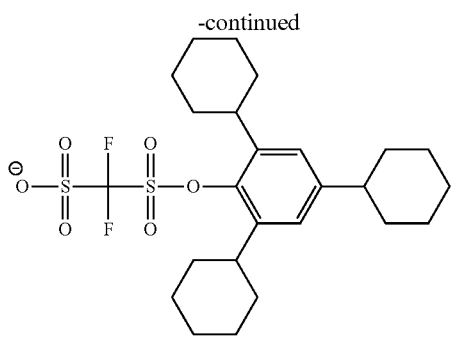
(z13)
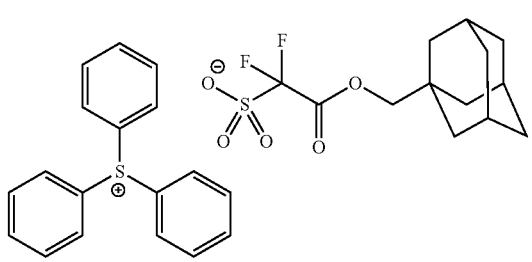
(z14)
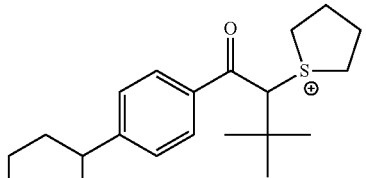
(z15)
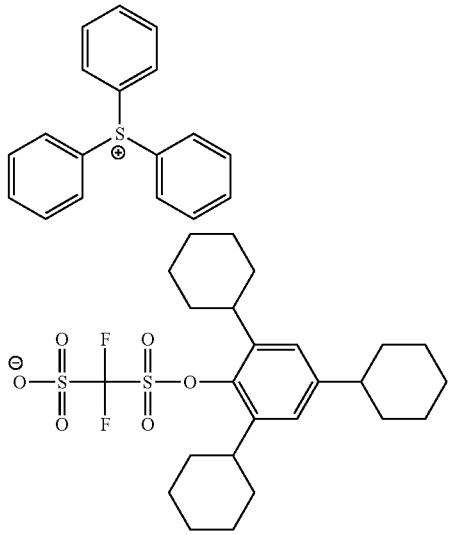

(z16) 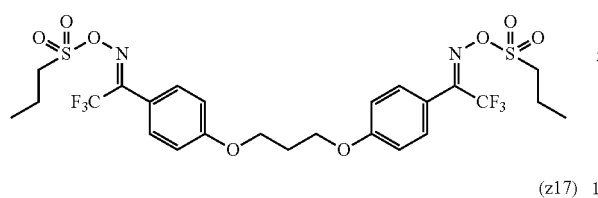
(z17) 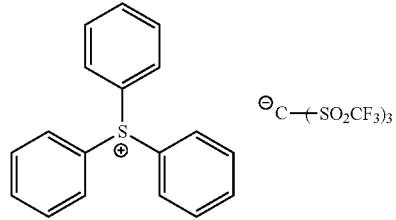
(z18) 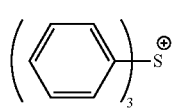 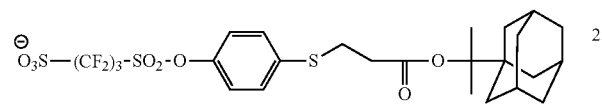
(z19) 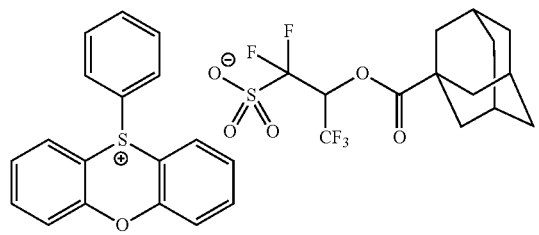
(z20) 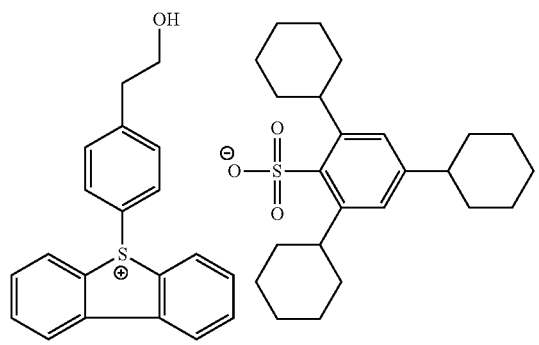
(z21) 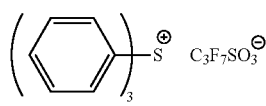
(z22) 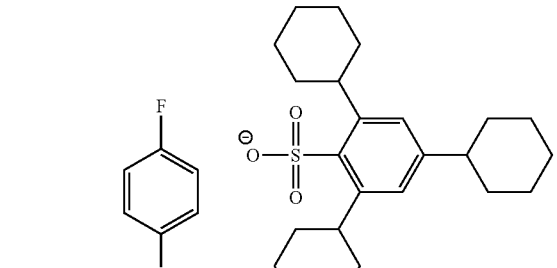
(z23) 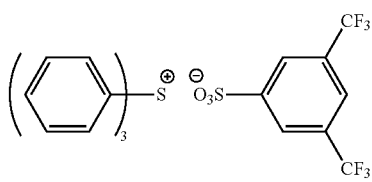
(z24) 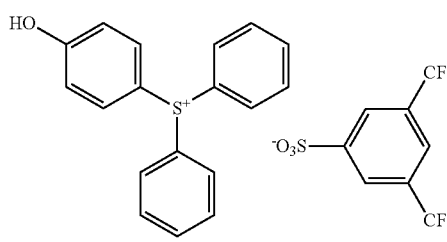
(z25) 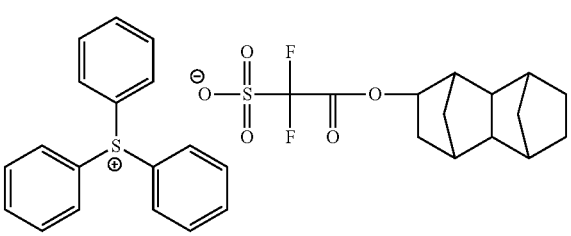
(z26) 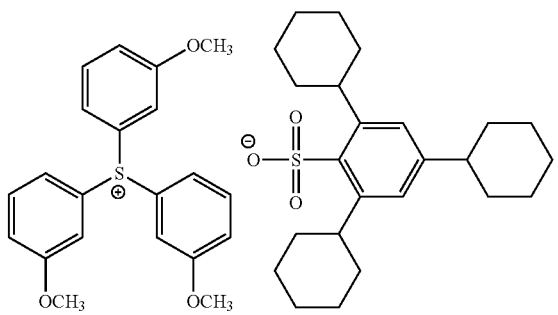
(z27) 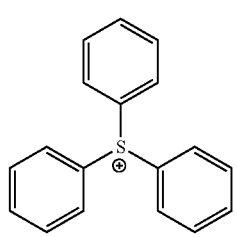

-continued
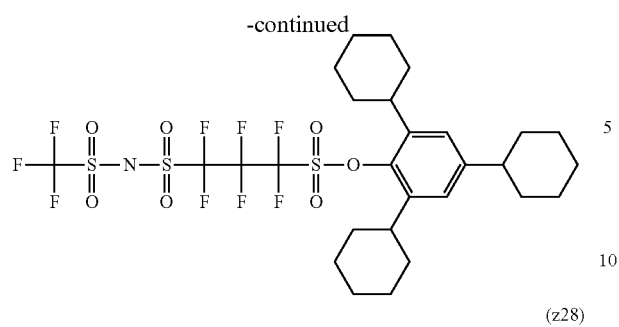
(z28)
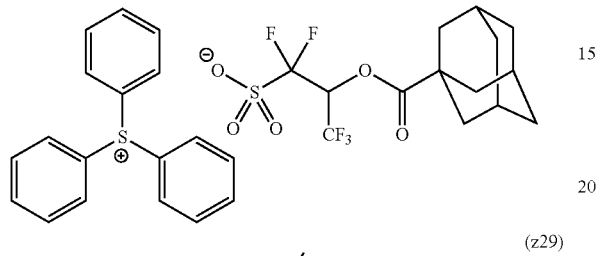
(z29)
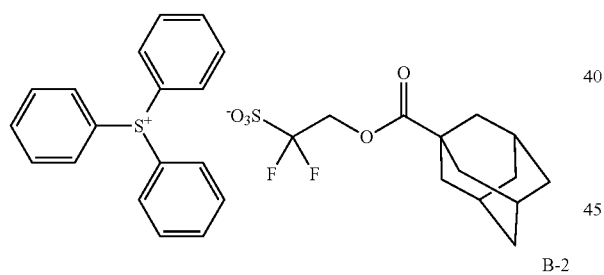
(z30)
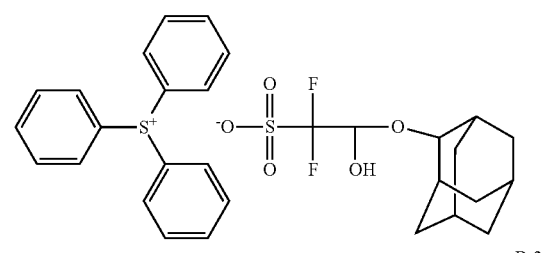
B-1
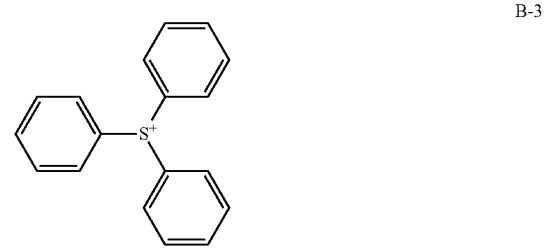
B-2
-continued
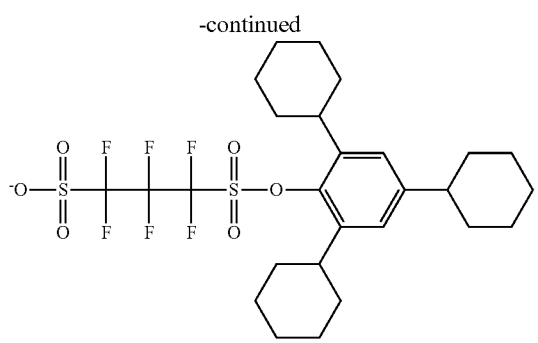
B-4
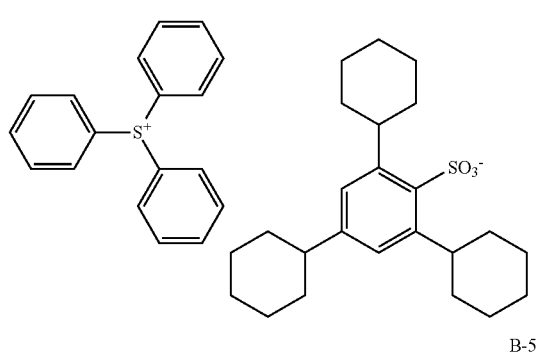
B-5
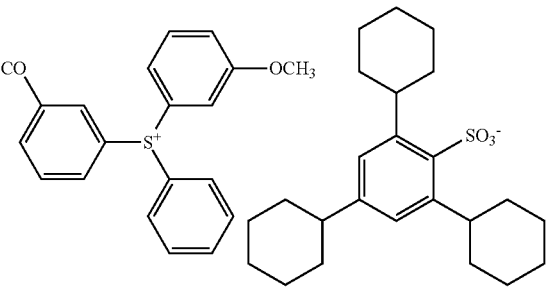
B-6
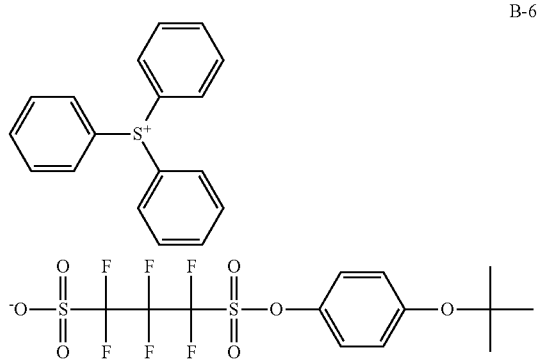
B-3
B-7

-continued

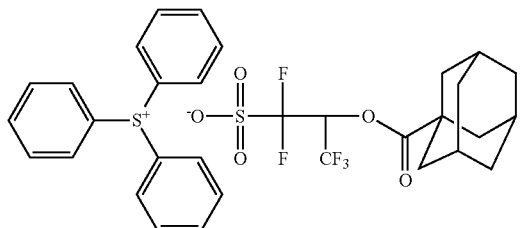
B-8

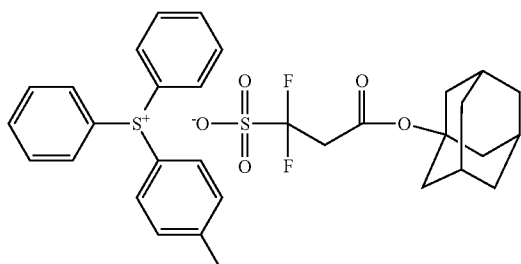
B-9

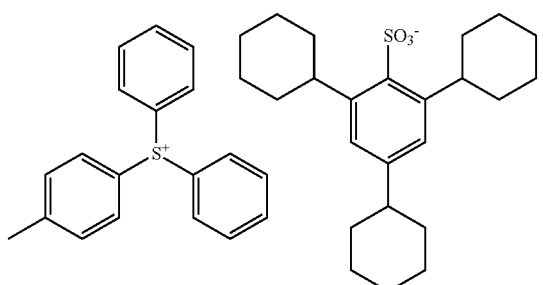
B-10

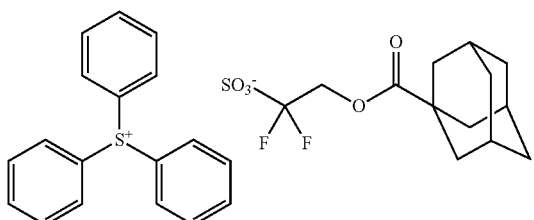
B-11

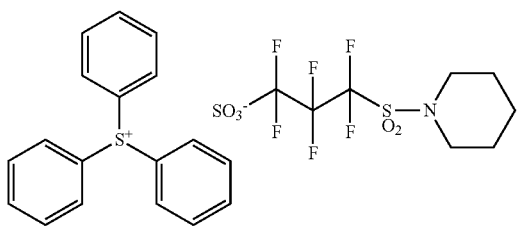
B-12

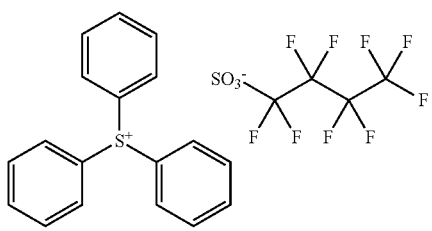
B-13

As the photoacid generator, one kind may be used alone, or two or more kinds may be used in combination.

The content of the photoacid generator in the actinic ray-sensitive or radiation-sensitive resin composition is preferably 0.1 to 50 mass %, more preferably 5 to 50 mass %, and still more preferably 8 to 40 mass % with respect to the total solid content of the composition. In particular, in order to simultaneously realize high sensitivity and high resolution during irradiation of an electron beam or an extreme ultraviolet ray, the content of the photoacid generator is preferably high, more preferably 10 to 40 mass %, and still more preferably 10 to 35 mass %.

(C) Solvent

In order to dissolve the respective components to prepare the actinic ray-sensitive or radiation-sensitive resin composition, a solvent can be used. Examples of the solvent used include an organic solvent such as alkylene glycol monoalkyl ether carboxylate, alkylene glycol monoalkyl ether, alkyl lactate, alkyl alkoxy propionate, cyclic lactone having 4 to 10 carbon atoms, a monoketone compound having 4 to 10 carbon atoms which may include a ring, alkylene carbonate, alkyl alkoxy acetate, or alkyl pyruvate. As the solvent used in the present invention, a solvent in which the concentration of an inorganic ion such as a sulfate ion, a chloride ion, or a nitrate ion and the concentration of Fe, Cu, and Zn as the target metals are reduced can be used, and it is more preferable that the solvent is further purified for use.

Preferable examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferable examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferable examples of the alkyl lactate include methyl lactate, ethyl lactate, propyl lactate, and butyl lactate.

Preferable examples of the alkyl alkoxy propionate include ethyl 3-ethoxypropionate, methyl 3-methoxypropionate, methyl 3-ethoxypropionate, and ethyl 3-methoxypropionate.

Preferable examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferable examples of the monoketone compound having 4 to 10 carbon atoms which may include a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferable examples of the alkylene carbonate include propylene carbonate, vinylene carbonate, ethylene carbonate, and butylene carbonate.

Preferable examples of the alkyl alkoxy acetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferable examples of the alkyl pyruvate include methyl pyruvate, ethyl pyruvate, and propyl pyruvate.

Preferable examples of the solvent which can be used include a solvent having a boiling point of 130° C. or higher at a normal temperature under a normal pressure. Specific examples of the solvent include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

In the present invention, as the solvent, one kind may be used alone, or two or more kinds may be used in combination.

In the present invention, as the organic solvent, a mixed solvent in which a solvent having a hydroxyl group in a structure is mixed with a solvent having no hydroxyl group may be used.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Among these, propylene glycol monomethyl ether or ethyl lactate is preferable.

Examples of the solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Among these, propylene glycol monomethyl ether acetate, ethyl ethoxypropionate, 2-heptanone, γ-butyrolactone, cyclohexanone, or butyl acetate is more preferable, and propylene glycol monomethyl ether acetate, ethyl ethoxypropionate, 2-heptanone is most preferable.

A mixing ratio (mass) of the solvent having a hydroxyl group to the solvent having no hydroxyl group is preferably 1/99 to 99/1, more preferably 10/90 to 90/10, and still more preferably 20/80 to 60/40 by mass. In particular, a mixed solvent including 50 mass % or higher of the solvent having no hydroxyl group is preferable from the viewpoint of coating uniformity.

It is preferable that the solvent is a mixed solvent including two or more propylene glycol monomethyl ether acetates.

As the solvent, for example, a solvent described in paragraphs "0013" to "0029" of JP2014-219664A can also be used.

(D) Basic Compound

In order to reduce a change in performance with the lapse of time from exposure to heating, it is preferable that the actinic ray-sensitive or radiation-sensitive resin composition includes a basic compound (D).

Preferable examples of the basic compound (D) include compounds having structures represented by the following Formulae (A) to (E).

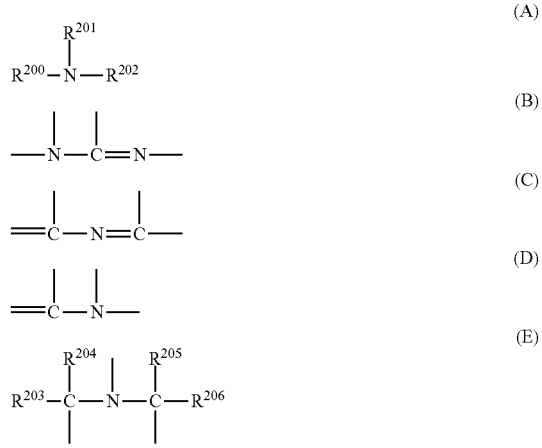

In Formulae (A) and (E), $R^{200}$, $R^{201}$, and $R^{202}$ may be the same as or different from each other and each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms). Here, $R^{201}$ and $R^{202}$ may be bonded to each other to form a ring.

As the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other and each independently represent an alkyl group having 1 to 20 carbon atoms.

It is more preferable that the alkyl group in the Formulae (A) and (E) is unsubstituted.

Examples of a preferable compound include guanidine, aminopyrrolidine, pyrazole, pyrazoline, piperazine, aminomorpholine, aminoalkylmorpholine, and piperidine. Examples of a more preferable compound include a compound having an imidazole structure, a diazabicyclo structure, an onium hydroxide structure, an onium carboxylate structure, a trialkylamine structure, an aniline structure, or a pyridine structure, an alkylamino derivative having a hydroxyl group and/or an ether bond, and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]nona-5-ene, and 1,8-diazabicyclo[5,4,0]undeca-7-ene. As the compound having an onium hydroxide structure, for example, triarylsulfonium hydroxide, phenacyl sulfonium hydroxide, or sulfonium hydroxide having a 2-oxoalkyl group can be used, and specific examples thereof include triphenylsulfonium hydroxide, tris(t-butylphenyl) sulfonium hydroxide, bis(t-butylphenyl)iodonium hydroxide, phenacyl thiophenium hydroxide, and 2-oxopropylthiophenium hydroxide. As the compound having an onium carboxylate structure, for example, a compound obtained by carboxylation of the anion site of a compound having an omnium hydroxide structure can be used, and examples thereof include acetate, adamantane-1-carboxylate, and perfluoroalkyl carboxylate. Examples of the compound having trialkylamine structure include tri-(n-butyl)amine and tri-(n-octyl)amine. Examples of the compound having an aniline structure include 2,6-diisopropylaniline, N,N-dimethylaniline, N,N-dibutylaniline, and N,N-dihexylaniline. Examples of the alkylamino derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Other preferable examples of the basic compound include an amine compound having a phenoxy group and an ammonium salt compound having a phenoxy group.

As the amine compound, a primary, secondary, or tertiary amine compound can be used, and an amine compound in which at least one alkyl group is bonded to a nitrogen atom is preferable. It is more preferable that the amine compound is a tertiary amine compound. In the amine compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the amine compound has an oxygen atom at an alkyl chain to form an oxyalkylene group. The number of oxyalkylene groups is 1 or more, preferably 3 to 9, and still more preferably 4 to 6 in a molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. In the ammonium salt compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the ammonium salt compound has an oxygen atom at an alkyl chain to form an oxyalkylene group. The number of oxyalkylene groups is 1 or more, preferably 3 to 9, and still more preferably 4 to 6 in a molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

Examples of an anion of the ammonium salt compound include a halogen atom, a sulfonate, a borate, and a phosphate. Among these, a halogen atom or a sulfonate is preferable. As the halogen atom, a chloride, a bromide, or an iodide is preferable. As the sulfonate, an organic sulfonate having 1 to 20 carbon atoms is preferable. Examples of the organic sulfonate include an alkyl sulfonate having 1 to 20 carbon atoms and an aryl sulfonate. The alkyl group of the alkyl sulfonate may have a substituent, and examples of the substituent include fluorine, chlorine, bromine, an alkoxy group, an acyl group, and an aryl group. Specific examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate. Examples of the aryl group of the aryl sulfonate include a benzene ring, a naphthalene ring, and an anthracene ring. The benzene ring, the naphthalene ring, and the anthracene ring may have a substituent. As the substituent, a linear or branched alkyl group having 1 to 6 carbon atoms or a cycloalkyl group having 3 to 6 carbon atoms is preferable. Specific examples of the linear or branched alkyl group and the cycloalkyl group include methyl, ethyl, n-propyl, isopropyl, n-butyl, i-butyl, t-butyl, n-hexyl, and cyclohexyl. Other examples of the substituent include an alkoxy group having 1 to 6 carbon atoms, a halogen atom, cyano, nitro, an acyl group, and an acyloxy group.

The amine compound having a phenoxy group or the ammonium salt compound having a phenoxy group denotes an amine compound or an ammonium salt compound having a phenoxy group at a terminal of an alkyl group opposite to a nitrogen atom. The phenoxy group may have a substituent. Examples of the substituent of the phenoxy group include an alkyl group, an alkoxy group, a halogen atom, a cyano group, a nitro group, a carboxyl group, a carboxylate group, a sulfonate group, an aryl group, an aralkyl group, an acyloxy group, and an aryloxy group. The substitution position of the substituent may be any one of the 2- to 6-position. The number of substituents is 1 to 5.

It is preferable that at least one oxyalkylene group is present between a phenoxy group and a nitrogen atom. The number of oxyalkylene groups is 1 or more, preferably 3 to 9, and still more preferably 4 to 6 in a molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

The amine compound having a phenoxy group can be obtained by heating a primary or secondary amine having a phenoxy group and haloalkyl ether to react with each other, adding an aqueous solution of a strong base such as sodium hydroxide, potassium hydroxide, or tetraalkylammonium to the obtained reaction product, and performing extraction with an organic solvent such as ethyl acetate or chloroform. Alternatively, the amine compound having a phenoxy group can be obtained by heating a primary or secondary amine and haloalkyl ether having a phenoxy group at a terminal to react with each other, adding an aqueous solution of a strong base such as sodium hydroxide, potassium hydroxide, or tetraalkylammonium to the obtained reaction product, and performing extraction with an organic solvent such as ethyl acetate or chloroform.

(Compound (PA) Having Proton-Accepting Functional Group which is Decomposed to Generate Compound in which Proton Accepting Properties Deteriorate, Disappear, or Change to Acidic Properties when Irradiated with Actinic Ray or Radiation)

The composition according to the present invention may further include, as a basic compound, a compound [hereinafter, also referred to as "compound (PA)"] having a proton-accepting functional group which is decomposed to generate a compound in which proton accepting properties deteriorate, disappear, or change to acidic properties when irradiated with an actinic ray or radiation.

The proton-accepting functional group denotes a functional group having a group or an electron which can electrostatically interact with a proton, for example, a functional group which has a macrocyclic structure such as cyclic polyether or a functional group which has a nitrogen atom having an unshared electron pair not contributing to π-conjugation. Examples of the nitrogen atom having an unshared electron pair not contributing to π-conjugation include a nitrogen atom having a partial structure represented by the following formula.

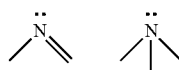

wherein "‥" represents an unshared electron pair.

Preferable examples of a partial structure of the proton-accepting functional group include crown ether, azacrown ether, primary to tertiary amine, pyridine, imidazole, and a pyrazine structure.

The compound (PA) is decomposed to generate a compound in which proton accepting properties deteriorate, disappear, or change to acidic properties when irradiated with an actinic ray or radiation. Here, proton accepting properties deteriorating, disappearing, or changing to acidic properties represents a change in proton accepting properties caused by adding a proton to the proton-accepting functional group, and specifically represents that, when a proton adduct is generated using the compound (PA) having a proton-accepting functional group and a proton, an equilibrium constant in the equilibrium constant is reduced.

Specific examples of the compound (PA) include the following compounds. Further, specific examples of the compound (PA) include compounds described in paragraphs "0421" to "0428" of JP2014-41328A and paragraphs "0108" to "0116" of JP2014-134686A, the content of which is incorporated herein by reference.

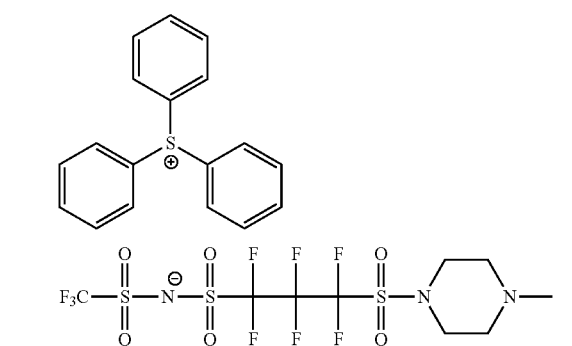
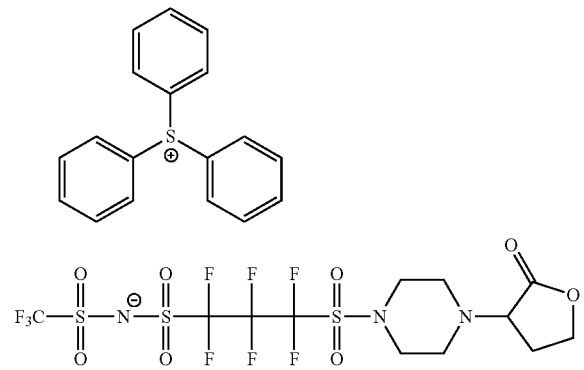
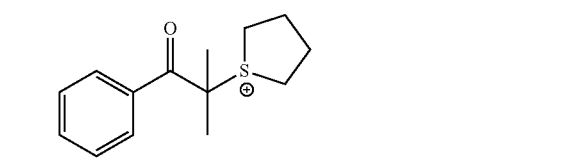
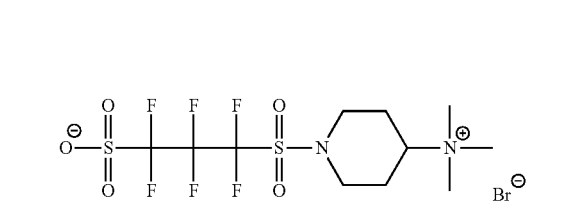

-continued

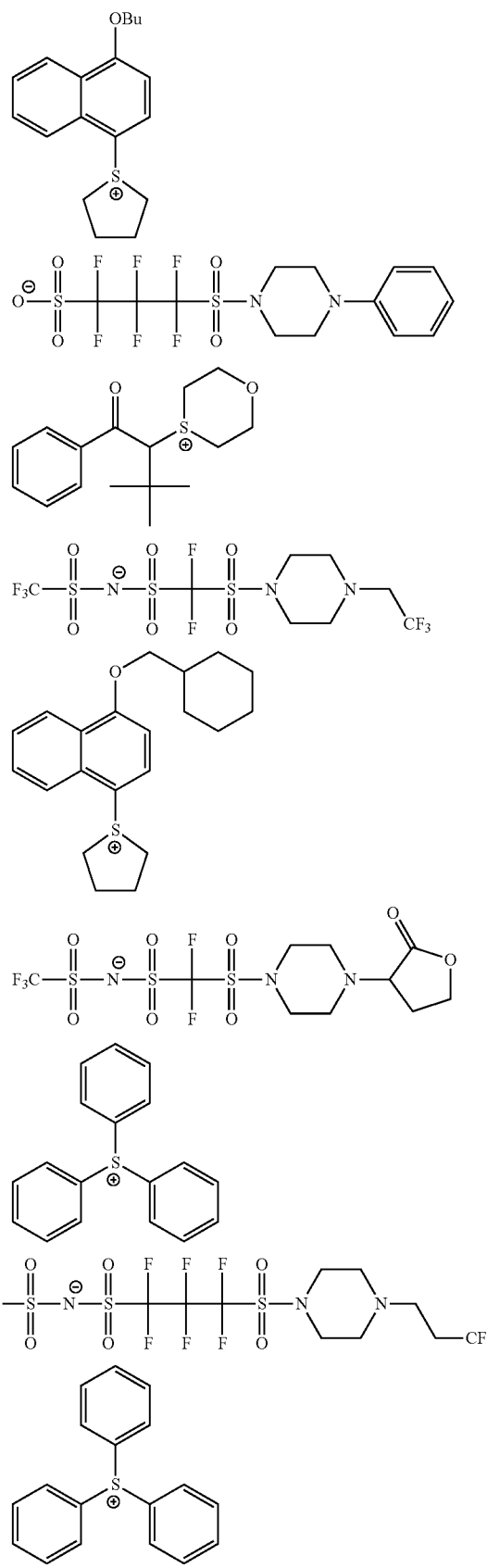

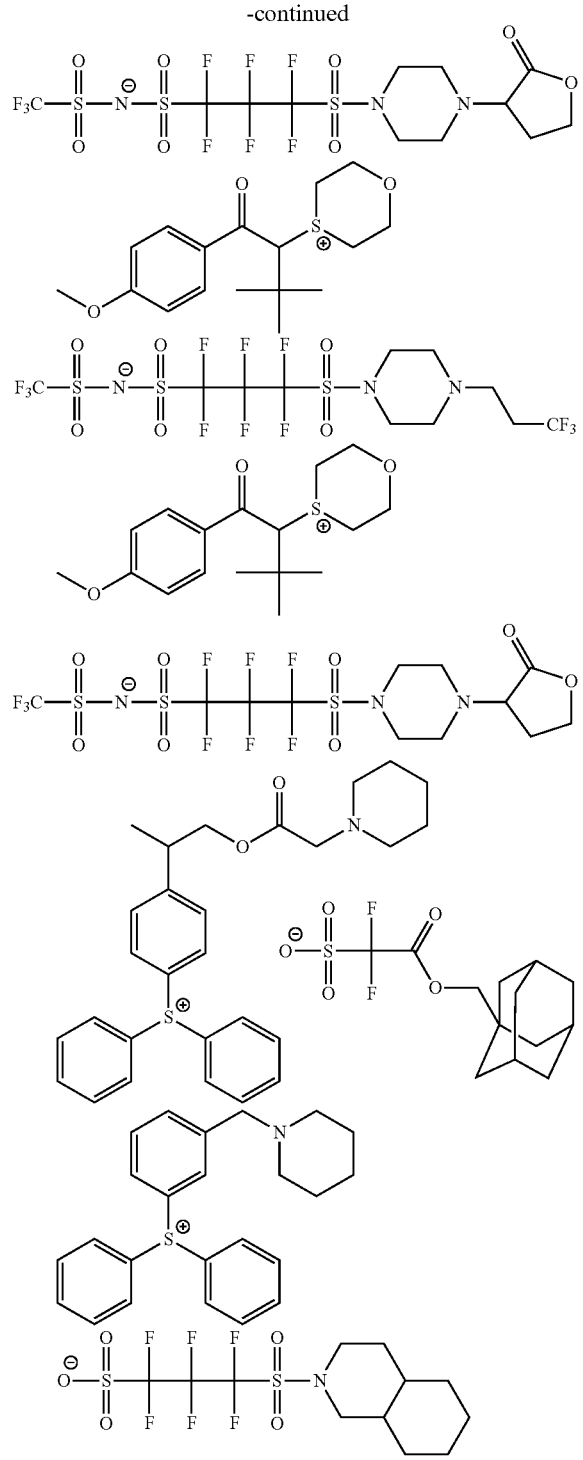

Among the basic compounds, one kind may be used alone, or two or more kinds may be used in combination.

The amount of the basic compound used is typically 0.001 to 10 mass % and preferably 0.01 to 5 mass % with respect to the solid content of the actinic ray-sensitive or radiation-sensitive composition.

It is preferable that a ratio (molar ratio; photoacid generator/basic compound) of the photoacid generator used to the basic compound used in the composition is 2.5 to 300. That is, the molar ratio is preferably 2.5 or higher from the viewpoints of sensitivity and resolution, and is preferably 300 or lower from the viewpoint of suppressing deterioration in resolution caused by thickening of a resist pattern with the lapse of time until a heating treatment after exposure. The molar ratio (photoacid generator/basic compound) is more preferably 5.0 to 200 and still more preferably 7.0 to 150.

As the basic compound, for example, a compound (for example, an amine compound, an amido group-containing compound, a urea compound, or a nitrogen-containing heterocyclic compound) described in paragraphs "0140" to "0144" of JP2013-11833A can be used.

(A') Hydrophobic Resin

The actinic ray-sensitive or radiation-sensitive resin composition may include a hydrophobic resin (A') in addition to the resin (A).

It is preferable that the hydrophobic resin is designed to be localized on a surface of a resist film. Unlike the surfactant, the hydrophobic resin does not necessarily have a hydrophilic group in a molecule and does not necessarily contribute to uniform mixing with a polar/non-polar material.

Examples of an effect obtained by the addition of the hydrophobic resin include an effect of suppressing a static/dynamic contact angle of a resist film surface with respect to water and an effect of suppressing out gas.

From the viewpoint of localization on the film surface layer, the hydrophobic resin includes preferably one or more kinds and more preferably two or more kinds among "a fluorine atom", "a silicon atom", and "a $CH_3$ partial structure included in a side chain of the resin". In addition, it is preferable that the hydrophobic resin includes a hydrocarbon group having 5 or more carbon atoms. These groups may be present at a main chain of the resin or may be substituted with a side chain.

In a case where the hydrophobic resin includes a fluorine atom and/or a silicon atom, the fluorine atom and/or the silicon atom in the hydrophobic resin may be present at a main chain or a side chain of the resin.

In a case where the hydrophobic resin includes a fluorine atom, it is preferable that a partial structure having a fluorine atom is a resin that has an alkyl group having a fluorine atom, a cycloalkyl group having a fluorine atom, or an aryl group having a fluorine atom.

The alkyl group having a fluorine atom (preferably having 1 to 10 carbon atoms and more preferably having 1 to 4 carbon atoms) is a linear or branched alkyl group in which at least one hydrogen atom is substituted with a fluorine atom and may further have a substituent other than a fluorine atom.

The cycloalkyl group having a fluorine atom is a monocyclic or polycyclic cycloalkyl group in which at least one hydrogen atom is substituted with a fluorine atom and may further have a substituent other than a fluorine atom.

Examples of the aryl group having a fluorine atom include an aryl group, such as a phenyl group or a naphthyl group, in which at least one hydrogen atom is substituted with a fluorine atom. The aryl group having a fluorine atom may further have a substituent other than a fluorine atom.

Examples of a repeating unit having a fluorine atom or a silicon atom include a repeating unit described in paragraph "0519" of US2012/0251948A1.

In addition, as described above, it is preferable that the hydrophobic resin includes a $CH_3$ partial structure at a side chain.

Here, examples of the $CH_3$ partial structure included at a side chain of the hydrophobic resin include a $CH_3$ partial structure such as an ethyl group or a propyl group.

On the other hand, a methyl group (for example, an α-methyl group of a repeating unit having a methacrylic acid structure) which is directly bonded to a main chain of the hydrophobic resin has little contribution to the surface localization of the hydrophobic resin caused by the effect of the main chain, and thus is not included in examples of the $CH_3$ partial structure according to the present invention.

The details of the hydrophobic resin can be found in paragraphs "0348" to "0415" of JP2014-010245A, the content of which is incorporated herein by reference.

As the hydrophobic resin, resins described in JP2011-248019A, JP2010-175859A, and JP2012-032544A can also be preferably used.

(E) Surfactant

The actinic ray-sensitive or radiation-sensitive resin composition may further include a surfactant (E). By the actinic ray-sensitive or radiation-sensitive composition including the surfactant, particularly in a case where an exposure light source having a wavelength of 250 nm or shorter, in particular, 220 nm or shorter is used, a pattern having adhesiveness and reduced development defects can be formed with high sensitivity and resolution.

As the surfactant, a fluorine surfactant and/or a silicon surfactant is preferably used.

Examples of the fluorine surfactant and/or the silicon surfactant include surfactants described in paragraph "0276" of US2008/0248425A. In addition, F-TOP EF301 or EF303 (manufactured by Shin-akita Chemical Co., Ltd.); FLUORAD FC430, 431 or 4430 (manufactured by Sumitomo 3M Ltd.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); F-TOP EF121, EF122A, EF122B, RF122C, EF125M, EF135M, EF351, EF352, EF801, EF802, or EF601 (manufactured by Gemco Inc.); PF636, PF656, PF6320, or PF6520 (manufactured by OMNOVA Corp.); or FTX-204G, 208G, 218G, 230G, 204D, 208D, 212D, 218D, or 222D (manufactured by Neos Co., Ltd.) may be used.

A polysiloxane polymer KP-341 (manufactured by Shin-Etsu Chemical Co., Ltd.) can also be used as the silicon surfactant.

In addition, in addition to the above-described surfactants, a surfactant may be synthesized using a fluoro aliphatic compound manufactured using a telomerization method (also referred to as a telomer method) or an oligomerization method (also referred to as an oligomer method). Specifically, a polymer including a fluoro aliphatic group derived from fluoro aliphatic compound may be used as the surfactant. This fluoro aliphatic compound can be synthesized, for example, using a method described in JP2002-90991A.

In addition, a surfactant other than a fluorine surfactant and/or a silicon surfactant which is described in paragraph "0280" of US2008/0248425A may be used.

Among these surfactants, one kind may be used alone, or two or more kinds may be used in combination.

In a case where the actinic ray-sensitive or radiation-sensitive resin composition includes the surfactant, the content of the surfactant is preferably 0 to 2 mass %, more preferably 0.0001 to 2 mass %, and still more preferably 0.0005 to 1 mass % with respect to the total solid content of the composition.

(F) Other Additives

The actinic ray-sensitive or radiation-sensitive resin composition may further include a dissolution inhibiting compound, a dye, a plasticizer, a photosensitizer, a light absorber, and/or a compound for promoting solubility in the developer (for example, a phenol compound having a molecular weight of 1000 or lower, or an aliphatic or alicyclic compound having a carboxy group).

The actinic ray-sensitive or radiation-sensitive resin composition may further include a dissolution inhibiting compound.

Here, "dissolution inhibiting compound" denotes a compound having a molecular weight of 3000 or lower which is decomposed by the action of an acid such that the solubility in the organic developer decreases.

[Upper Layer Film (Top Coat Film)] In the pattern forming method according to the present invention, an upper layer film (top coat film) may be formed over the resist film.

It is preferable that the upper layer film is not mixed with the resist film and is uniformly formed above the resist film.

The upper layer film is not particularly limited, and well-known upper layer film of the related art can be formed using a well-known method of the related art. For example, the upper layer film can be formed based on the description of paragraphs "0072" to "0082" of JP2014-059543A. As a material forming the upper layer film, for example, a polymer described in paragraph "0072" of JP2014-059543A or a hydrophobic resin can be used. As the hydrophobic resin, for example, the above-described hydrophobic resin (A') can be used.

In a case where the developer including the organic solvent is used in the development step, it is preferable that, for example, an upper layer film including a basic compound described in JP2013-61648A is formed on the resist film. Specific examples of the basic compound which may be included in the upper layer film include a basic compound (E) described below.

In addition, it is preferable that the upper layer film includes a compound which includes at least one group or one bond selected from the group consisting of an ether bond, a thioether bond, a hydroxyl group, a thiol group, a carbonyl bond, and an ester bond.

Further, the upper layer film may include a photoacid generator. As the photoacid generator, the same photoacid generator (for example, the above-described photoacid generator (B)) which may be included in the actinic ray-sensitive or radiation-sensitive composition can be used.

Hereinafter, a preferable resin which can be used in the upper layer film (top coat film) will be described.

(Resin)

It is preferable that the upper layer film-forming composition includes a resin. The resin which may be included in the upper layer film-forming composition is not particularly limited, and the same resin as the hydrophobic resin which may be included in the actinic ray-sensitive or radiation-sensitive composition (for example, the above-described hydrophobic resin (A')) can be used.

The details of the hydrophobic resin can be found in paragraphs "0017" to "0023" of JP2013-61647A (corresponding to paragraphs "0017" to "0023" of US2013/244438A) and in paragraphs "0016" to "0165" of JP2014-56194A, the content of which is incorporated herein by reference.

In the present invention, it is preferable that the upper layer film-forming composition includes a resin that includes a repeating unit having an aromatic ring. By the upper layer film-forming composition including the repeating unit having an aromatic ring, in particular, during exposure of an electron beam or an EUV ray, the generation efficiency of secondary electrons and the generation of efficiency of an acid from the compound which generates an acid by actinic ray or radiation are improved, and an effect of improving sensitivity and resolution during the formation of a pattern can be expected.

The weight-average molecular weight of the resin is preferably 3000 to 100000, more preferably 3000 to 30000, and most preferably 5000 to 20000. The mixing amount of the resin in the upper layer film-forming composition is preferably 50 to 99.9 mass %, more preferably 60 to 99.0 mass %, still more preferably 70 to 99.7 mass %, and even still more preferably 80 to 99.5 mass % with respect to the total solid content.

In a case where the upper layer film-forming composition (top coat composition) includes a plurality of resins, it is preferable that upper layer film-forming composition includes at least one resin (XA) having a fluorine atom and/or a silicon atom.

Regarding a preferable range of the content of the fluorine atom and the silicon atom included in the resin (XA), the content of a repeating unit having a fluorine atom and/or a silicon atom in the resin (XA) is preferably 10 to 100 mass %, preferably 10 to 99 mol %, and more preferably 20 to 80 mol %.

In addition, it is more preferable that the upper layer film-forming composition includes at least one resin (XA) having a fluorine atom and/or a silicon atom and a resin (XB) in which the content of a fluorine atom and/or a silicon atom is lower than that of the resin (XA). As a result, during the formation of the upper layer film, the resin (XA) is eccentrically present on the surface of the upper layer film. Therefore, the performance such as developing characteristics or followability of immersion liquid can be improved.

The content of the resin (XA) is preferably 0.01 to 30 mass %, more preferably 0.1 to 10 mass %, still more preferably 0.1 to 8 mass %, and even still more preferably 0.1 to 5 mass % with respect to the total solid content of the upper layer film-forming composition. The content of the resin (XB) is preferably 50.0 to 99.9 mass %, more preferably 60 to 99.9 mass %, still more preferably 70 to 99.9 mass %, and even still more preferably 80 to 99.9 mass % with respect to the total solid content of the upper layer film-forming composition.

It is preferable that the resin (XB) does not substantially include a fluorine atom and a silicon atom. In this case, specifically, the total content of a repeating unit having a fluorine atom and a repeating unit having a silicon atom is preferably 0 to 20 mol %, more preferably 0 to 10 mol %, still more preferably 0 to 5 mol %, even still more preferably 0 to 3 mol %, and ideally 0 mol % (that is, a fluorine atom and a silicon atom are not included) with respect to all the repeating units of the resin (XB).

<Method of Preparing Upper Layer Film-Forming Composition (Top Coat Composition)>

It is preferable that the respective components of the upper layer film-forming composition are dissolved in a solvent and are filtered through a filter. As the filter, a filter formed of polytetrafluoroethylene, polyethylene, or nylon and having a pore size of preferably 0.1 µm or less, more preferably 0.05 µm or less, and still more preferably 0.03 µm or less is preferable. A plurality of filters may be connected in series or in parallel. In addition, the composition may be filtered multiple times, and a step of filtering various materials multiple times may be a cycle filtration step. Further, before and after the filter filtration, degassing or the like may be performed on the composition. It is preferable that the upper layer film-forming composition does not include impurities such as metal. The content of the metal components in the materials is preferably 10 ppm or lower, more preferably 5 ppm or lower, and still more preferably 1 ppm or lower, and it is still most preferable that the materials do not substantially include the metal components (the measured value is lower than a detection limit value of a measuring device).

In a case where immersion exposure is performed in the <exposure step>, the upper layer film is disposed between the actinic ray-sensitive or radiation-sensitive film and functions as a layer that prevents direct contact between the actinic ray-sensitive or radiation-sensitive film and the immersion liquid. In this case, preferable characteristics of the upper layer film (upper layer film-forming composition) include suitability for application to the actinic ray-sensitive or radiation-sensitive film, transparency to radiation, particularly, light at 193 nm, and insolubility in the immersion liquid (preferably water). In addition, it is preferable that the upper layer film is uniformly applied to the surface of the actinic ray-sensitive or radiation-sensitive film without being mixed with the actinic ray-sensitive or radiation-sensitive film.

In order to uniformly apply the upper layer film-forming composition to the surface of the actinic ray-sensitive or radiation-sensitive film without dissolving the actinic ray-sensitive or radiation-sensitive film, it is preferable that the upper layer film-forming composition includes a solvent in which the actinic ray-sensitive or radiation-sensitive film is not soluble. As the solvent in which the actinic ray-sensitive or radiation-sensitive film is not soluble, it is more preferable that a solvent having different components from those of a developer (organic developer) including an organic solvent is used.

An application method of the upper layer film-forming composition is not particularly limited, and a spin coating method, a spray coating method, a roller coating method, or a dipping method that is well-known in the related art can be used.

The thickness of the upper layer film is not particularly limited, and from the viewpoint of transparency to an exposure light source, is typically 5 nm to 300 nm, preferably 10 nm to 300 nm, more preferably 20 nm to 200 nm, and still more preferably 30 nm to 100 nm.

After the formation of the upper layer film, the substrate is optionally heated (PB). From the viewpoint of resolution, it is preferable that the refractive index of the upper layer film is close to the refractive index of the actinic ray-sensitive or radiation-sensitive film.

It is preferable that the upper layer film is insoluble in the immersion liquid, and it is more preferable that the upper layer film is insoluble in water.

From the viewpoint of followability of immersion liquid, the receding contact angle (23° C.) of the immersion liquid on the upper layer film is preferably 50 to 100 degrees and more preferably 80 to 100 degrees.

During the immersion exposure, it is necessary that the immersion liquid moves on a wafer following a movement of an exposure head that scans the wafer with high speed to form an exposure pattern. Therefore, the contact angle of the immersion liquid on the actinic ray-sensitive or radiation-sensitive film in a dynamic state is important, and it is preferable that the receding contact angle is in the above-described range in order to obtain higher resist performance.

In a case where the upper layer film is peeled, an organic developer may be used, or a peeling liquid may be separately used. As the peeling liquid, a solvent having low permeability to the actinic ray-sensitive or radiation-sensitive film is preferable. From the viewpoint that the peeling of the upper layer film and the development of the actinic ray-sensitive or radiation-sensitive film can be performed at the same time, it is preferable that the upper layer film can be peeled off using the organic developer. The organic developer used for peeling is not particularly limited as long as it can dissolve and remove a low exposure portion of the actinic ray-sensitive or radiation-sensitive film.

From the viewpoint of peeling the upper layer film using the organic developer, the dissolution rate of the upper layer film in the organic developer is preferably 1 to 300 nm/sec and more preferably 10 to 100 nm/sec.

Here, the dissolution rate of the upper layer film in the organic developer is a rate at which the film thickness is reduced when the upper layer film is formed and then is exposed to the developer. In the present invention, the dissolution rate is a rate when the upper layer film is dipped in butyl acetate at 23° C.

By adjusting the dissolution rate of the upper layer film in the organic developer to be 1 nm/sec or higher and preferably 10 nm/sec or higher, an effect of reducing the occurrence of development defects after developing the actinic ray-sensitive or radiation-sensitive film can be obtained. In addition, by adjusting the dissolution rate of the upper layer film in the organic developer to be 300 nm/sec or lower and preferably 100 nm/sec or lower, an effect of further improving the line edge roughness of a pattern after developing the actinic ray-sensitive or radiation-sensitive film can be obtained due to the effect of reduced uneven exposure during immersion exposure.

The upper layer film may be removed using another well-known developer, for example, an alkali aqueous solution. Specific examples of the alkali aqueous solution that can be used include an aqueous solution of tetramethylammonium hydroxide.

<Method of Manufacturing Semiconductor Device>

The present invention relates to a method of manufacturing an electronic device. In a pattern forming step of the method of manufacturing a semiconductor device according to the present invention, the treatment liquid according to the present invention may be used as any one of a developer, a rinsing liquid, and a pre-wet liquid as described above, or may be used as, for example, a peeling liquid for peeling a pattern as described below.

In a general method of manufacturing a semiconductor element, first, a gate insulating film formed of a high dielectric constant material (for example, $HfSiO_4$, $ZiO_2$, $ZiSiO_4$, $Al_2O_3$, $HfO_2$, or $La_2O_3$) or the like or a gate electrode layer formed of polysilicon or the like is formed on a silicon substrate (for example, an ion-implanted n-type or p-type silicon substrate) using a technique such as sputtering (etched layer forming step). Next, an actinic ray-sensitive or radiation-sensitive resin composition is applied to the formed gate insulating film or the formed gate electrode layer. A pattern is formed using the above-described pattern forming method, and a non-masked region is dry-etched or wet-etched by using this pattern as a mask (etching step). As a result, the gate insulating film, the gate electrode layer, or the like is removed. Next, in an ion implantation treatment (ion implantation step), an ionized p-type or n-type impurity element is implanted into the silicon substrate to form a p-type or n-type impurity implanted region (so-called a source/drain region). Next, optionally, after performing an ashing treatment (ashing step), a treatment of peeling the resist film remaining on the substrate is performed.

<Peeling Step>

In the method of manufacturing a semiconductor device according to the present invention, a peeling treatment is not particularly limited, a sheet type or a batch type can be performed. A sheet type is a method of treating wafers one by one. One embodiment of the sheet type is a method of spreading the treatment liquid all over the surface of the wafer using a spin coater and treating the wafer. The liquid temperature of a remover, the discharge amount of the remover, and the rotation speed of the wafer using the spin coater are selected as appropriate values according to the selection of a substrate as a target. In the embodiment, conditions for performing a resist peeling step are not particularly limited, and the sheet type peeling step is preferable. In the sheet type peeling step, a semiconductor substrate is transported or rotated in a predetermined direction, and a remover is brought into contact with the semiconductor substrate in this space by discharging, jetting, flowing, dropwise addition, or the like. Optionally, the remover may be sprayed while rotating the semiconductor substrate using a spin coater. On the other hand, in the batch type peeling step, a semiconductor substrate is dipped in a liquid bath containing a remover such that the semiconductor substrate and the remover come into contact with each other in the liquid bath. These peeling types may be selectively used depending on a structure or a material of an element. The temperature at which peeling is performed is not particularly limited and is preferably 35° C. or lower and more preferably 30° C. or lower. As long as the treatment liquid according to the present invention is present as a liquid at a relatively low temperature, the lower limit value of the temperature at which peeling is performed is not particularly limited, and is preferably 15° C. or higher from the viewpoint of throughput or the like during manufacturing. In the case of the sheet type treatment, the supply rate of the remover is not particularly limited and varies depending on the size of the substrate. For example, the supply rate is preferably 0.3 to 3 L/min and more preferably 0.5 to 2 L/min. By adjusting the supply rate to be the above-described lower limit value or higher, the in-plane uniformity can be secured, which is preferable. By adjusting the supply rate to be the above-described upper limit value or higher, stable performance can be secured during a continuous treatment, which is preferable. When the substrate is rotated, the rotation speed varies depending on the size of the substrate and, from the same viewpoint, is preferably 100 to 1000 rpm. "Temperature" described here refers to the surface temperature of a substrate to be treated in the case of the sheet type treatment, and refers to the liquid temperature of the remover in the case of the batch type treatment.

An electronic device that is manufactured using the method of manufacturing a semiconductor device according to the present invention can be suitably mounted on electric and electronic apparatuses (home electronics, apparatuses relating to office automation (OA) and media, optical apparatuses, and communication apparatuses).

EXAMPLES

Hereinafter, the present invention will be described in detail using Examples, but the scope of the present invention is not limited thereto.

In the following examples, all the preparation, storage, filling, analysis, and measurement of the treatment liquids were performed in a clean room satisfying a level of ISO Class 2 or lower.

Examples 1 to 48 and Comparative Examples 1 to 17

<Preparation and Storage of Treatment Liquid for Manufacturing Semiconductor>

Each of butyl acetate (nBA), N-methyl-2-pyrrolidone (NMP), isopropanol (IPA), ethanol, methyl isobutyl carbinol (MIBC), propylene glycol monomethyl ether (PGME), cyclohexanone (CyHx), γ-butyrolactone (GBL), ethyl lactate (EL), dimethyl sulfoxide (DMSO), isoamyl acetate (iAA), a mixed solution (PGMEA/PGME=7/3 (volume ratio)) of propylene glycol monomethyl ether acetate (PGMEA) and propylene glycol monomethyl ether (PGME), methyl 2-hydroxyisobutyrate (HBM), methyl ethyl ketone (MEK), and propylene carbonate (PC) was repeatedly purified using a distillation column having an inner wall formed of glass until the content of each of Fe, Cu, and Zn as the target metals was lower than 10 mass ppt with respect to the total mass of each of treatment liquids. As a result, each of the treatment liquids was obtained. In addition, a 2.38 mass % tetramethylammonium hydroxide (TMAH) aqueous solution was repeatedly purified using a well-known method. As a result, treatment liquids in which the content of each of Fe, Cu, and Zn as the target metals was lower than 10 mass ppt with respect to the total mass of each of treatment liquids were obtained.

Ultrapure water used in Examples was purified using a method described in JP2007-254168A and was used for adjusting the treatment liquid after verifying that the content of each of Fe, Cu, and Zn as the target metals was lower than 10 mass ppt with respect to the total mass of each of the treatment liquids.

The obtained various treatment liquids were filled into storage containers shown in Table 1 and were stored at 25° C. for 30 days. As a result, the various treatment liquids shown in Table 1: A1 to A26 (butyl acetate: nBA), A101 to A117 (butyl acetate), B (N-methyl-2-pyrrolidone: NMP), C1 and C2 (isopropanol: IPA), D (ethanol), E1 and E2 (methyl isobutyl carbinol: MIBC), F1 to F4 (2.38 mass % TMAH aqueous solution), G (PGME), H (cyclohexanone: CyHx), I (γ-butyrolactone: GBL), J (ethyl lactate: EL), K (dimethyl sulfoxide: DMSO), L (isoamyl acetate: iAA), M1 and M2 (PGMEA/PGME (volume ratio=7/3)), N (methyl 2-hydroxyisobutyrate: HBM), O (methyl ethyl ketone: MEK), and P (propylene carbonate: PC) were obtained.

<Storage Container>

As the storage container, each of the storage containers shown in Table 1 was used after cleaning the inner wall of the storage portion using each of cleaning liquids shown in Table 1.

[Storage Container]

The storage containers shown in Table 1 are as follows.

PE: storage container in which an inner wall of a storage portion was formed of polyethylene (PE)

PP: storage container in which an inner wall of a storage portion was formed of polypropylene (PP)

PTFE: storage container in which an inner wall of a storage portion was formed of polytetrafluoroethylene (PTFE)

PTFE Coating: storage container in which an inner wall of a storage portion was coated with PTFE PFA: storage container in which an inner wall of a storage portion was formed of perfluoroalkoxy alkane (PFA)

Electropolished Stainless Steel: storage container in which an inner wall of a storage portion was formed of electropolished stainless steel (SUS316L)

Buffed Stainless Steel: storage container in which an inner wall of a storage portion was formed of buffed stainless steel (SUS316L)

Electropolished HASTELLOY: storage container in which an inner wall of a storage portion was formed of electropolished HASTELLOY Electropolished INCONEL: storage container in which an inner wall of a storage portion was formed of electropolished INCONEL Electropolished MONEL: storage container in which an inner wall of a storage portion was formed of electropolished MONEL

[Cleaning Liquid]

The cleaning liquids shown in Table 1 are as follows.

IPA: isopropyl alcohol (manufactured by Kanto Chemical Co., Inc./Grade: semiconductor grade)

DIW: ultrapure water (the LPC value* of particles having a diameter of 40 nm or more was 10 particles/mL or less)

Method of Measuring *LPC (Liquid Particle Counter) Value

The LPC value of DIW (ultrapure water) was obtained by counting the number of particles having a diameter of 40 nm or more in 10 mL of a liquid sample using a liquid particle counter (KS-18FX; manufactured by Rion Co., Ltd.) and calculating the number of particles in the liquid sample per 1 mL.

Cleaning liquid A: cleaning liquid obtained by diluting a cleaning liquid for a semiconductor (Pure Soft PS, manufactured by AS ONE Corporation) to 100 times with ultrapure water

[Contact Angle]

The contact angle of the cleaning liquid on the inner wall of the storage portion of the storage container was measured using the following method.

Device: DM-701 (manufactured by Kyowa Interface Science Co., Ltd.)

Measurement method: θ/2 method

A target liquid was dropped on a specimen having a size of 3 cm×3 cm and formed of the same material as the inner wall of the storage portion, and a contact angle θ was calculated from the shape of formed liquid droplet according to the θ/2 method.

The contact angle θ was obtained by obtaining the radius r and height h of the cleaning liquid 11 (liquid droplet) shown in FIG. 1 and substituting the obtained the radius r and height h into the following expression. In FIG. 1, reference numeral 12 represents the apex of the liquid droplet.

$$\tan \theta 1 = h/r \rightarrow \theta = 2 \arctan(h/r)$$

[Cleaning Method]

An opening of the storage portion of the storage container faced downward, each of the various cleaning liquids was jetted from the opening using a shower nozzle at a flow rate of 2 L/min for 1 minute to clean the storage container. Next, the container was sufficiently rinsed with ultrapure water and then was dried.

[Measurement of Ratio Cr/Fe]

The film formed of each of the materials used for the inner walls of the storage containers and having a well-known film thickness was etched. An etching rate of each of the materials was calculated based on the time at which the etching ended and the film thickness. Based on this etching rate, each of the inner wall materials was etched from the surface to a depth of 1 nm.

As detected elements during the etching, the concentrations of C, N, O, Cr, Fe, Ni, Mn, and S were evaluated. A ratio Cr/Fe was calculated based on the obtained concentrations (wt %). In addition, etching ESCA was performed using Quantera (manufactured by ULVAC-PHI, Inc.).

<Evaluation>

Regarding each of the treatment liquids A1 to A26 (butyl acetate), A101 to A117 (butyl acetate), B (NMP), C1 and C2 (IPA), D (ethanol), E1 and E2 (MIBC), F1 to F4 (2.38 mass % TMAH aqueous solution), G (PGME), H (CyHx), I (GBL), J (EL), K (DMSO), L (iAA), M1 and M2 (PGMEA/PGME (volume ratio=7/3)), N (HBM), O (MEK), and P (PC) shown in Table 1, the total metal amount and the content of particulate metal were measured using the following methods. In Table 1, "mass ppt" is a value with respect to the total mass of the treatment liquid.

In addition, regarding each of the treatment liquids A1 to A24, A101 to A117, B, C1 and C2, D, E, and F1 to F4, the defect performance was evaluated using the following method.

[Measurement of Total Metal Content and Particulate Metal Content (SP-ICP-MS Method)]

1) Preparation of Standard Material

Ultrapure water was weighed and charged into a clean glass container, and measurement target metal particles having a median size of 50 nm were added thereto such that the concentration was 10000 atoms/ml. Next, the solution was treated using an ultrasonic cleaning machine for 30 minutes to obtain a dispersion. This dispersion was used as a standard material for transport efficiency measurement.

2) SP-ICP-MS Device Used

Manufacturer: PerkinElmer

Model: NexION 350S

3) Measurement Conditions of SP-ICP-MS

In SP-ICP-MS, the measurement target liquid was aspirated at about 0.2 mL/min using a PFA coaxial nebulizer formed of PFA, a cyclonic spray chamber formed of quartz, and a torch injector having an inner diameter of 1 mm formed of quartz. The addition amount of oxygen was set as 0.1 L/min, the plasma power was set as 1600 W, and the inside of the cell was purged using ammonia gas. The temporal resolution was set as 50 μs for analysis.

The amount of ionic metal, the amount of particulate metal, and the total metal amount that is the sum of the amount of ionic metal and the amount of particulate metal were measured using the following analysis software manufactured by the manufacturers.

The amount of ionic metal and the amount of particulate metal: Syngistix Nano Application Module for "SP-ICP-MS", nanoparticle analysis Total metal amount: Syngistix for ICP-MS Software

[Measurement of Number of Defects]

Using a wafer surface inspection device (SP-5, manufactured by KLA-Tencor Corporation), the number of particles having a diameter of 32 nm or more present on a silicon substrate surface having a diameter of 300 mm was calculated. Next, this silicon substrate was set on a spin discharge device, and the prepared various treatment liquids were discharged to the surface of the silicon substrate at a flow rate of 1.5 L/min while rotating the silicon substrate. Next, the silicon wafer was rinsed and dried. Regarding the obtained sample, the number of particles present on the silicon substrate surface was measured again using the device (SP-5), and increased particles were selected. Regarding the selected particles, elemental analysis was performed using a defect review device (SEM Vision G6; manufactured by Applied Materials Inc.), and particles in which the target metals were detected were set as "defects". The obtained number of defects was evaluated based on the following standards. The results are shown in Table 1. In the following standards, the evaluation C represents that the performance of suppressing defects that is required for the treatment liquid for manufacturing a semiconductor is achieved.

A: the number of defects was 0 to 50
B: the number of defects was more than 50 and 100 or less
C: the number of defects was more than 100 and 500 or less
D: the number of defects was more than 500 and 1000 or less
E: the number of defects was more than 1000

TABLE 1

| | Treatment Liquid | Storage Container | Cr/Fe | Cleaning Liquid | Contact Angle Degree | Total Amount of Particulate Metal mass ppt | Defect Suppressing Performance |
|---|---|---|---|---|---|---|---|
| Example 1 | A1 | nBA | Electropolished Stainless Steel | 2 | DIW | 95 | 0.15 | A |
| Example 2 | A2 | nBA | Electropolished Stainless Steel | 2 | DIW | 95 | 5 | A |
| Example 3 | A3 | nBA | Electropolished Stainless Steel | 2 | DIW | 95 | 21 | B |
| Example 4 | A4 | nBA | Electropolished Stainless Steel | 2 | DIW | 95 | 22 | B |
| Example 5 | A5 | nBA | Electropolished Stainless Steel | 2 | DIW | 95 | 9 | A |
| Example 6 | A6 | nBA | Electropolished Stainless Steel | 2 | DIW | 95 | 17 | B |
| Example 7 | A7 | nBA | Electropolished Stainless Steel | 2 | DIW | 95 | 17 | B |
| Example 8 | A8 | nBA | Electropolished Stainless Steel | 2 | DIW | 95 | 17 | B |
| Example 9 | A9 | nBA | Electropolished Stainless Steel | 2 | DIW | 95 | 45 | B |
| Example 10 | A10 | nBA | Electropolished Stainless Steel | 2 | DIW | 95 | 7 | A |

TABLE 1-continued

| | | | | | | | | |
|---|---|---|---|---|---|---|---|---|
| Example 11 | A11 | nBA | Electropolished Stainless Steel | 2 | DIW | 95 | 52 | C |
| Example 12 | A12 | nBA | Electropolished Stainless Steel | 2 | DIW | 95 | 82 | C |
| Example 13 | A13 | nBA | Electropolished Stainless Steel | 2 | DIW | 95 | 9 | A |
| Example 14 | A14 | nBA | Electropolished Stainless Steel | 2 | DIW | 95 | 45 | B |
| Example 15 | A15 | nBA | Electropolished Stainless Steel | 2 | DIW | 95 | 9 | A |
| Example 16 | A16 | nBA | Electropolished Stainless Steel | 2 | DIW | 95 | 45 | B |
| Example 17 | B | NMP | Electropolished Stainless Steel | 2 | DIW | 95 | 4 | A |
| Example 18 | C1 | IPA | Electropolished Stainless Steel | 2 | DIW | 95 | 1 | A |
| Example 19 | C2 | IPA | Electropolished Stainless Steel | 2 | IPA | 25 | 1.22 | A |
| Example 20 | D | Ethanol | Electropolished Stainless Steel | 2 | DIW | 95 | 5 | A |
| Example 21 | E1 | MIBC | Electropolished Stainless Steel | 2 | DIW | 95 | 1 | A |
| Example 22 | F1 | TMAH | PE | | DIW | 90 | 0.19 | A |
| Example 23 | F2 | TMAH | PP | | DIW | 95 | 0.43 | A |
| Example 24 | F3 | TMAH | PTFE | | DIW | 108 | 0.06 | A |
| Example 25 | F4 | TMAH | PFA | | DIW | 75 | 0.04 | A |
| Example 26 | A17 | nBA | Electropolished Stainless Steel | 2 | DIW | 95 | 1.2 | A |
| Example 27 | A18 | nBA | Electropolished Stainless Steel | 2 | DIW | 95 | 1.12 | A |
| Example 28 | A19 | nBA | Electropolished Stainless Steel INCONEL | 2 | DIW | 85 | 4.47 | A |
| Example 29 | A20 | nBA | Electropolished Stainless Steel HASTELLOY | 2 | DIW | 85 | 2.77 | A |
| Example 30 | A21 | nBA | Electropolished Stainless Steel MONEL | 2 | DIW | 85 | 9.24 | A |
| Example 31 | A22 | nBA | Electropolished Stainless Steel | 2 | IPA | 25 | 11.8 | B |
| Example 32 | A23 | nBA | Electropolished Stainless Steel | 2 | Cleaning Liquid A | 9 | 1.4 | B |
| Example 33 | A24 | nBA | PTFE Coating | | DIW | 128 | 2 | B |
| Example 34 | A25 | nBA | Electropolished Stainless Steel | 1 | DIW | 95 | 0.15 | A |
| Example 35 | A26 | nBA | Electropolished Stainless Steel | 3 | DIW | 95 | 0.15 | A |
| Example 36 | A1 | nBA | Electropolished Stainless Steel | 4 | DIW | 95 | 0.15 | B |
| Example 37 | G | PGME | Electropolished Stainless Steel | 2 | DIW | 95 | 0.15 | A |
| Example 38 | H | CyHx | Electropolished Stainless Steel | 2 | DIW | 95 | 0.15 | A |
| Example 39 | I | GBL | Electropolished Stainless Steel | 2 | DIW | 95 | 0.15 | A |
| Example 40 | E2 | MIBC | Electropolished Stainless Steel | 2 | DIW | 95 | 0.15 | A |
| Example 41 | J | EL | Electropolished Stainless Steel | 2 | DIW | 95 | 0.15 | A |
| Example 42 | K | DMSO | Electropolished Stainless Steel | 2 | DIW | 95 | 0.15 | A |
| Example 43 | L | iAA | Electropolished Stainless Steel | 2 | DIW | 95 | 0.15 | A |
| Example 44 | M1 | PGMEA/ PGME | Electropolished Stainless Steel | 2 | DIW | 95 | 0.15 | A |
| Example 45 | N | HBM | Electropolished Stainless Steel | 2 | DIW | 95 | 0.15 | A |
| Example 46 | O | MEK | Electropolished Stainless Steel | 2 | DIW | 95 | 0.15 | A |
| Example 47 | P | PC | Electropolished Stainless Steel | 2 | DIW | 95 | 0.15 | A |
| Example 48 | M2 | GBL | Electropolished Stainless Steel | 2 | DIW | 95 | 0.15 | A |
| Comparative Example 1 | A101 | nBA | Electropolished Stainless Steel | 2 | DIW | 95 | 130 | D |
| Comparative Example 2 | A102 | nBA | Electropolished Stainless Steel | 2 | DIW | 95 | 130 | D |
| Comparative Example 3 | A103 | nBA | Electropolished Stainless Steel | 2 | DIW | 95 | 130 | D |
| Comparative Example 4 | A104 | nBA | Electropolished Stainless Steel | 2 | DIW | 95 | 360 | D |

TABLE 1-continued

| | | | | | | | |
|---|---|---|---|---|---|---|---|
| Comparative Example 5 | A105 | nBA | Electropolished Stainless Steel | 2 | DIW | 95 | 240 | D |
| Comparative Example 6 | A106 | nBA | Electropolished Stainless Steel | 2 | DIW | 95 | 430 | E |
| Comparative Example 7 | A107 | nBA | Electropolished Stainless Steel | 2 | DIW | 95 | 430 | E |
| Comparative Example 8 | A108 | nBA | Electropolished Stainless Steel | 2 | DIW | 95 | 430 | E |
| Comparative Example 9 | A109 | nBA | Electropolished Stainless Steel | 2 | DIW | 95 | 126 | D |
| Comparative Example 10 | A110 | nBA | Electropolished Stainless Steel | 2 | DIW | 95 | 430 | E |
| Comparative Example 11 | A111 | nBA | Electropolished Stainless Steel | 2 | DIW | 95 | 1,200 | E |
| Comparative Example 12 | A112 | nBA | Electropolished Stainless Steel | 2 | DIW | 95 | 126 | D |
| Comparative Example 13 | A113 | nBA | Electropolished Stainless Steel | 2 | DIW | 95 | 430 | E |
| Comparative Example 14 | A114 | nBA | Electropolished Stainless Steel | 2 | DIW | 95 | 1,200 | E |
| Comparative Example 15 | A115 | nBA | Electropolished Stainless Steel | 2 | DIW | 95 | 0.00 | D |
| Comparative Example 16 | A116 | nBA | Electropolished Stainless Steel | 2 | DIW | 95 | 0.00 | D |
| Comparative Example 17 | A117 | nBA | Buffed Stainless Steel | 0.8 | DIW | 78 | 103.4 | E |

| | | | Fe | | Cu | | Zn | | Total | |
|---|---|---|---|---|---|---|---|---|---|---|
| | | Treatment Liquid | Total Metal Amount mass ppt | Amount of Particulate Metal mass ppt | Total Metal Amount mass ppt | Amount of Particulate Metal mass ppt | Total Metal Amount mass ppt | Amount of Particulate Metal mass ppt | Sum of Total Metal Amounts mass ppt | Amount of Particulate Metal mass ppt |
| Example 1 | A1 | nBA | 1 | 0.1 | 1 | 0.03 | 0.3 | 0.02 | 2.3 | 0.15 |
| Example 2 | A2 | nBA | 50 | 3 | 10 | 1 | 10 | 1 | 70 | 5 |
| Example 3 | A3 | nBA | 50 | 10 | 50 | 9 | 10 | 2 | 110 | 21 |
| Example 4 | A4 | nBA | 10 | 2 | 50 | 11 | 50 | 9 | 110 | 22 |
| Example 5 | A5 | nBA | 50 | 3 | 50 | 3 | 50 | 3 | 150 | 9 |
| Example 6 | A6 | nBA | 200 | 15 | 10 | 1 | 10 | 1 | 220 | 17 |
| Example 7 | A7 | nBA | 10 | 1 | 200 | 15 | 10 | 1 | 220 | 17 |
| Example 8 | A8 | nBA | 10 | 1 | 10 | 1 | 200 | 15 | 220 | 17 |
| Example 9 | A9 | nBA | 200 | 15 | 200 | 15 | 200 | 15 | 600 | 45 |
| Example 10 | A10 | nBA | 150 | 5 | 15 | 1 | 15 | 1 | 180 | 7 |
| Example 11 | A11 | nBA | 500 | 50 | 15 | 1 | 15 | 1 | 530 | 52 |
| Example 12 | A12 | nBA | 1,000 | 80 | 15 | 1 | 15 | 1 | 1030 | 82 |
| Example 13 | A13 | nBA | 50 | 3 | 50 | 3 | 50 | 3 | 150 | 9 |
| Example 14 | A14 | nBA | 200 | 15 | 200 | 15 | 200 | 15 | 600 | 45 |
| Example 15 | A15 | nBA | 50 | 3 | 50 | 3 | 50 | 3 | 150 | 9 |
| Example 16 | A16 | nBA | 200 | 15 | 200 | 15 | 200 | 15 | 600 | 45 |
| Example 17 | B | NMP | 22 | 3.1 | 11 | 1 | 3 | 0.3 | 36 | 4 |
| Example 18 | C1 | IPA | 12 | 1.3 | 2 | 0.1 | 0.2 | 0.02 | 14.2 | 1 |
| Example 19 | C2 | IPA | 11 | 1.1 | 1 | 0.1 | 0.3 | 0.02 | 12.3 | 1.22 |
| Example 20 | D | Ethanol | 31 | 2.3 | 19 | 2.1 | 2 | 0.1 | 52 | 5 |
| Example 21 | E1 | MIBC | 9 | 0.7 | 3 | 0.5 | 1 | 0.08 | 13 | 1 |
| Example 22 | F1 | TMAH | 1 | 0.09 | 1 | 0.05 | 1 | 0.05 | 3 | 0.19 |
| Example 23 | F2 | TMAH | 4 | 0.3 | 2 | 0.1 | 1 | 0.03 | 7 | 0.43 |
| Example 24 | F3 | TMAH | 0.3 | 0.02 | 0.2 | 0.03 | 0.05 | 0.01 | 0.55 | 0.06 |
| Example 25 | F4 | TMAH | 0.8 | 0.01 | 0.3 | 0.02 | 0.1 | 0.01 | 1.2 | 0.04 |
| Example 26 | A17 | nBA | 13 | 1 | 2 | 0.1 | 0.9 | 0.1 | 15.9 | 1.2 |
| Example 27 | A18 | nBA | 9 | 0.9 | 1.9 | 0.2 | 0.3 | 0.02 | 11.2 | 1.12 |
| Example 28 | A19 | nBA | 53 | 4.3 | 0.9 | 0.07 | 0.5 | 0.1 | 54.4 | 4.47 |
| Example 29 | A20 | nBA | 33 | 2.7 | 0.7 | 0.05 | 0.3 | 0.02 | 34 | 2.77 |
| Example 30 | A21 | nBA | 29 | 2.9 | 58 | 6.3 | 0.4 | 0.04 | 87.4 | 9.24 |
| Example 31 | A22 | nBA | 28 | 6.3 | 21 | 5.1 | 3 | 0.4 | 52 | 11.8 |
| Example 32 | A23 | nBA | 63 | 0.9 | 51 | 0.4 | 14 | 0.1 | 128 | 1.4 |
| Example 33 | A24 | nBA | 58 | 0.6 | 42 | 0.5 | 9 | 0.9 | 109 | 2 |
| Example 34 | A25 | nBA | 1 | 0.1 | 1 | 0.03 | 0.4 | 0.02 | 2.4 | 0.15 |
| Example 35 | A26 | nBA | 1 | 0.1 | 2 | 0.03 | 0.3 | 0.02 | 3.3 | 0.15 |
| Example 36 | A1 | nBA | 1 | 0.1 | 1 | 0.03 | 0.3 | 0.02 | 2.3 | 0.15 |
| Example 37 | G | PGME | 2 | 0.1 | 1 | 0.03 | 0.3 | 0.02 | 3.3 | 0.15 |
| Example 38 | H | CyHx | 1 | 0.1 | 2 | 0.03 | 0.3 | 0.02 | 3.3 | 0.15 |
| Example 39 | I | GBL | 1 | 0.1 | 1 | 0.03 | 0.3 | 0.02 | 2.3 | 0.15 |
| Example 40 | E2 | MIBC | 1 | 0.1 | 1 | 0.03 | 0.4 | 0.02 | 2.4 | 0.15 |
| Example 41 | J | EL | 2 | 0.1 | 1 | 0.03 | 0.5 | 0.02 | 3.5 | 0.15 |
| Example 42 | K | DMSO | 1 | 0.1 | 3 | 0.03 | 0.3 | 0.02 | 4.3 | 0.15 |
| Example 43 | L | iAA | 1 | 0.1 | 1 | 0.03 | 0.3 | 0.02 | 2.3 | 0.15 |

TABLE 1-continued

| | | | | | | | | | | |
|---|---|---|---|---|---|---|---|---|---|---|
| Example 44 | M1 | PGMEA/PGME | 1 | 0.1 | 1 | 0.03 | 0.3 | 0.02 | 2.3 | 0.15 |
| Example 45 | N | HBM | 2 | 0.1 | 2 | 0.03 | 0.4 | 0.02 | 4.4 | 0.15 |
| Example 46 | O | MEK | 1 | 0.1 | 1 | 0.03 | 0.3 | 0.02 | 2.3 | 0.15 |
| Example 47 | P | PC | 2 | 0.1 | 1 | 0.03 | 0.3 | 0.02 | 3.3 | 0.15 |
| Example 48 | M2 | GBL | 1 | 0.1 | 1 | 0.03 | 0.3 | 0.02 | 2.3 | 0.15 |
| Comparative Example 1 | A101 | nBA | 2,000 | 120 | 100 | 5 | 100 | 5 | 2200 | 130 |
| Comparative Example 2 | A102 | nBA | 100 | 5 | 2,000 | 120 | 100 | 5 | 2200 | 130 |
| Comparative Example 3 | A103 | nBA | 100 | 5 | 100 | 5 | 2,000 | 120 | 2200 | 130 |
| Comparative Example 4 | A104 | nBA | 2,000 | 120 | 2,000 | 120 | 2,000 | 120 | 6000 | 360 |
| Comparative Example 5 | A105 | nBA | 1,000 | 80 | 1,000 | 80 | 1,000 | 80 | 3000 | 240 |
| Comparative Example 6 | A106 | nBA | 10,000 | 400 | 200 | 15 | 200 | 15 | 10400 | 430 |
| Comparative Example 7 | A107 | nBA | 200 | 15 | 10,000 | 400 | 200 | 15 | 10400 | 430 |
| Comparative Example 8 | A108 | nBA | 200 | 15 | 200 | 15 | 10,000 | 400 | 10400 | 430 |
| Comparative Example 9 | A109 | nBA | 2,000 | 120 | 50 | 3 | 50 | 3 | 2100 | 126 |
| Comparative Example 10 | A110 | nBA | 10,000 | 400 | 200 | 15 | 200 | 15 | 10400 | 430 |
| Comparative Example 11 | A111 | nBA | 10,000 | 400 | 10,000 | 400 | 10,000 | 400 | 30000 | 1,200 |
| Comparative Example 12 | A112 | nBA | 2,000 | 120 | 50 | 3 | 50 | 3 | 2100 | 126 |
| Comparative Example 13 | A113 | nBA | 10,000 | 400 | 200 | 15 | 200 | 15 | 10400 | 430 |
| Comparative Example 14 | A114 | nBA | 10,000 | 400 | 10,000 | 400 | 10,000 | 400 | 30000 | 1,200 |
| Comparative Example 15 | A115 | nBA | 2 | 0.00 | 2 | 0.00 | 2 | 0.00 | 6 | 0.00 |
| Comparative Example 16 | A116 | nBA | 10 | 0.00 | 2 | 0.00 | 2 | 0.00 | 14 | 0.00 |
| Comparative Example 17 | A117 | nBA | 723 | 84.5 | 109 | 18 | 3.5 | 0.9 | 835.5 | 103.4 |

It was found from the results that the number of defects is not proportional to the total metal amount of Fe, Cu, and Zn in the treatment liquid, that is, the total mass of the metal atoms. On the other hand, it was found that, in a case where the ratio of the total mass of particulate metal derived from Fe, Cu, and Zn measured by the SP-ICP-MS method to the total mass of the treatment liquid is in the range of the present invention, the number of defects is small.

Examples 101 to 115

<Preparation and Storage of Treatment Liquid for Manufacturing Semiconductor>

As a treatment liquid for manufacturing a semiconductor, isopropanol was purified using a well-known method. As a result, treatment liquids in which the content of each of Fe, Cu, and Zn as the target metals was lower than 10 mass ppt with respect to the total mass of each of the treatment liquids were obtained.

The obtained treatment liquids were filled into storage portions of storage containers shown in Table 2 and were stored at 25° C. for 30 days. As a result, various treatment liquids: C3 to C17 (isopropanol: IPA) shown in Table 2 were obtained.

At this time, a void portion of the storage portion was filled with filler gas shown in Table 2.

<Storage Container>

As the storage container, each of the storage containers shown in Table 2 was used after cleaning the inner wall of the storage portion using each of cleaning liquids shown in Table 2.

[Storage Container]

The storage containers shown in Table 2 are as follows.

PE: storage container in which an inner wall of a storage portion was formed of polyethylene (PE)

[Cleaning Liquid]

The cleaning liquids shown in Table 2 are as follows.

DIW: ultrapure water (the LPC value* of particles having a diameter of 40 nm or more was 10 particles/mL or less)

[Method of Cleaning Container]

The storage portion of the storage container storing the treatment liquid was cleaned using the following method.

A: the cleaning liquid was put into the storage portion until 20% of the volume of the storage portion was filled, was shaken for 1 minutes, and then was rinsed with ultrapure water B: A was repeated three times C: an opening of the storage portion of the storage container faced downward, the cleaning liquid was jetted from the opening using a shower nozzle at a flow rate of 2 L/min for 1 minute to clean the storage container. Next, the container was sufficiently rinsed with ultrapure water and then was dried.

[Cleanliness of Filler Gas]

The cleanliness of the filler gas shown in Table 2 is based on the following evaluation standards. Here, the cleanliness of the filler gas was measured using the following method.

A: the number of particles having a diameter of 0.5 μm or more is 1 particles/L or less B: the number of particles having a diameter of 0.5 μm or more is 2 particles/L to 10 particles/L C: the number of particles having a diameter of 0.5 µm or more is more than 10 particles/L
Device: liquid particle counter (KC-03A; manufactured by Rion Co., Ltd.)
Measurement method: a tip of a gas suction tube was fixed to a measurement target portion, target gas was aspirated at a flow rate of 3 L/min, the number of particles having a diameter of 0.5 µm or more was counted, and the number of particles per 1 L was calculated.

[Void Volume (Vol %)]

The inner volume of the storage portion was calculated based on an increased mass amount in a case where 100% of the storage portion was filled with ultrapure water. In a case where the void volume was higher than 1%, the mass of a solution to be filled was obtained based on the volume of the solution, which is a desired void volume, and the specific gravity of the solution, and the filling amount was adjusted based on the increased mass amount. In a case where the void volume was lower than 1%, the filling amount was adjusted by filling 100% of the storage portion with the solution and then aspirating the solution using a clean spoid in an amount corresponding to the volume of the gas which is a desired void volume.

<Evaluation>

Regarding each of the treatment liquids C3 to C17 (isopropanol) shown in Table 2, the total metal amount and the particulate metal content were measured using a method shown in Table 1. In Table 2, "mass ppt" is a value with respect to the total mass of the treatment liquid.

In addition, regarding each of the treatment liquids C3 to C17, the defect performance was evaluated using a method shown in Table 1. The results are shown in Table 2.

TABLE 2

| | Treatment Liquid | Storage Container | Cleaning Liquid | Cleaning Method | Filler Gas | Cleanliness | Void Volume vol % | Total Amount of Particulate Metal mass ppt | Defect Suppressing Performance |
|---|---|---|---|---|---|---|---|---|---|
| Example 101 | C3 | IPA | PE | DIW | A | Air | A | 20 | 10.2 | B |
| Example 102 | C4 | IPA | PE | DIW | B | Air | A | 20 | 1.4 | A |
| Example 103 | C5 | IPA | PE | DIW | C | Air | A | 20 | 1.42 | A |
| Example 104 | C6 | IPA | PE | None | None | Air | A | 20 | 57 | C |
| Example 105 | C7 | IPA | PE | DIW | C | Air | A | 20 | 0.81 | A |
| Example 106 | C8 | IPA | PE | DIW | C | Argon | A | 20 | 0.71 | A |
| Example 107 | C9 | IPA | PE | DIW | C | Air | B | 20 | 16.3 | B |
| Example 108 | C10 | IPA | PE | DIW | C | Air | C | 20 | 98.2 | C |
| Example 109 | C11 | IPA | PE | DIW | C | Air | B | 0.00 | 10.2 | B |
| Example 110 | C12 | IPA | PE | DIW | C | Air | B | 0.01 | 5.29 | A |
| Example 111 | C13 | IPA | PE | DIW | C | Air | B | 1 | 0.38 | A |
| Example 112 | C14 | IPA | PE | DIW | C | Air | B | 10 | 0.71 | A |
| Example 113 | C15 | IPA | PE | DIW | C | Air | B | 45 | 11 | B |
| Example 114 | C16 | IPA | PE | DIW | C | Air | B | 60 | 64.2 | C |
| Example 115 | C17 | IPA | PE | DIW | C | Air | B | 90 | 88 | C |

| | Treatment Liquid | | Fe | | Cu | | Zn | | Total |
|---|---|---|---|---|---|---|---|---|---|
| | | | Total Metal Amount mass ppt | Amount of Particulate Metal mass ppt | Total Metal Amount mass ppt | Amount of Particulate Metal mass ppt | Total Metal Amount mass ppt | Amount of Particulate Metal mass ppt | Sum of Total Metal Amounts mass ppt | Amount of Particulate Metal mass ppt |
| Example 101 | C3 | IPA | 43 | 5.8 | 21 | 3.9 | 3 | 0.5 | 67 | 10.2 |
| Example 102 | C4 | IPA | 11 | 1.1 | 3 | 0.2 | 1 | 0.1 | 15 | 1.4 |
| Example 103 | C5 | IPA | 12 | 1.3 | 2 | 0.1 | 0.2 | 0.02 | 14.2 | 1.42 |
| Example 104 | C6 | IPA | 238 | 38 | 89 | 14 | 38 | 5 | 365 | 57 |
| Example 105 | C7 | IPA | 7 | 0.7 | 1 | 0.1 | 0.2 | 0.01 | 8.2 | 0.81 |
| Example 106 | C8 | IPA | 9 | 0.5 | 2 | 0.2 | 0.2 | 0.01 | 11.2 | 0.71 |
| Example 107 | C9 | IPA | 85 | 9.8 | 43 | 5.3 | 9 | 1.2 | 137 | 16.3 |
| Example 108 | C10 | IPA | 316 | 56 | 187 | 38 | 38 | 4.2 | 541 | 98.2 |
| Example 109 | C11 | IPA | 38 | 5.3 | 29 | 4.2 | 9 | 0.7 | 76 | 10.2 |
| Example 110 | C12 | IPA | 21 | 3.1 | 13 | 2.1 | 3.0 | 0.09 | 37 | 5.29 |
| Example 111 | C13 | IPA | 5 | 0 | 1 | 0 | 0.2 | 0.01 | 6 | 0.38 |
| Example 112 | C14 | IPA | 7 | 0.6 | 2 | 0.1 | 0.2 | 0.01 | 9.2 | 0.71 |
| Example 113 | C15 | IPA | 43 | 5.6 | 38 | 4.3 | 5 | 1.1 | 86 | 11 |
| Example 114 | C16 | IPA | 216 | 41 | 89 | 17.6 | 38 | 5.6 | 343 | 64.2 |
| Example 115 | C17 | IPA | 358 | 63 | 101 | 21 | 29 | 4 | 488 | 88 |

What is claimed is:

1. A storage container comprising:
a treatment liquid for manufacturing a semiconductor; and
a storage portion that stores the treatment liquid,
wherein the treatment liquid includes one kind or two or more kinds of metal atoms selected from Cu, Fe, and Zn, and
a total content of particulate metal that is a metal component derived from the metal atoms and that is a nonionic metal component present in the treatment liquid as a solid without being dissolved is 0.01 to 100 mass ppt with respect to a total mass of the treatment liquid for manufacturing the semiconductor,
wherein a mass of the particulate metal is measured by a SP-ICP-MS method.

2. The storage container according to claim 1,
wherein an inner wall of the storage portion that comes into contact with the treatment liquid is cleaned using a cleaning liquid having a contact angle of 10 degrees to 120 degrees on the inner wall before being filled with the treatment liquid.

3. The storage container according to claim 2,
wherein the cleaning liquid is ultrapure water or a liquid including at least one of components included in the treatment liquid.

4. The storage container according to claim 1,
wherein at least a portion of an inner wall of the storage portion that comes into contact with the treatment liquid is formed of a material including at least one selected from the group consisting of polyethylene, polypropylene, polytetrafluoroethylene, and perfluoroalkoxy alkane.

5. The storage container according to claim 1,
wherein at least a portion of an inner wall of the storage portion that comes into contact with the treatment liquid is formed of a material including at least one selected from the group consisting of stainless steel and nickel-chromium alloy.

6. The storage container according to claim 1,
wherein at least a portion of an inner wall of the storage portion that comes into contact with the treatment liquid is formed of a material including at least one selected from the group consisting of stainless steel and nickel-chromium alloy, and
a mass ratio represented by Cr/Fe in a portion having a depth of 1 nm from an outermost surface of the inner wall is 1 to 3.

7. The storage container according to claim 1,
wherein an occupancy ratio of a void portion in the storage portion storing the treatment liquid is 50 to 0.01 vol %.

8. The storage container according to claim 1,
wherein a void portion of the storage portion storing the treatment liquid is filled with gas in which the number of particles having a diameter of 0.5 μm or more is 10 particles/L or less.

9. The storage container according to claim 1,
wherein a void portion of the storage portion storing the treatment liquid is filled with inert gas, wherein the inert gas comprising nitrogen or argon.

10. The storage container according to claim 1,
wherein the treatment liquid is a developer or a rinsing liquid.

11. The storage container according to claim 1,
wherein the treatment liquid includes a quaternary ammonium salt.

12. The storage container according to claim 1,
wherein the treatment liquid includes at least one selected from the group consisting of butyl acetate, N-methyl-2-pyrrolidone, isopropanol, ethanol, and methyl isobutyl carbinol.

13. The storage container according to claim 1,
wherein the pH of the treatment liquid is 10.0 to 15.0.

14. The storage container according to claim 1,
wherein the treatment liquid includes a surfactant.

15. The storage container according to claim 1,
wherein the treatment liquid includes at least one selected from the group consisting of butyl acetate, N-methyl-2-pyrrolidone, isopropanol, ethanol, methyl isobutyl carbinol, propylene glycol monomethyl ether, cyclohexanone, γ-butyrolactone, ethyl lactate, dimethyl sulfoxide, isoamyl acetate, a mixed solution of propylene glycol monomethyl ether acetate and propylene glycol monomethyl ether, methyl 2-hydroxyisobutyrate, methyl ethyl ketone, and propylene carbonate.

16. The storage container according to claim 1,
wherein the treatment liquid includes at least one selected from the group consisting of butyl acetate, methyl isobutyl carbinol and isoamyl acetate.

17. The storage container according to claim 1,
wherein the treatment liquid includes at least one selected from the group consisting of propylene glycol monomethyl ether, cyclohexanone, ethyl lactate, a mixed solution of propylene glycol monomethyl ether acetate and propylene glycol monomethyl ether, and methyl 2-hydroxyisobutyrate.

18. The storage container according to claim 1,
wherein the treatment liquid includes at least isopropanol.

19. A storage container comprising:
a treatment liquid for manufacturing a semiconductor; and
a storage portion that stores the treatment liquid,
wherein the treatment liquid includes one kind or two or more kinds of metal atoms selected from Cu, Fe, and Zn, and
a total content of particulate metal that is a metal component derived from the metal atoms and that is a nonionic metal component present in the treatment liquid as a solid without being dissolved is 0.01 to 100 mass ppt with respect to a total mass of the treatment liquid for manufacturing the semiconductor,
wherein an inner wall of the storage portion that comes into contact with the treatment liquid is cleaned using a cleaning liquid having a contact angle of 10 degrees to 120 degrees on the inner wall before being filled with the treatment liquid.

* * * * *